(12) United States Patent
Baik et al.

(10) Patent No.: US 12,145,950 B2
(45) Date of Patent: Nov. 19, 2024

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Chul Baik, Suwon-si (KR); Kum Hee Lee, Suwon-si (KR); Yongsuk Cho, Hwaseong-si (KR); Jongwon Choi, Yongin-si (KR); Yoonhyun Kwak, Seoul (KR); Ohyun Kwon, Seoul (KR); Sangdong Kim, Seongnam-si (KR); Hwayoung Cho, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 568 days.

(21) Appl. No.: 16/141,292

(22) Filed: Sep. 25, 2018

(65) Prior Publication Data

US 2019/0100546 A1    Apr. 4, 2019

(30) Foreign Application Priority Data

Sep. 29, 2017    (KR) .......................... 10-2017-0127762

(51) Int. Cl.
| | | |
|---|---|---|
| C07F 15/00 | (2006.01) | |
| C07F 1/12 | (2006.01) | |
| H10K 50/11 | (2023.01) | |
| H10K 50/15 | (2023.01) | |
| H10K 50/16 | (2023.01) | |
| H10K 50/17 | (2023.01) | |
| H10K 50/18 | (2023.01) | |
| H10K 85/30 | (2023.01) | |
| H10K 101/10 | (2023.01) | |

(52) U.S. Cl.
CPC ............ *C07F 15/0086* (2013.01); *C07F 1/12* (2013.01); *C07F 15/006* (2013.01); *H10K 50/11* (2023.02); *H10K 85/346* (2023.02); *H10K 85/371* (2023.02); *H10K 50/15* (2023.02); *H10K 50/16* (2023.02); *H10K 50/171* (2023.02); *H10K 50/18* (2023.02); *H10K 2101/10* (2023.02)

(58) Field of Classification Search
None
See application file for complete search history.

(56) References Cited

U.S. PATENT DOCUMENTS

| | | | |
|---|---|---|---|
| 2,465,912 A | 3/1949 | Morris | |
| 7,781,074 B2 | 8/2010 | Sano et al. | |
| 7,947,383 B2 | 5/2011 | Ise et al. | |
| 8,431,243 B2 | 4/2013 | Kwong et al. | |
| 8,709,615 B2 | 4/2014 | Kottas et al. | |
| 8,722,205 B2 | 5/2014 | Xia et al. | |
| 9,882,143 B2 | 1/2018 | Kim et al. | |
| 9,935,275 B2 | 4/2018 | Hayashi | |
| 10,811,621 B2 * | 10/2020 | Baik | H01L 51/0087 |
| 11,787,829 B2 * | 10/2023 | Kim | C07F 15/0086 |
| 2004/0086743 A1 * | 5/2004 | Brown | 428/690 |
| 2006/0068222 A1 | 3/2006 | Kitamura et al. | |
| 2007/0103060 A1 * | 5/2007 | Itoh | 313/504 |
| 2009/0218935 A1 * | 9/2009 | Sotoyama | 313/504 |
| 2010/0187977 A1 * | 7/2010 | Kai | 313/504 |

(Continued)

FOREIGN PATENT DOCUMENTS

| | | |
|---|---|---|
| EP | 2465912 A1 | 6/2012 |
| EP | 3205659 A1 | 8/2017 |

(Continued)

OTHER PUBLICATIONS

Yafei Luo et al. "Exploring the Photodeactivation Pathways of Pt[O∧N∧C∧N] Complexes: A Theoretical Perspective" ChemPhysChem 2016, vol. 17, p. 69-77 (Year: 2016).*

(Continued)

*Primary Examiner* — Dylan C Kershner
*Assistant Examiner* — Seokmin Jeon
(74) *Attorney, Agent, or Firm* — CANTOR COLBURN LLP

(57) ABSTRACT

Aspects of the present disclosure provide an organometallic compound, an organic light-emitting device including the organometallic compound, and a diagnostic composition including the organometallic compound. The organometallic compound, which may act as a dopant in the emission layer is represented by Formula 1:

Formula 1

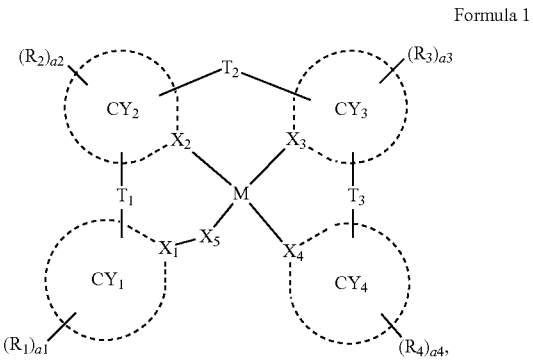

wherein, in Formula 1, groups and variables are the same as described in the specification.

11 Claims, 2 Drawing Sheets

(56) References Cited

U.S. PATENT DOCUMENTS

| | | | |
|---|---|---|---|
| 2010/0219407 A1* | 9/2010 | Kamatani | 257/40 |
| 2015/0194615 A1* | 7/2015 | Lin | H01L 51/0087 |
| 2016/0028014 A1 | 1/2016 | Kim et al. | |
| 2016/0240800 A1 | 8/2016 | Ma et al. | |
| 2017/0054091 A1 | 2/2017 | Cho et al. | |
| 2017/0054095 A1 | 2/2017 | Choi et al. | |
| 2017/0133599 A1 | 5/2017 | Cho et al. | |
| 2017/0237023 A1* | 8/2017 | Kim | H01L 51/0087 |
| 2018/0013078 A1 | 1/2018 | Lee et al. | |
| 2018/0212165 A1* | 7/2018 | Ji | H01L 51/0087 |
| 2018/0233679 A1* | 8/2018 | Baik | H01L 51/0087 |
| 2018/0244706 A1 | 8/2018 | Lee et al. | |
| 2020/0308207 A1* | 10/2020 | Kim | C07F 15/0086 |
| 2021/0210701 A1 | 7/2021 | Lin et al. | |
| 2021/0226135 A1 | 7/2021 | Kim et al. | |

FOREIGN PATENT DOCUMENTS

| | | |
|---|---|---|
| JP | 2006-121032 A | 2/2006 |
| JP | 5497284 B2 | 3/2014 |
| KR | 10-1511169 B1 | 4/2015 |
| KR | 1020150082101 A | 7/2015 |
| KR | 10-2016-0012066 A | 2/2016 |
| KR | 10-2017-0014018 A | 2/2017 |
| KR | 10-2017-0023270 A | 3/2017 |
| KR | 10-2017-0055063 A | 5/2017 |
| KR | 1020170094652 A | 8/2017 |

OTHER PUBLICATIONS

Gang Cheng et al. "Structurally robust phosphorescent [Pt(O∧N∧C∧N)] emitters for high performance organic light-emitting devices with power efficiency up to 126 ImW-1 and external quantum efficiency over 20%" Chem. Sci. 2014, vol. 5, p. 4819-4830 (Year: 2014).*

Peipei Sun et al. "Synthesis of novel Ir complexes and their application in organic light emitting diodes", Syn. Metal 2006, vol. 156, p. 525-528 (Year: 2006).*

Extended European search report issued by the European Patent Office on Feb. 12, 2019 in the examination of the European Patent Application No. 18196103.8-1109.

Bin Wang et al. "Strongly phosphorescent platinum(II) complexes supported by tetradentate benzazole-containing ligands", J. Mater. Chem. C, 2015, 3, 8212.

Hirohiko Fukagawa et al. "Highly Efficient and Stable Red Phosphorescent Organic Light-Emitting Diodes Using Platinum Complexes", Adv. Mater. 2012, 24, 5099-5103.

Hung-Cheng Chen et al. "Platinum(II)-porphyrin as a sensitizer for visible light driven water oxidation in neutral phosphate buffer", Energy Environ. Sci., 2015, 8, 975.

Kai Li et al. "Highly phosphorescent platinum(II) emitters: photophysics, materials and biological applications", Chem. Sci., 2016, 7, 1653.

M. Yamamura et al. "Stable neutral radicals of planar N2O2-typedipyrrin platinum complexes: hybrid radicals of the delocalized organic π-orbital and platinum d-orbital", Dalton Trans., 2016, 45, 6834.

Nobuto Yoshinari et al. "Methanol-Triggered Turn-On-Type Photoluminescence in L-Cysteinato Palladium(II) and Platinum(II) Complexes Supported bya Bis(diphenylphosphine) Ligand", Inorg. Chem. 2016, 55, 2030-2036.

Tyler Fleetham et al. "Phosphorescent Pt(II) and Pd(II) Complexes for Efficient, High-Color-Quality, and Stable OLEDs", Adv. Mater. 2017, 29, 1601861.

English Translation of Office Action dated Aug. 2, 2022 issued in corresponding KR Patent Application No. 10-2017-0127762, 11 pp.

Office Action dated Aug. 2, 2022 issued in corresponding KR Patent Application No. 10-2017-0127762, 12 pp.

* cited by examiner

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0127762, filed on Sep. 29, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

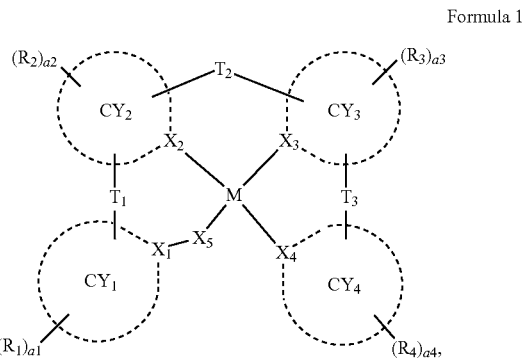

Formula 1

In Formula 1,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ to $X_4$ may each independently be C or N, $X_5$ may be O, S, B(R'), N(R'), P(R'), C(R')(R"), Si(R') (R"), Ge(R')(R"), C(=O), B(R')(R"), N(R')(R"), or P(R') (R"), two bonds selected from a bond between $X_2$ and M, a bond between $X_3$ and M, and a bond between $X_4$ and M may each be a coordinate bond, and the other thereof may be a covalent bond, a bond between $X_5$ and M may be a covalent bond, rings $CY_1$ to $CY_4$ may each independently be selected from a $C_5$-$C_{30}$ carbocyclic group and a $C_1$-$C_{30}$ heterocyclic group, $T_1$ may be selected from a single bond, a double bond, *—N[(L$_{61}$)$_{a61}$-(R$_{61}$)]—*', *—B(R$_{61}$)—*', *—P(R$_{61}$)—*', *—C(R$_{61}$)(R$_{62}$)—*', *—Si(R$_{61}$)(R$_{62}$)—*', *—Ge(R$_{61}$) (R$_{62}$)—*', *—S—*', *—Se—*', *—O—*', *—C(=O)—*', *—S(=O)—*', *—S(=O)$_2$—*', *—C(R$_{61}$)=*', *=C (R$_{61}$)—*', *—C(R$_{61}$)=C(R$_{62}$)—*', C(=S)—*', and *—C≡C—*', $T_2$ may be selected from a double bond, *—N[(L$_{63}$)$_{a63}$-(R$_{63}$)]—*', *—B(R$_{63}$)—*', *—P(R$_{63}$)—*', *—Si(R$_{63}$) (R$_{64}$)—*', *—Ge(R$_{63}$)(R$_{64}$)—*', *—S—*', *—Se—*', *—O—*', *—C(=O)—*', *—S(=O)—*', *—S(=O)$_2$—*', *—C(R$_{63}$)=*', *=C(R$_{63}$)—*', *—C(R$_{63}$)=C(R$_{64}$)—*', *—C(=S)—, and *—C≡C—*', $T_3$ may be selected from a single bond, a double bond, *—N[(L$_{65}$)$_{a65}$-(R$_{65}$)]—*', *—B (R$_{65}$)—*', *—P(R$_{65}$)—*', *—C(R$_{65}$)(R$_{66}$)—*', *—Si(R$_{65}$) (R$_{66}$)—*', *—Ge(R$_{65}$)(R$_{66}$)—*', *—S—*', *—Se—*', *—O—*', *(=O)**—S(=O)—*', *—S(=O)$_2$—*', *—C (R$_{65}$)=*', *=C(R$_{65}$)—*', *—C(R$_{65}$)=C(R$_{66}$)—*', C(=S)—*', and *—C≡C—*', $L_{61}$, $L_{63}$, and $L_{65}$ may each independently be selected from a single bond, a substituted or unsubstituted $C_5$-$C_{30}$ carbocyclic group, and a substituted or unsubstituted $C_1$-$C_{30}$ heterocyclic group, a61, a63, and a65 may each independently be selected from 1 to 3, wherein, when a61 is two or more, two or more groups $L_{61}$ may be identical to or different from each other, when a63 is two or more, two or more groups $L_{63}$ may be identical to or different from each other, and when a65 is two or more, two or more groups $L_{65}$ may be identical to or different from each other, $R_{61}$ and $R_{62}$, $R_{63}$ and $R_{64}$, and $R_{65}$ and $R_{66}$ may each optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group, $R_1$ to $R_4$, $R_{61}$ to $R_{66}$, R', and R" may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), a1 to a4 may each independently be an integer from 0 to 20, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, at least two neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group,

* and *' each indicate a binding site to a neighboring atom, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may be selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $-N(Q_{21})(Q_{22})$, $-Si(Q_{23})(Q_{24})(Q_{25})$, $-B(Q_{26})(Q_{27})$, and $-P(=O)(Q_{28})(Q_{29})$; and
$-N(Q_{31})(Q_{32})$, $-Si(Q_{33})(Q_{34})(Q_{35})$, $-B(Q_{36})(Q_{37})$, and $-P(=O)(Q_{38})(Q_{39})$, and
$Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, $-F$, $-Cl$, $-Br$, $-I$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkyl heteroaryl group, a monovalent non-aromatic condensed polycyclic group, and a monovalent non-aromatic condensed heteropolycyclic group.

Another aspect of the present disclosure provides an organic light-emitting device including:

a first electrode;

a second electrode; and an organic layer disposed between the first electrode and the second electrode, wherein the organic layer includes an emission layer, and wherein the organic layer includes at least one organometallic compound.

The organometallic compound may act as a dopant in the emission layer.

Another aspect of the present disclosure provides a diagnostic composition including at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
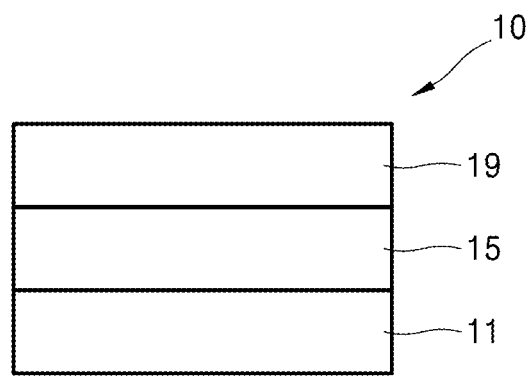
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section.

Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment is represented by Formula 1 below:

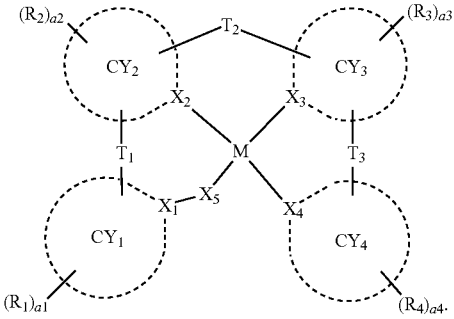

Formula 1

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M may be Pt, Pd, or Au, but embodiments of the present disclosure are not limited thereto.

$X_1$ to $X_4$ in Formula 1 may each independently be C or N. For example, in Formula 1, i) $X_2$ and $X_3$ may each be N, and $X_4$ may be C; or ii) $X_2$ and $X_4$ may each be N, and $X_3$ may be C, but embodiments of the present disclosure are not limited thereto.

$X_5$ in Formula 1 may be O, S, B(R'), N(R'), P(R'), C(R')(R''), Si(R')(R''), Ge(R')(R''), C(=O), B(R')(R''), N(R')(R''), or P(R')(R''). R' and R'' are the same as described herein.

For example, $X_5$ may be O or S, but embodiments of the present disclosure are not limited thereto.

In Formula 1, two bonds selected from a bond between $X_2$ and M, a bond between $X_3$ and M, and a bond between $X_4$ and M may each be a coordinate bond, the other thereof may be a covalent bond, and a bond between $X_5$ and M may be a covalent bond. Therefore, the organometallic compound represented by Formula 1 may be electrically neutral.

For example, in Formula 1, i) the bond between $X_2$ and M and the bond between $X_3$ and M may each be a coordinate bond, and the bond between $X_4$ and M may be a covalent bond; or ii) the bond between $X_2$ and M and the bond between $X_4$ and M may each be a coordinate bond, and the bond between $X_3$ and M may be a covalent bond, but embodiments of the present disclosure are not limited thereto.

In Formula 1, ring $CY_1$ to ring $CY_4$ may each independently be selected from a $C_5$-$C_{30}$ carbocyclic group and a $C_1$-$C_{30}$ heterocyclic group.

For example, ring $CY_1$ to ring $CY_4$ may each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azaindole group, an azabenzoborol group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In an embodiment, ring $CY_1$ to ring $CY_4$ may each independently be selected from i) a 5-membered ring, ii) a 6-membered ring, iii) a condensed ring condensed with two or more 6-membered rings, and iv) a condensed ring condensed with at least one 5-membered ring and at least one 6-membered ring.

The 5-membered ring may be selected from a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group.

The 6-membered ring may be selected from an adamantane group, a norbornane group, a norbornene group, a cyclohexane group, a cyclohexene group, a benzene group, a pyridine group, a pyrimidine group, a pyrazine group, a pyridazine group, and a triazine group, but embodiments of the present disclosure are not limited thereto.

In Formula 1, $T_1$ may be selected from a single bond, a double bond, *—N[(L$_{61}$)$_{a61}$-(R$_{61}$)]—*', *—B(R$_{61}$)—*', *—P(R$_{61}$)—*', *—C(R$_{61}$)(R$_{62}$)—*', *—Si(R$_{61}$)(R$_{62}$)—*', *—Ge(R$_{61}$)(R$_{62}$)—*', *—S—*', *—Se—*', *—O—*', *—C(=O)—*', *—S(=O)—*', *—S(=O)$_2$—*', *—C(R$_{61}$)=*', *=C(R$_{61}$)—*', *—C(R$_{61}$)=C(R$_{62}$)—*', *—C(=S)—*', and *—C≡C—*', $T_2$ may be selected from a double bond, *—N[(L$_{63}$)$_{a63}$-(R$_{63}$)]—*', *—B(R$_{63}$)—*', *—P(R$_{63}$)—*', *—Si(R$_{63}$)(R$_{64}$)—*', *—Ge(R$_{63}$)(R$_{64}$)—*', *—S—*', *—Se—*', *—O—, *—C(=O)—*', *—S(=O)—*', *—S(=O)$_2$—*', *—C(R$_{63}$)=*', *=C(R$_{63}$)—*', *—C(R$_{63}$)=C(R$_{64}$)—*', *—C(=S)—*', and *—C≡C—*', $T_3$ may be selected from a single bond, a double bond, *—N[(L$_{65}$)$_{a65}$-(R$_{65}$)]—*', *—B(R$_{65}$)—*', *—P(R$_{65}$)—*',

*—C($R_{65}$)($R_{66}$)—*', *—Si($R_{65}$)($R_{66}$)—*', *—Ge($R_{65}$)($R_{66}$)—*', *—S—*', *—Se—*', *—O—*', *—C(=O)—*', *—S(=O)—*', *—S(=O)$_2$—*', *—C($R_{65}$)=—*', *=C($R_{65}$)—*', *—C($R_{65}$)=C($R_{66}$)—*', *—C(=S)—*', and *—C≡C—*'.

$L_{61}$, $L_{63}$, and $L_{65}$ may each independently be selected from a single bond, a substituted or unsubstituted $C_5$-$C_{30}$ carbocyclic group, and a substituted or unsubstituted $C_1$-$C_{30}$ heterocyclic group.

For example, $L_{61}$, $L_{63}$, and $L_{65}$ may each independently be selected from:

a single bond, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_{31}$ to $Q_{39}$ may each independently be selected from:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CH$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

a61, a63, and a65 each indicate the number of $L_{61}$, $L_{63}$, and $L_{65}$, and may each independently be an integer from 1 to 3. When a61 is two or more, two or more of groups $L_{61}$ may be identical to or different from each other, when a63 is two or more, two or more of groups $L_{63}$ may be identical to or different from each other, and when a65 is two or more, two or more of groups $L_{65}$ may be identical to or different from each other.

$R_{61}$ and $R_{62}$, $R_{63}$ and $R_{64}$, and $R_{65}$ and $R_{66}$ may each optionally be linked via a single bond, a double bond, or a first linking group, to thereby form a substituted or unsubstituted $C_5$-$C_{30}$ carbocyclic group or a substituted or unsubstituted $C_1$-$C_{30}$ heterocyclic group. The first linking group may be selected from *—N($R_9$)—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—O—*', *—C(=O)—*', *—S(=O)—*', *—S(=O)$_2$—*', *—C($R_9$)=, *=C($R_9$)—*', *—C($R_9$)=C($R_{10}$)—*', *—C(=S)—*', and *—C≡C—*', wherein $R_9$ and $R_{10}$ are the same as described in connection with $R_1$, and * and *' each indicate a binding site to a neighboring atom.

In an embodiment, in Formula 1, $T_1$ and $T_3$ may each independently a single bond, and $T_2$ may be *—N[($L_{63}$)$_{a63}$-($R_{63}$)]—*', *—B($R_{63}$)—*', *—P($R_{63}$)—*', *—Si($R_{63}$)($R_{64}$)—*', *—Ge($R_{63}$)($R_{64}$)—*', *—S—*', or *—O—*', but embodiments of the present disclosure are not limited thereto.

In Formula 1, $R_1$ to $R_4$, $R_{61}$ to $R_{66}$, R', and R" may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N(Q₁)(Q₂), —Si(Q₃)(Q₄)(Q₅), —B(Q₆)(Q₇), and —P(=O)(Q₈)(Q₉), wherein Q₁ to Q₉ are the same as described above.

For example, $R_1$ to $R_4$, $R_{61}$ to $R_{66}$, R', and R" may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF₅, a C₁-C₂₀ alkyl group, and a C₁-C₂₀ alkoxy group;

a C₁-C₂₀ alkyl group and a C₁-C₂₀ alkoxy group, each substituted with at least one selected from deuterium, —F, —Cl, —Br, —I, —CD₃, —CD₂H, —CDH₂, —CF₃, —CF₂H, —CFH₂, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C₁-C₁₀ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C₁-C₂₀ alkyl, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C₁-C₂₀ alkyl, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD₃, —CD₂H, —CDH₂, —CF₃, —CF₂H, —CFH₂, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C₁-C₂₀ alkyl group, a C₁-C₂₀ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C₁-C₂₀ alkyl, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N(Q₁)(Q₂), —Si(Q₃)(Q₄)(Q₅), —B(Q₆)(Q₇), and —P(=O)(Q₈)(Q₉), and Q₁ to Q₉ are the same as described above.

In an embodiment, $R_1$ to $R_4$, $R_{61}$ to $R_{66}$, R', and R" may each independently be selected from hydrogen, deuterium, —F, a cyano group, a nitro group, —SF₅, —CH₃, —CD₃, —CD₂H, —CDH₂, —CF₃, —CF₂H, —CFH₂, groups represented by Formulae 9-1 to 9-19, and groups represented by Formulae 10-1 to 10-194, but embodiments of the present disclosure are not limited thereto:

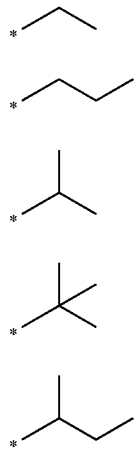

9-1

9-2

9-3

9-4

9-5

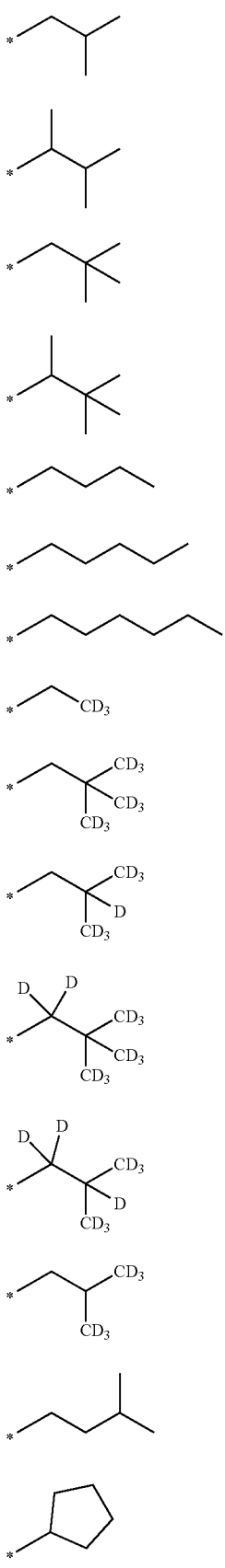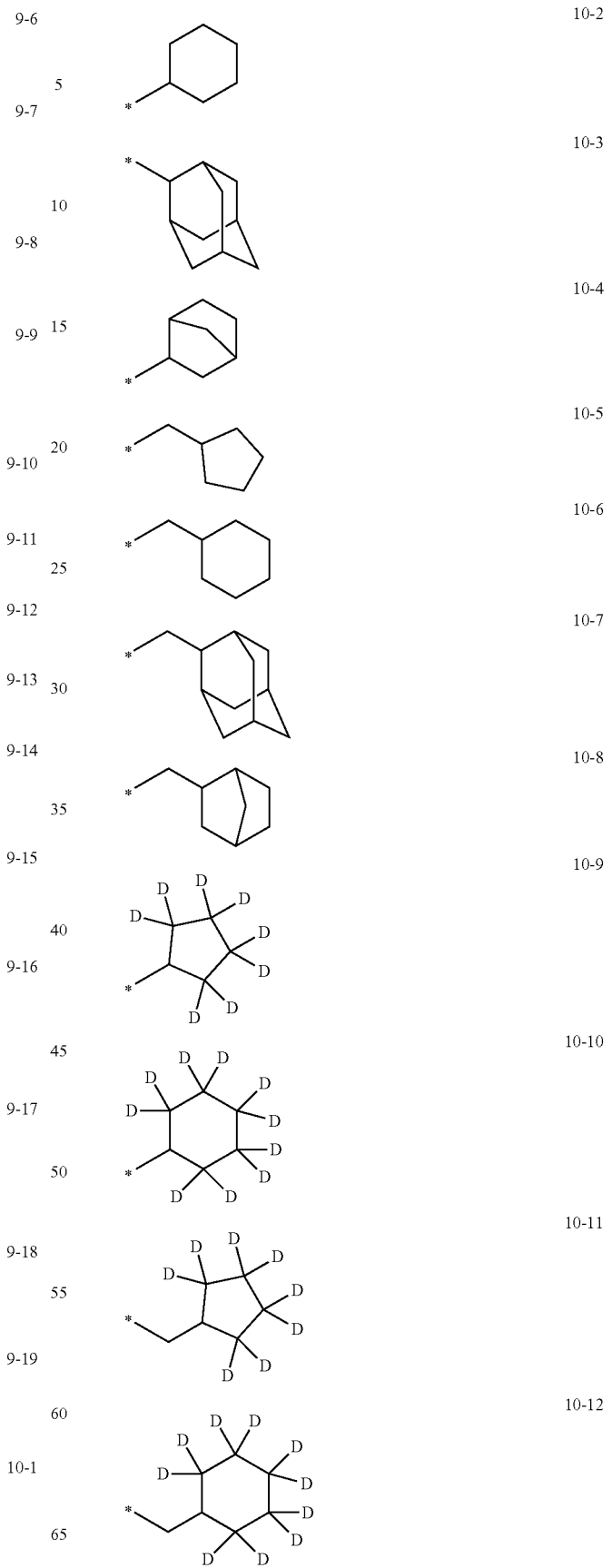

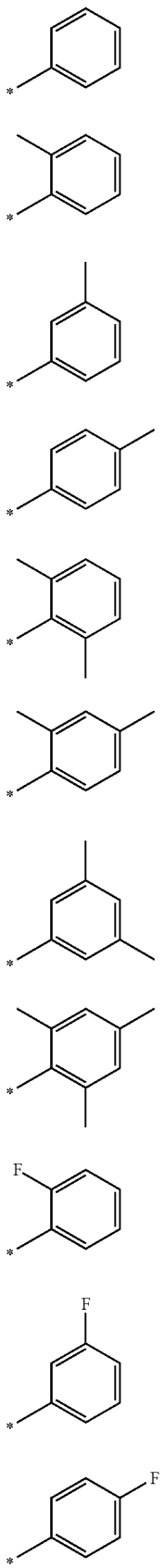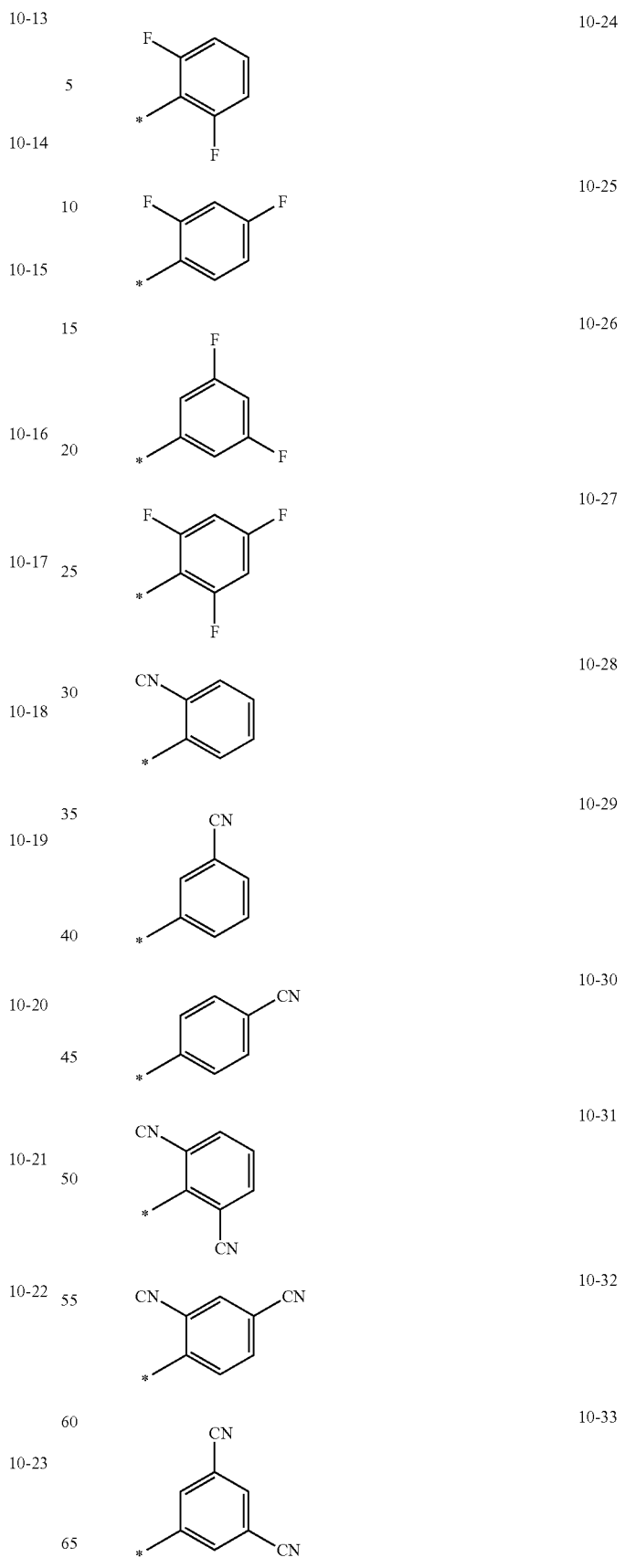

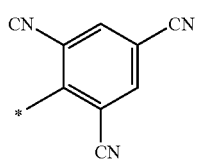
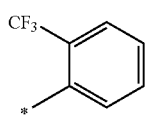
10-35
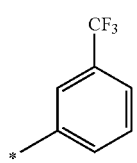
10-36
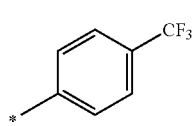
10-37
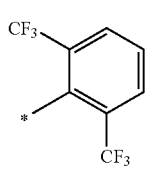
10-38
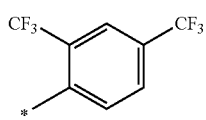
10-39
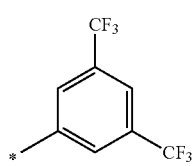
10-40
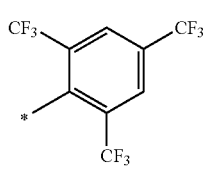
10-41
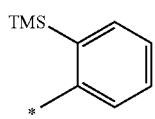
10-42
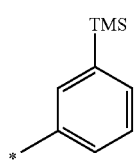
10-43
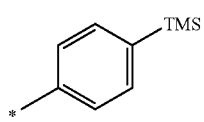
10-44
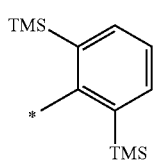
10-45
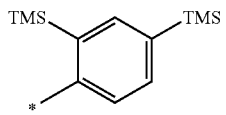
10-46
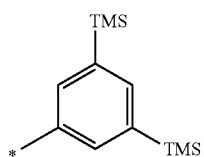
10-47
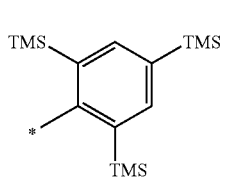
10-48
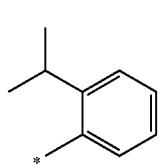
10-49
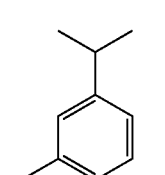
10-50
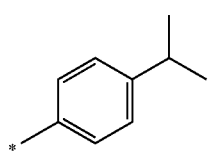
10-51
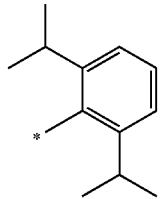
10-52

10-53 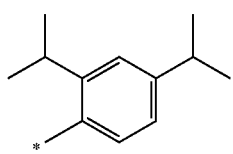
10-54 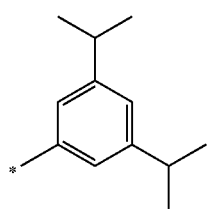
10-55 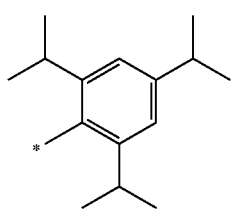
10-56 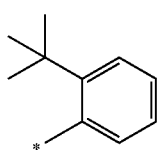
10-57 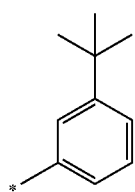
10-58 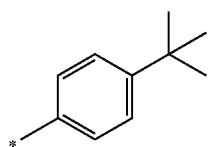
10-59 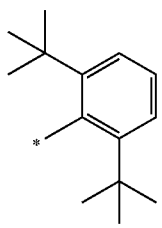
10-60 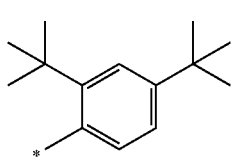
10-61 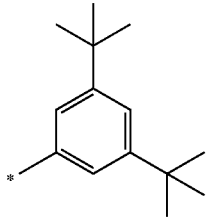
10-62 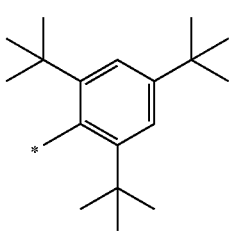
10-63 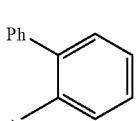
10-64 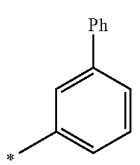
10-65 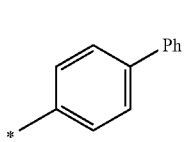
10-66 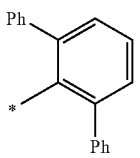
10-67 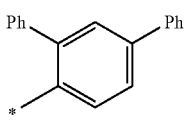
10-68 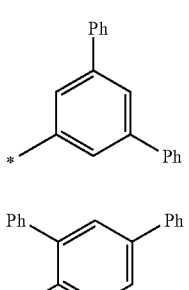
10-69 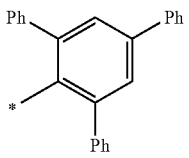

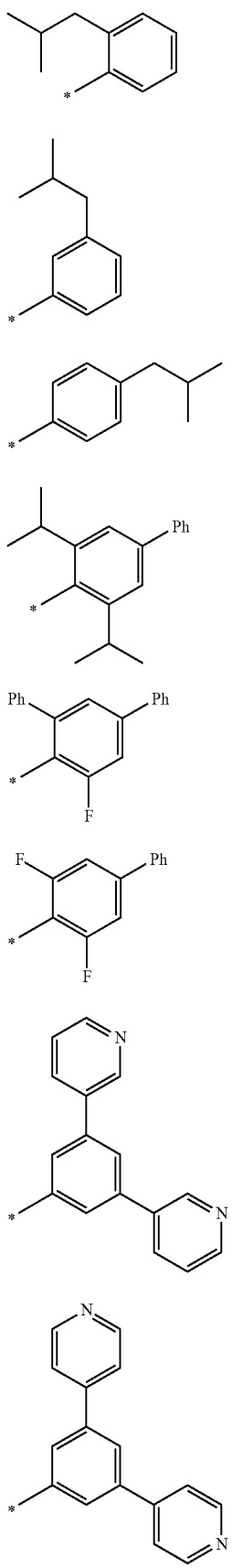
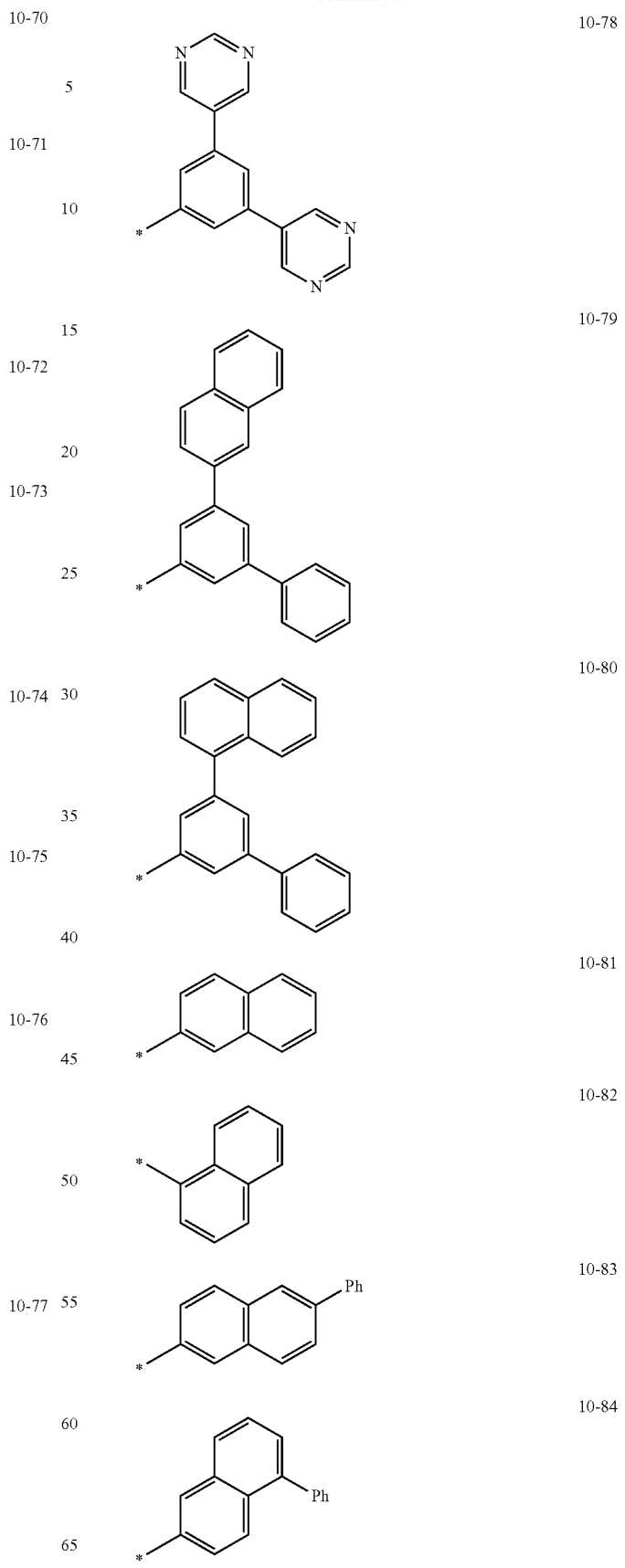

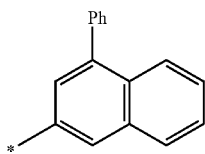
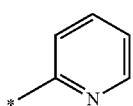
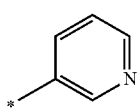
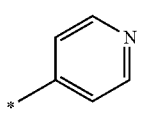
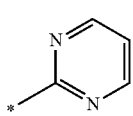
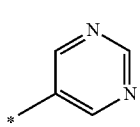
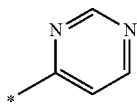
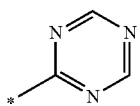
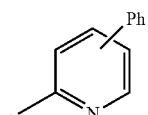
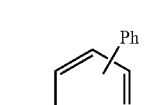
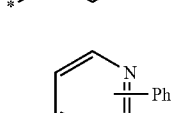
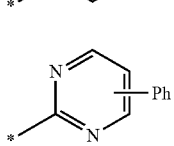
10-85
10-86
10-87
10-88
10-89
10-90
10-91
10-92
10-93
10-94
10-95
10-96
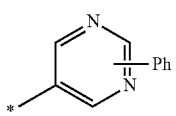
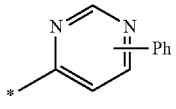
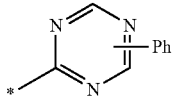
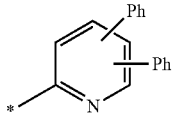
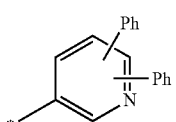
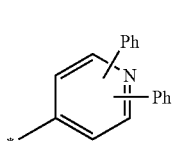
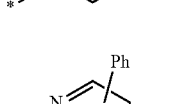
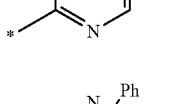
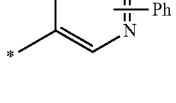
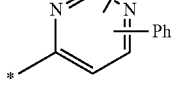
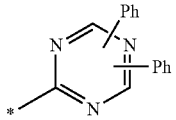
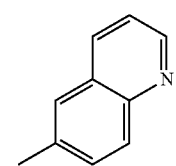
10-97
10-98
10-99
10-100
10-101
10-102
10-103
10-104
10-105
10-106
10-107

10-108 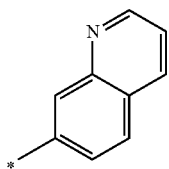
10-109 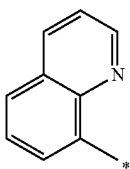
10-110 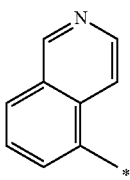
10-111 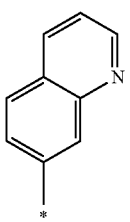
10-112 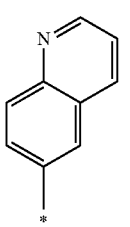
10-113 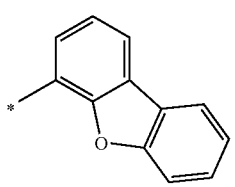
10-114 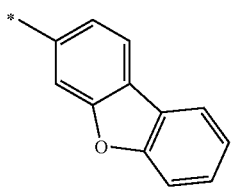
10-115 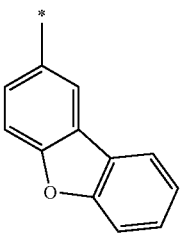
10-116 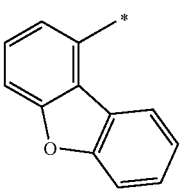
10-117 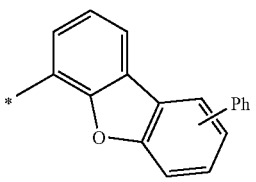
10-118 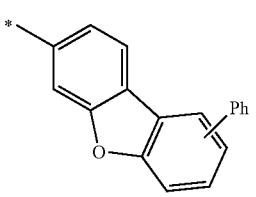
10-119 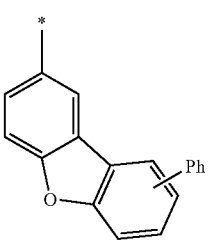
10-120 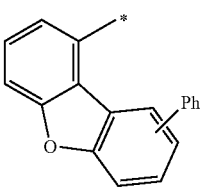
10-121 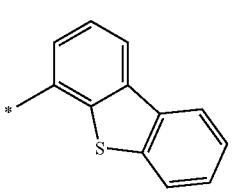

-continued
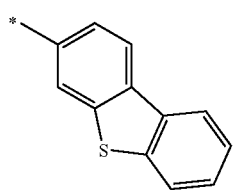
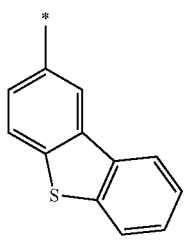
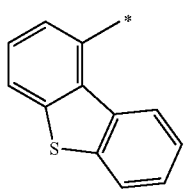
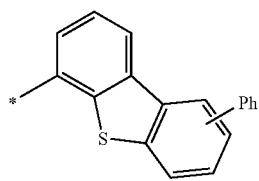
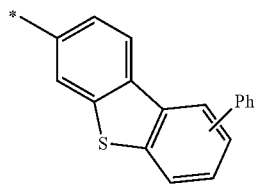
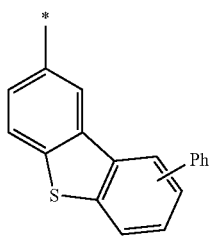
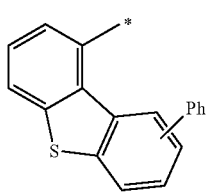
-continued
10-122
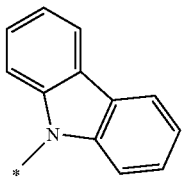
10-123
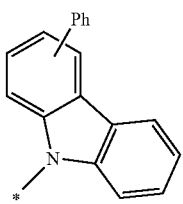
10-124
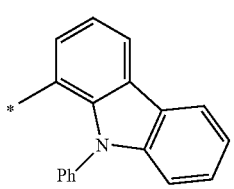
10-125
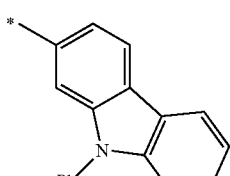
10-126
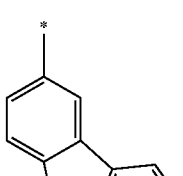
10-127
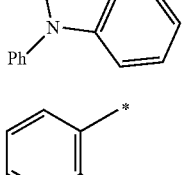
10-128
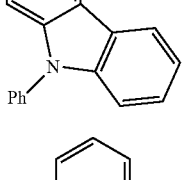
10-129
10-130
10-131
10-132
10-133
10-134
10-135
10-136
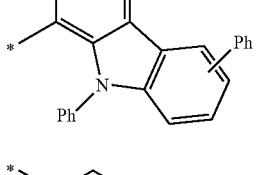

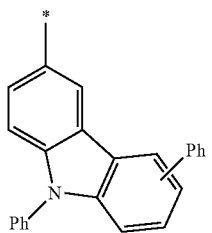
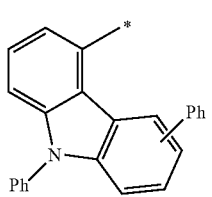
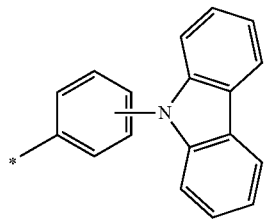
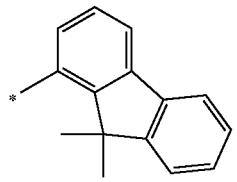
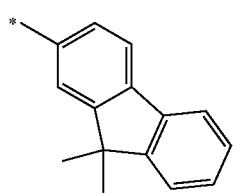
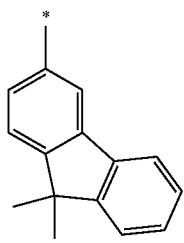
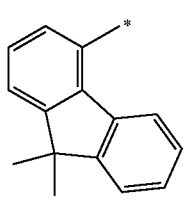
10-137
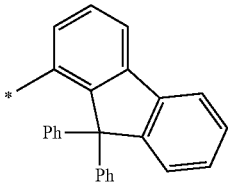
10-138
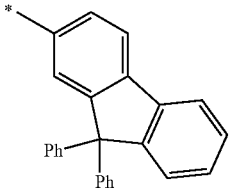
10-139
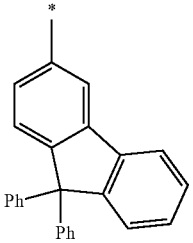
10-140
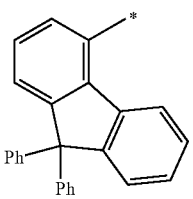
10-141
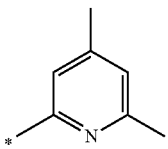
10-142
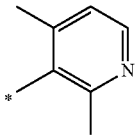
10-143
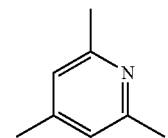
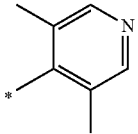
10-144
10-145
10-146
10-147
10-148
10-149
10-150
10-151

10-143 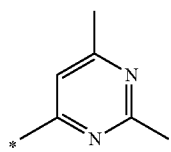
10-144 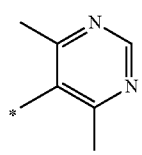
10-145 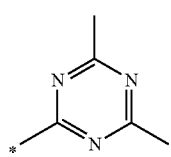
10-146 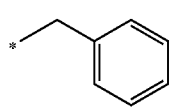
10-147 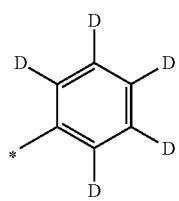
10-148 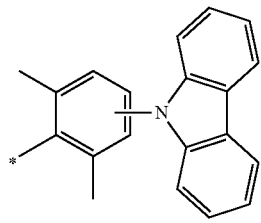
10-149 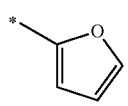
10-150 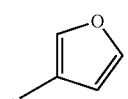
10-151 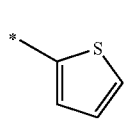
10-152 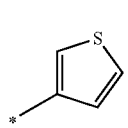
10-162 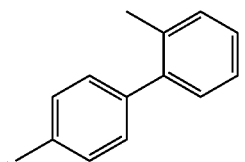
10-163 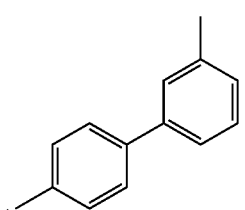
10-164 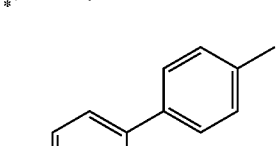
10-165 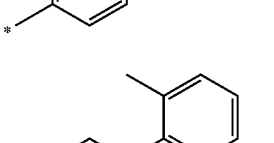
10-166 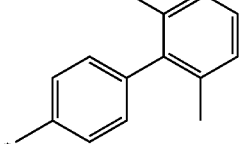
10-167 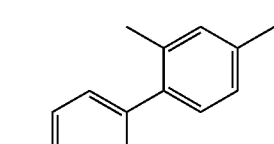
10-168 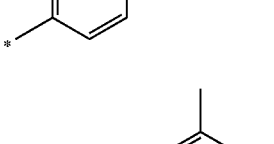
10-153 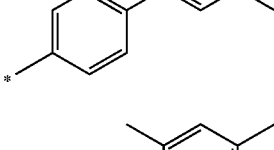
10-154 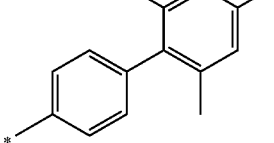
10-155
10-156
10-157
10-158
10-159
10-160
10-161
10-169 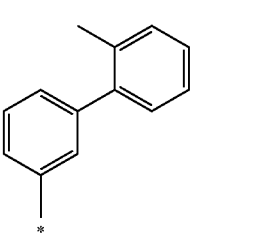

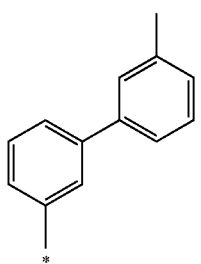
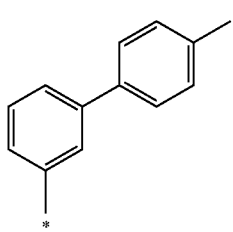
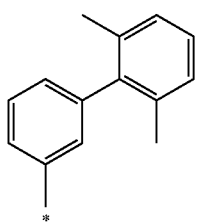
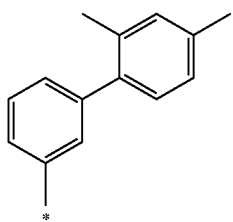
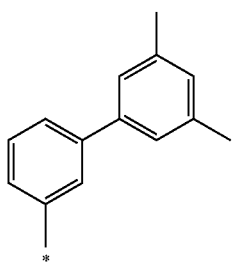
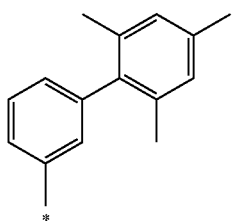
10-170
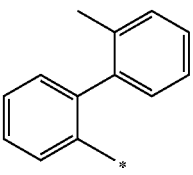
10-171
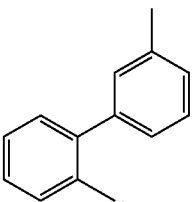
10-172
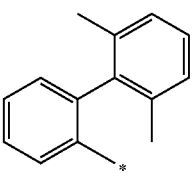
10-173
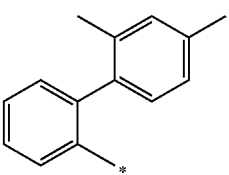
10-174
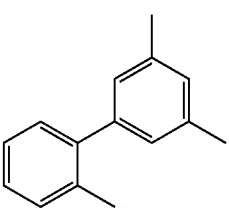
10-175
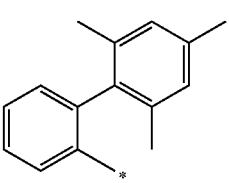
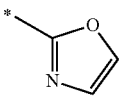
10-176
10-177
10-178
10-179
10-180
10-181
10-182
10-183
10-184

-continued 10-185 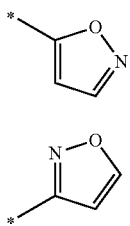

10-186

10-187

10-188

10-189 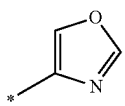

10-190 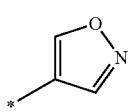

10-191

10-192 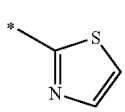

10-193 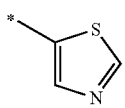

10-194 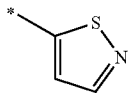

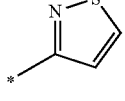

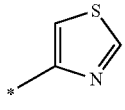

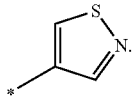

In Formulae 9-1 to 9-19 and 10-1 to 10-194, "*" indicates a binding site to a neighboring atom, "Ph" indicates a phenyl group, and "TMS" indicates a trimethylsilyl group.

In Formula 1, a1 to a4 each indicate the number of $R_1$ to $R_4$, and may each independently be an integer from 0 to 20 (for example, an integer from 0 to 4). When a1 is two or more, two or more of groups $R_1$ may be identical to or different from each other, when a2 is two or more, two or more of groups $R_2$ may be identical to or different from each other, when a3 is two or more, two or more of groups $R_3$ may be identical to or different from each other, and when a4 is two or more, two or more of groups $R_4$ may be identical to or different from each other.

In an embodiment, in Formula 1, a moiety represented by

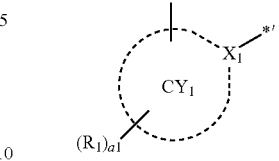

may be represented by one of Formulae CY1-1 to CY1-25:

CY1-1

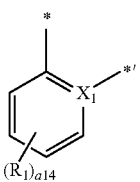

CY1-2

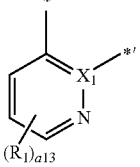

CY1-3

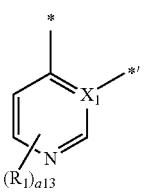

CY1-4

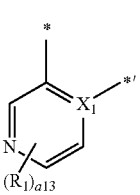

CY1-5

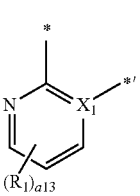

CY1-6

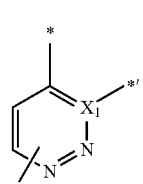

CY1-7
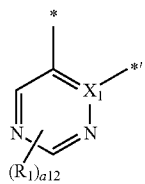
CY1-8
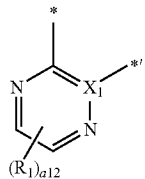
CY1-9
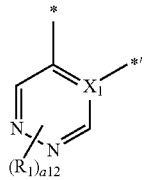
CY1-10
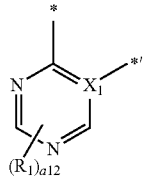
CY1-11
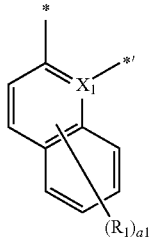
CY1-12
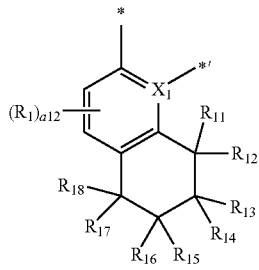
CY1-13
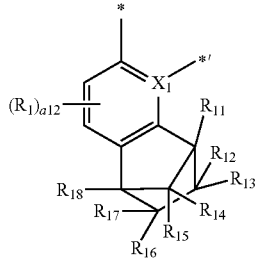
CY1-14
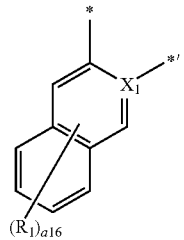
CY1-15
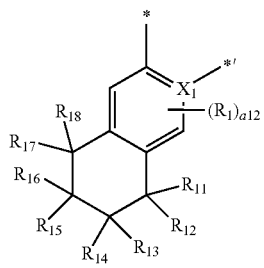
CY1-16
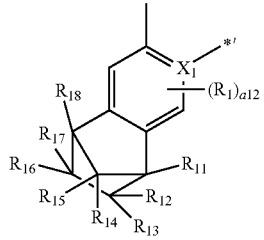
CY1-17
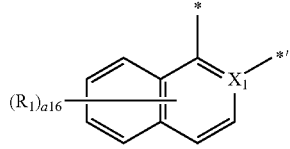
CY1-18
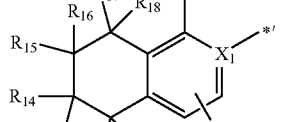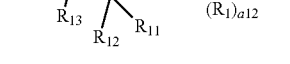
CY1-19
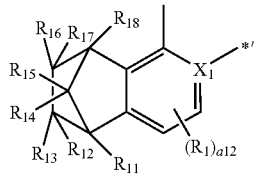

-continued

CY1-20
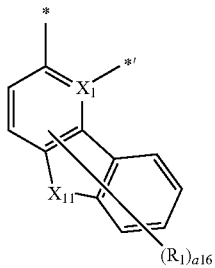

CY1-21
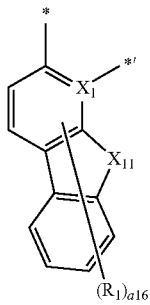

CY1-22
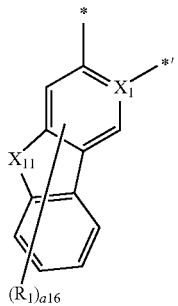

CY1-23
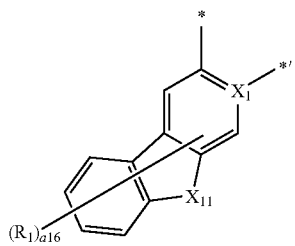

CY1-24
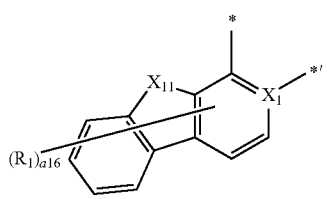

CY1-25
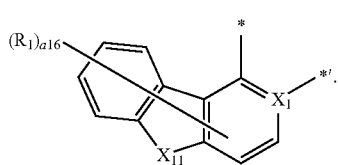

In Formulae CY1-1 to CY1-25,
$X_1$ and $R_1$ are the same as described herein,
$X_{11}$ may be $C(R_{11})(R_{12})$, $N(R_{11})$, O, S, or $Si(R_{11})(R_{12})$,
$R_{11}$ to $R_{18}$ are the same as described in connection with $R_1$,
a16 may be an integer from 0 to 6,
a14 may be an integer from 0 to 4,
a13 may be an integer from 0 to 3,
a12 may be an integer from 0 to 2,
*' indicates a binding site to M in Formula 1, and
* indicates a binding site to $T_1$ in Formula 1.

In one or more embodiments, a group represented by

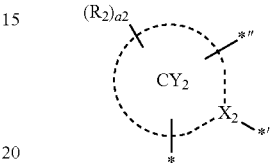

in Formula 1 may be selected from groups represented by Formulae CY2-1 to CY2-29:

CY2-1
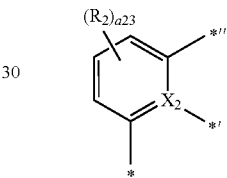

CY2-2
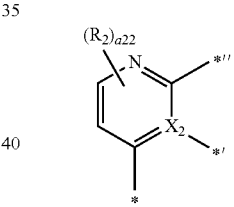

CY2-3
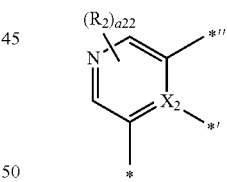

CY2-4
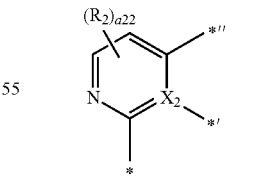

CY2-5
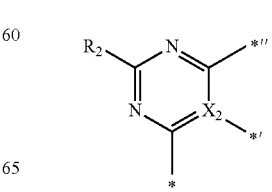

-continued
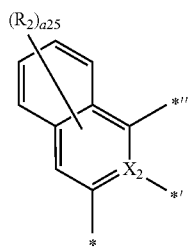
CY2-6
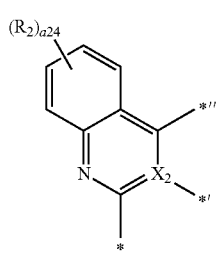
CY2-7
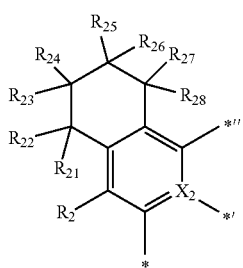
CY2-8
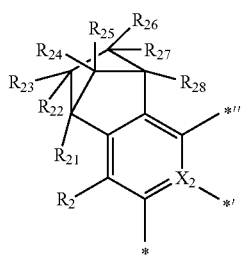
CY2-9
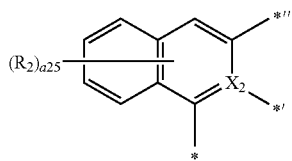
CY2-10
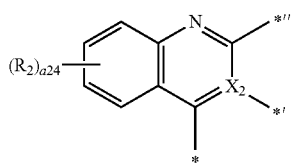
CY2-11
-continued
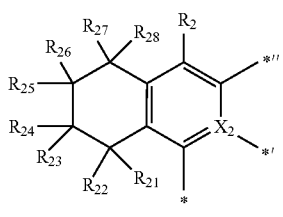
CY2-12
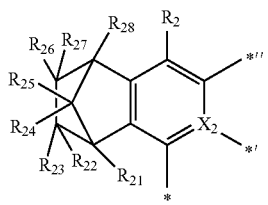
CY2-13
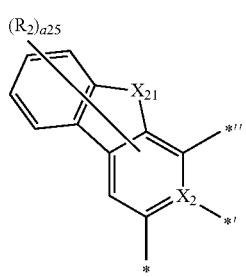
CY2-14
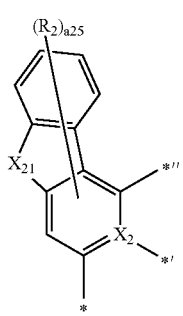
CY2-15
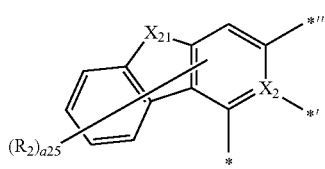
CY2-16
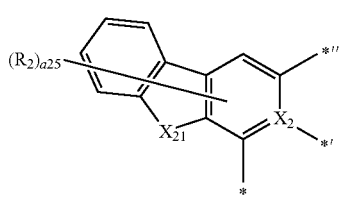
CY2-17

-continued

CY2-18 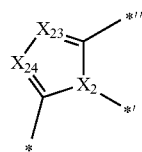

CY2-19 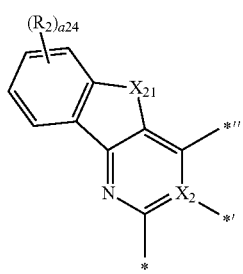

CY2-25 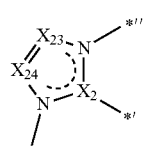

CY2-26

CY2-20 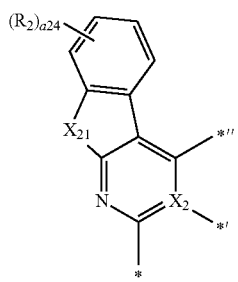

CY2-27 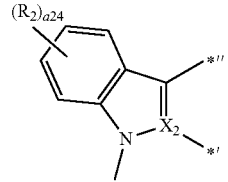

CY2-28 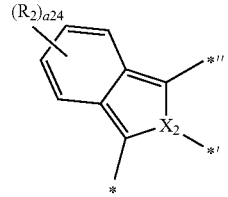

CY2-21 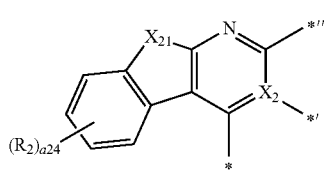

CY2-29 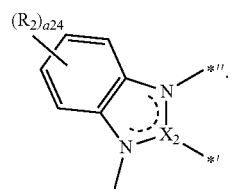

CY2-22 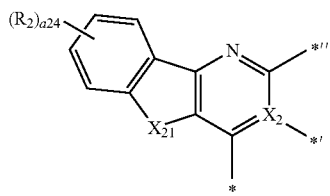

CY2-23 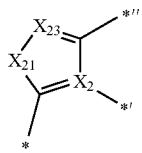

In Formulae CY2-1 to CY2-29,
$X_2$ and $R_2$ are the same as described herein,
$X_{21}$ may be $C(R_{21})(R_{22})$, $N(R_{21})$, O, S, or $Si(R_{21})(R_{22})$,
$X_{23}$ may be $C(R_{23})$ or N,
$X_{24}$ may be $O(R_{24})$ or N,
$R_{21}$ to $R_{28}$ are the same as described in connection with $R_2$,
a25 may be an integer from 0 to 5,
a24 may be an integer from 0 to 4,
a23 may be an integer from 0 to 3,
a22 may be an integer from 0 to 2,
* indicates a binding site to $T_1$ in Formula 1,
*' indicates a binding site to M in Formula 1, and
*'' indicates a binding site to $T_2$ in Formula 1.

In one or more embodiments, a group represented by

CY2-24 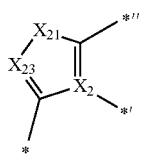

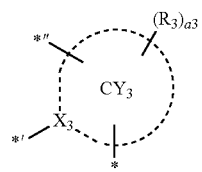

in Formula 1 may be selected from groups represented by Formulae CY3-1 to CY3-29:
CY3-1
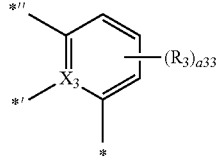
CY3-2
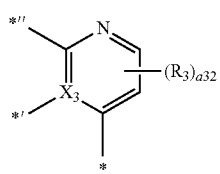
CY3-3
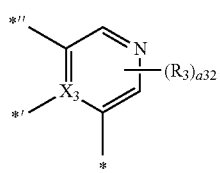
CY3-4
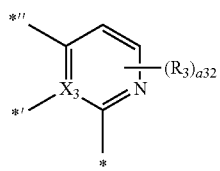
CY3-5
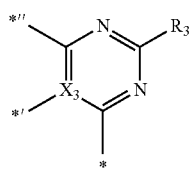
CY3-6
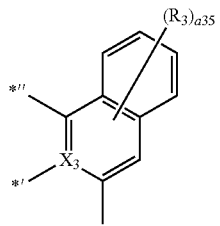
CY3-7
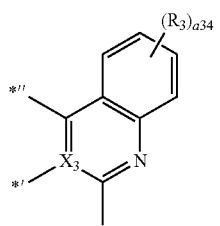
CY3-8
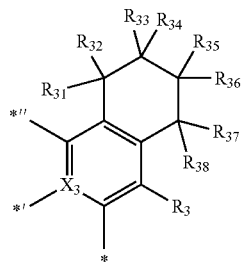
CY3-9
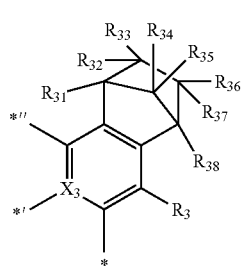
CY3-10
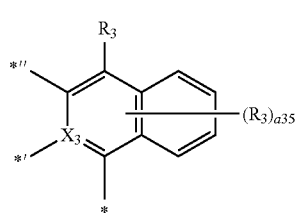
CY3-11
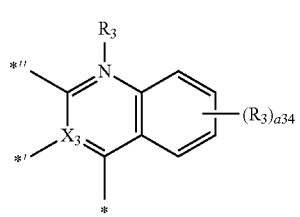
CY3-12
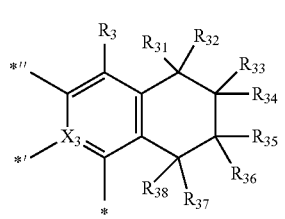
CY3-13
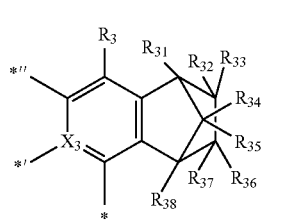

CY3-14 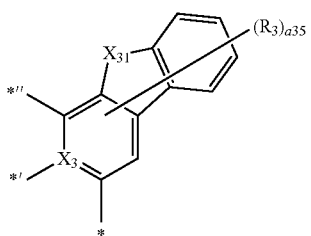
CY3-15 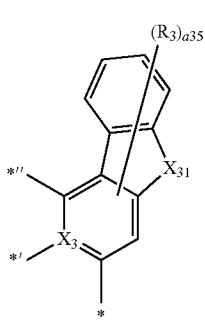
CY3-16 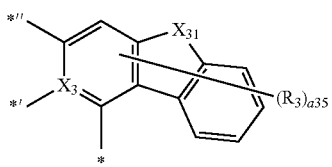
CY3-17 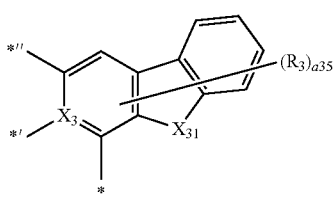
CY3-18 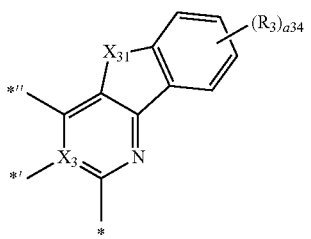
CY3-19 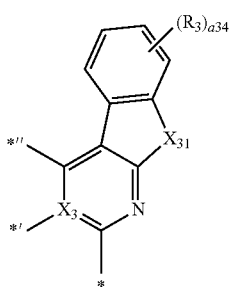
CY3-20 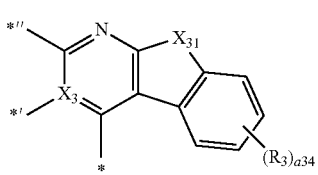
CY3-21 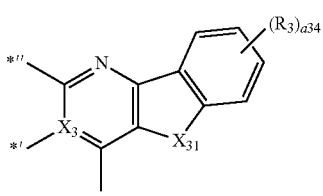
CY3-22 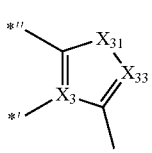
CY3-23 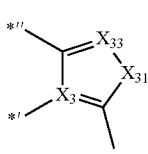
CY3-24 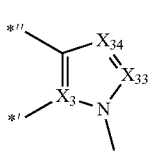
CY3-25 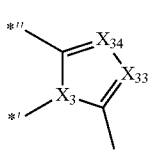
CY3-26 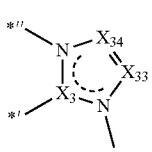
CY3-27 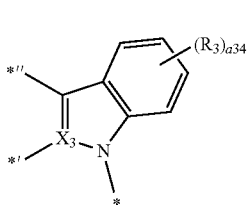

-continued

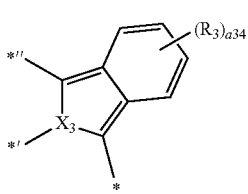
CY3-28

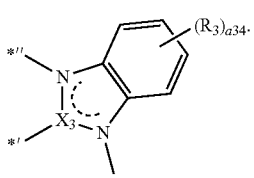
CY3-29

In Formulae CY3-1 to CY3-29, $X_3$ and $R_3$ are the same as described herein, $X_{31}$ may be $C(R_{31})(R_{32})$, $N(R_{31})$, O, S, or $Si(R_{31})(R_{32})$, $X_{33}$ may be $C(R_{33})$ or N, $X_{34}$ may be $C(R_{34})$ or N, $R_{31}$ to $R_{38}$ are the same as described in connection with $R_3$, a35 may be an integer from 0 to 5, a34 may be an integer from 0 to 4, a33 may be an integer from 0 to 3, a32 may be an integer from 0 to 2,

*'' indicates a binding site to $T_2$ in Formula 1,

*' indicates a binding site to M in Formula 1, and

* indicates a binding site to $T_3$ in Formula 1.

In one or more embodiments, a group represented by

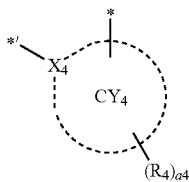

in Formula 1 may be selected from groups represented by Formulae CY4-1 to CY4-45:

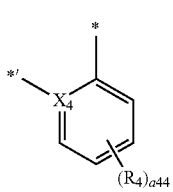
CY4-1

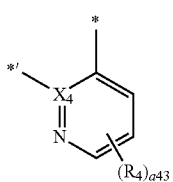
CY4-2

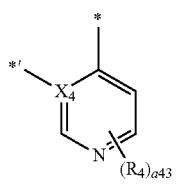
CY4-3

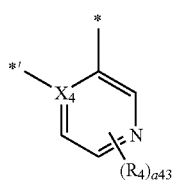
CY4-4

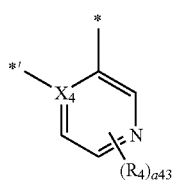
CY4-5

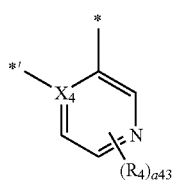
CY4-6

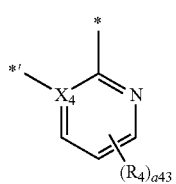
CY4-7

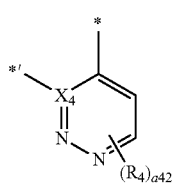
CY4-8

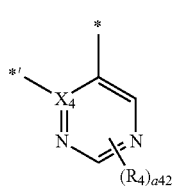
CY4-9

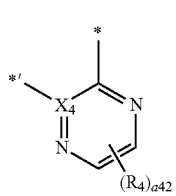
CY4-10

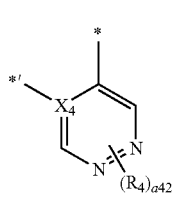

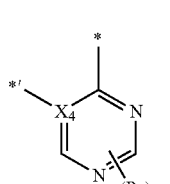

-continued
CY4-11
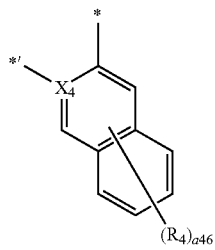
CY4-12
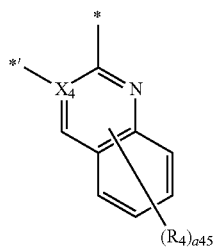
CY4-13
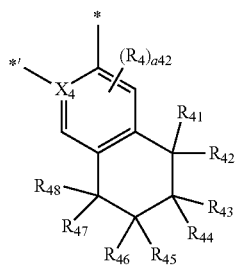
CY4-14
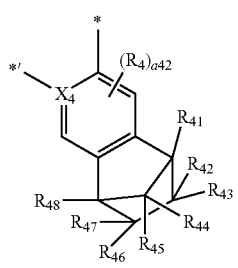
CY4-15
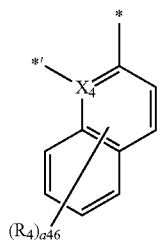
CY4-16
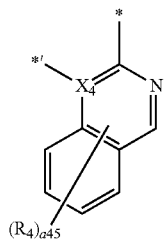
-continued
CY4-17
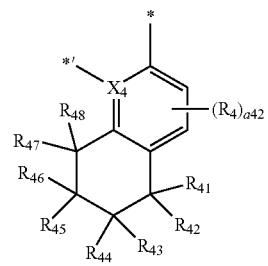
CY4-18
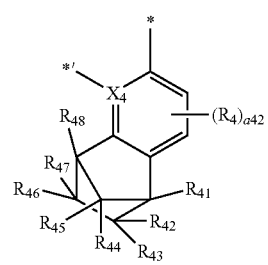
CY4-19
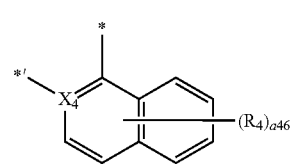
CY4-20
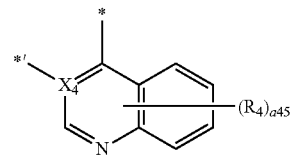
CY4-21
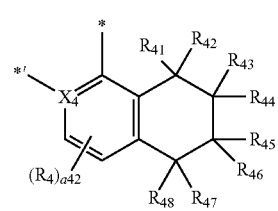
CY4-22
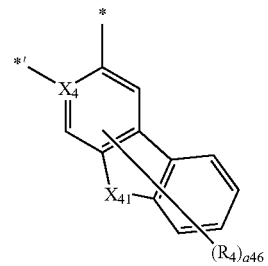
CY4-23

-continued
CY4-24
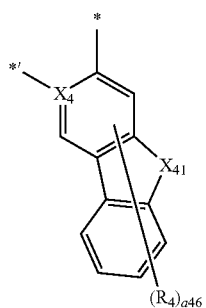
CY4-25
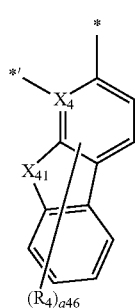
CY4-26
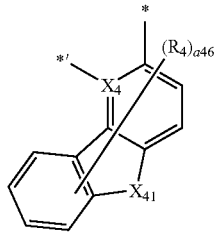
CY4-27
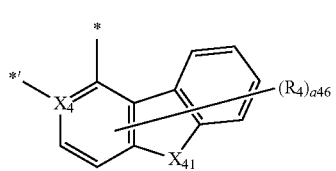
CY4-28
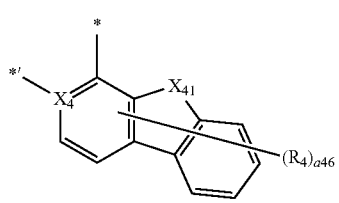
CY4-29
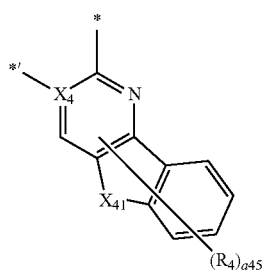
-continued
CY4-30
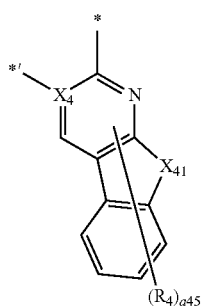
CY4-31
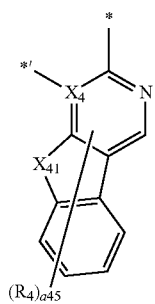
CY4-32
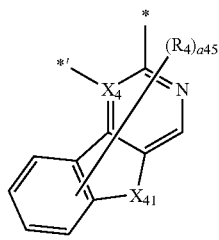
CY4-33
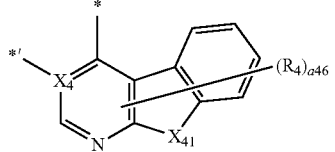
CY4-34
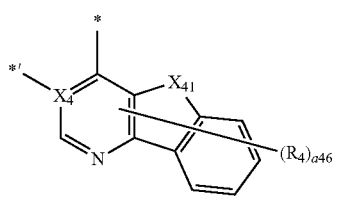
CY4-35
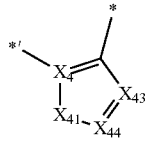
CY4-36
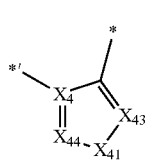

-continued

CY4-37 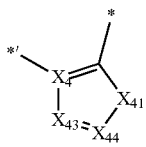

CY4-38 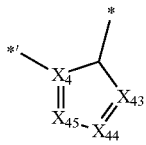

CY4-39 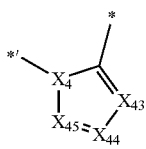

CY4-40 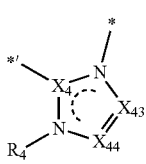

CY4-41 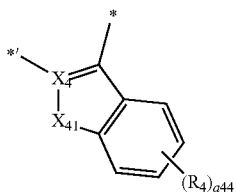

CY4-42 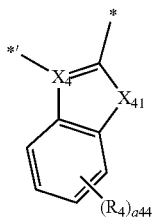

CY4-43 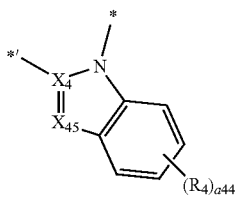

CY4-44 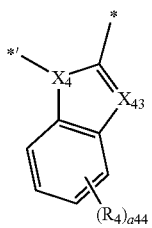

CY4-45 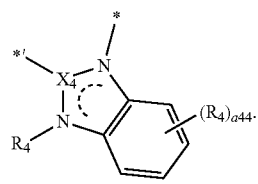

In Formulae CY4-1 to CY4-45, $X_4$ and $R_4$ are the same as described herein, $X_{41}$ may be $C(R_{41})(R_{42})$, $N(R_{41})$, O, S, or $Si(R_{41})(R_{42})$, $X_{43}$ may be $C(R_{43})$ or N, $X_{44}$ may be $C(R_{44})$ or N, $X_{45}$ may be $C(R_{45})$ or N, $R_{41}$ to $R_{48}$ are the same as described in connection with $R_4$, a46 may be an integer from 0 to 6, a45 may be an integer from 0 to 5, a44 may be an integer from 0 to 4, a43 may be an integer from 0 to 3, a42 may be an integer from 0 to 2, \* indicates a binding site to $T_3$ in Formula 1, and \*' indicates a binding site to M in Formula 1.

In one or more embodiments, in Formula 1, a moiety represented by

[structure with CY₁, $X_1$, $(R_1)_{a1}$, *, *']

may be selected from groups represented by Formulae CY1(1) to CY1(22), and/or a moiety represented by

[structure with CY₂, $X_2$, $(R_2)_{a2}$, *, *', *″]

may be selected from groups represented by Formulae CY2(1) to CY2(30), and/or a moiety represented by

[structure with CY₃, $X_3$, $(R_3)_{a3}$, *, *', *″]

may be selected from groups represented by Formulae CY3(1) to CY3(30), and/or a moiety represented by
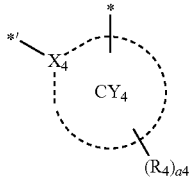
may be selected from groups represented by Formulae CY4(1) to CY4(50), but embodiments of the present disclosure are not limited thereto:
CY1(1)
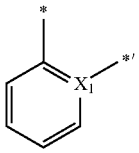
CY1(2)
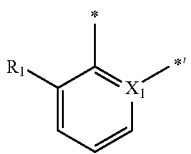
CY1(3)
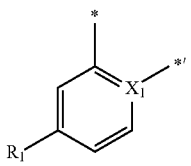
CY1(4)
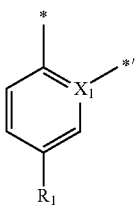
CY1(5)
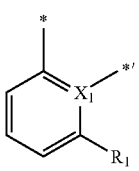
CY1(6)
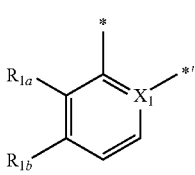
CY1(7)
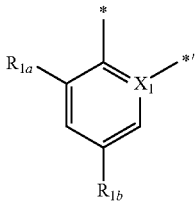
CY1(8)
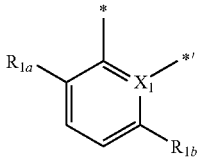
CY1(9)
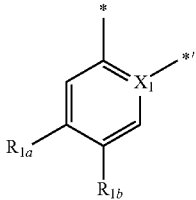
CY1(10)
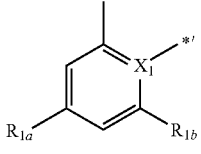
CY1(11)
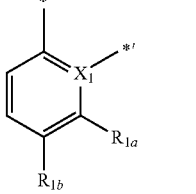
CY1(12)
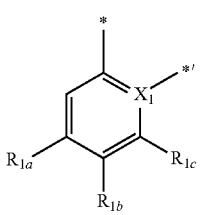
CY1(13)
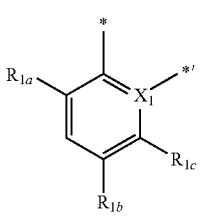
CY1(14)
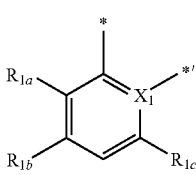

-continued
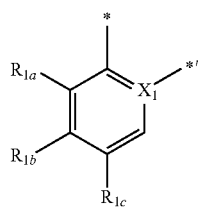
CY1(15)
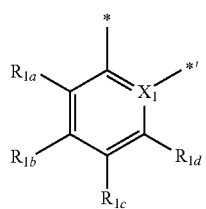
CY1(16)
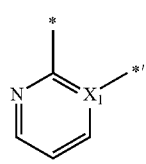
CY1(17)
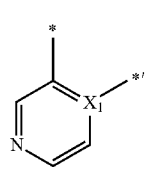
CY1(18)
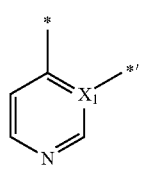
CY1(19)
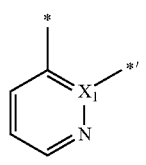
CY1(20)
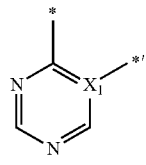
CY1(21)
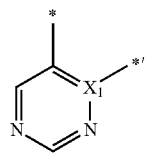
CY1(22)
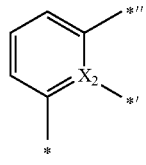
CY2(1)
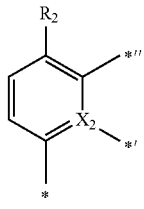
CY2(2)
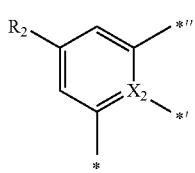
CY2(3)
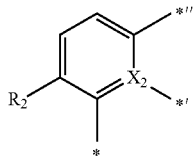
CY2(4)
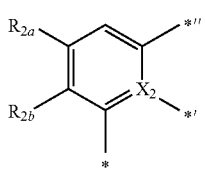
CY2(5)
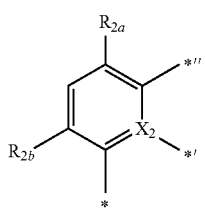
CY2(6)
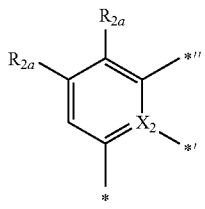
CY2(7)
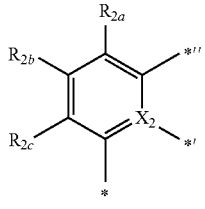
CY2(8)
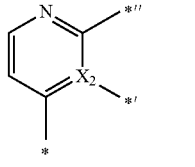
CY2(9)

-continued
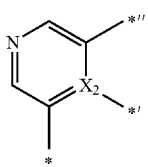
CY2(10)
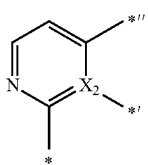
CY2(11)
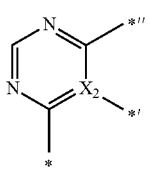
CY2(12)
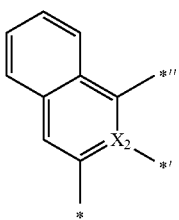
CY2(13)
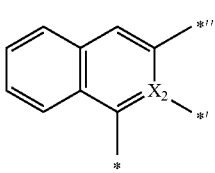
CY2(14)
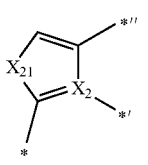
CY2(15)
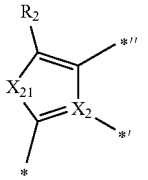
CY2(16)
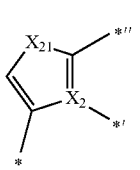
CY2(17)
-continued
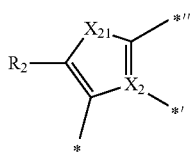
CY2(18)
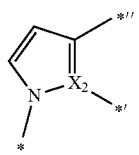
CY2(19)
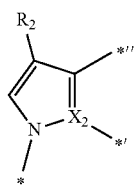
CY2(20)
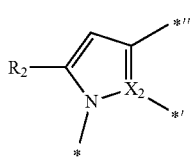
CY2(21)
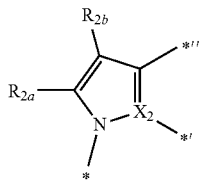
CY2(22)
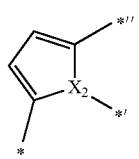
CY2(23)
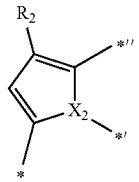
CY2(24)
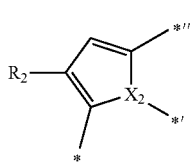
CY2(25)

-continued
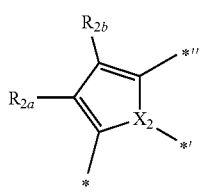 CY2(26)
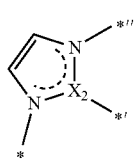 CY2(27)
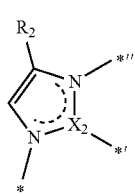 CY2(28)
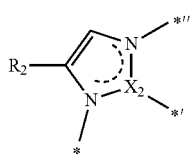 CY2(29)
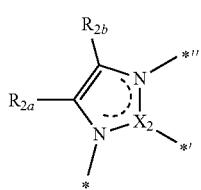 CY2(30)
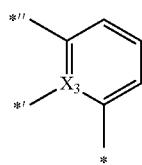 CY3(1)
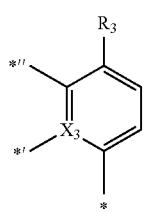 CY3(2)
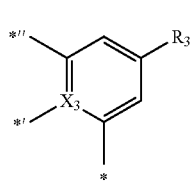 CY3(3)
-continued
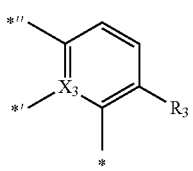 CY3(4)
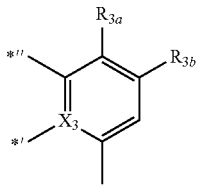 CY3(5)
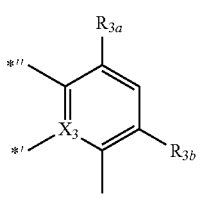 CY3(6)
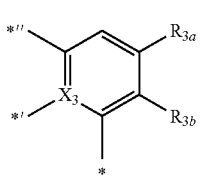 CY3(7)
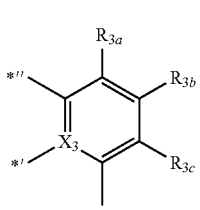 CY3(8)
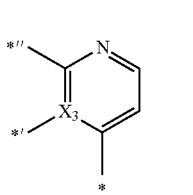 CY3(9)
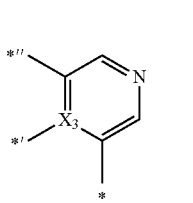 CY3(10)
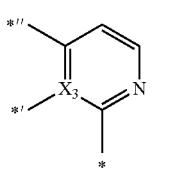 CY3(11)

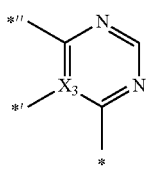
CY3(12)
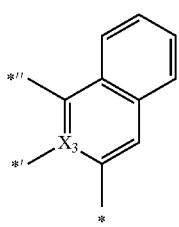
CY3(13)
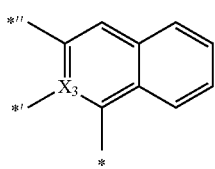
CY3(14)
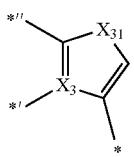
CY3(15)
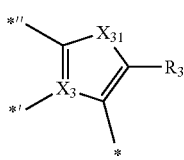
CY3(16)
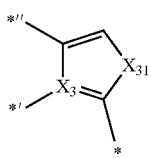
CY3(17)
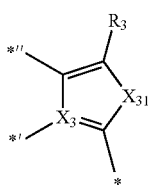
CY3(18)
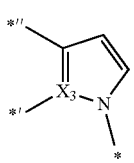
CY3(19)
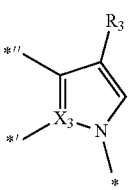
CY3(20)
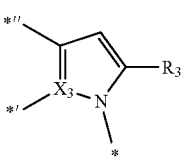
CY3(21)
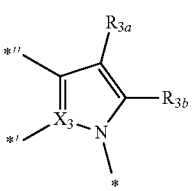
CY3(22)
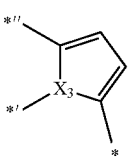
CY3(23)
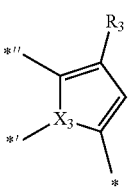
CY3(24)
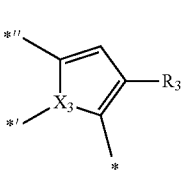
CY3(25)
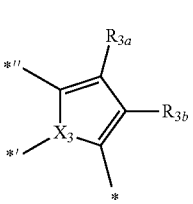
CY3(26)
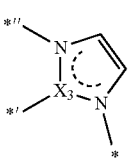
CY3(27)

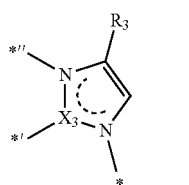
CY3(28)
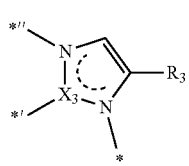
CY3(29)
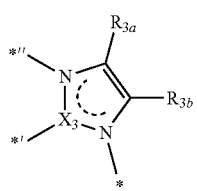
CY3(30)
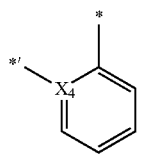
CY4(1)
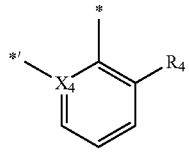
CY4(2)
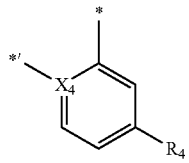
CY4(3)
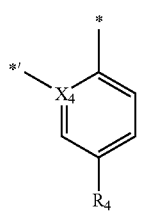
CY4(4)
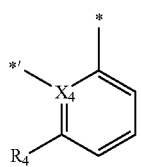
CY4(5)
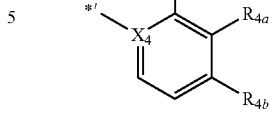
CY4(6)
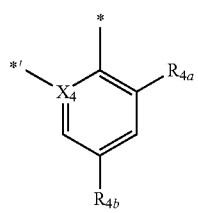
CY4(7)
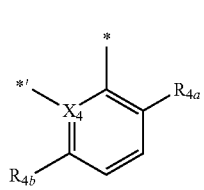
CY4(8)
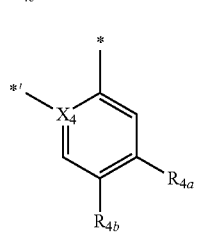
CY4(9)
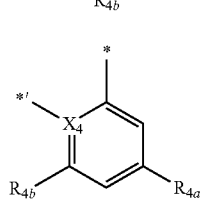
CY4(10)
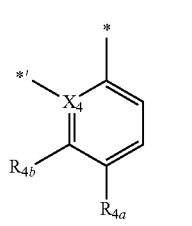
CY4(11)
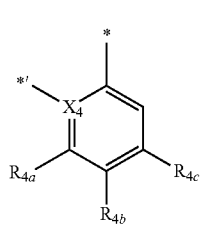
CY4(12)
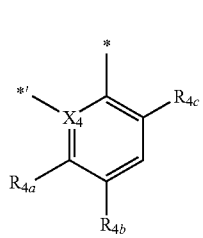
CY4(13)

-continued
CY4(14)
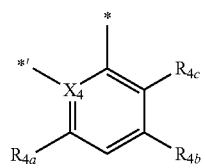
CY4(15)
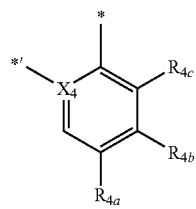
CY4(16)
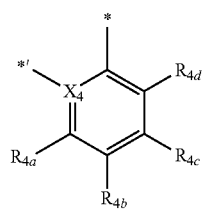
CY4(17)
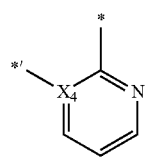
CY4(18)
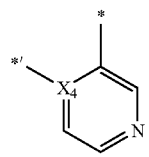
CY4(19)
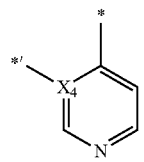
CY4(20)
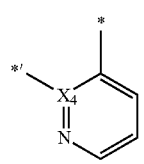
CY4(21)
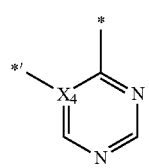
CY4(22)
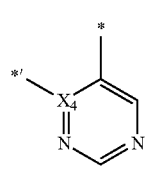
-continued
CY4(23)
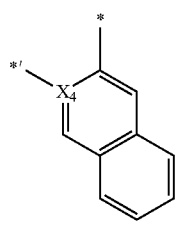
CY4(24)
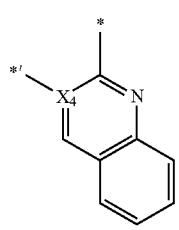
CY4(25)
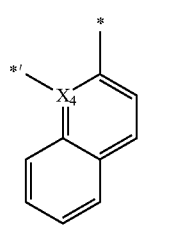
CY4(26)
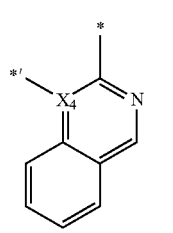
CY4(27)
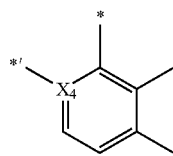
CY4(28)
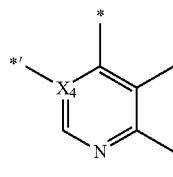
CY4(29)
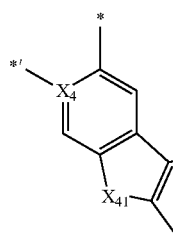

CY4(30) 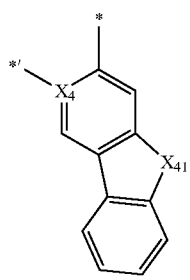
CY4(31) 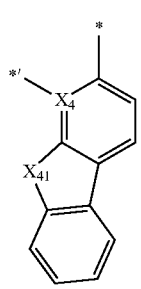
CY4(32) 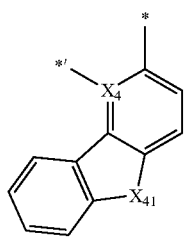
CY4(33) 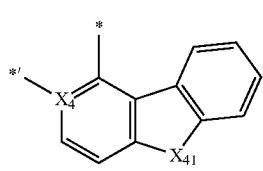
CY4(34) 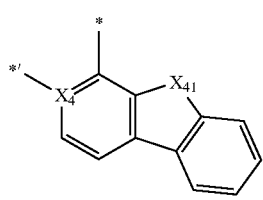
CY4(35) 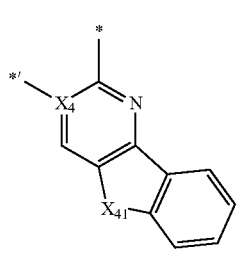
CY4(36) 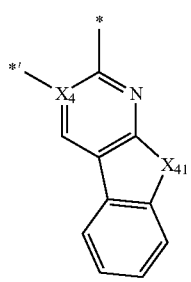
CY4(37) 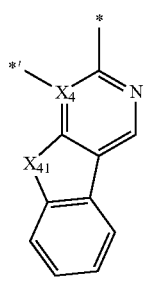
CY4(38) 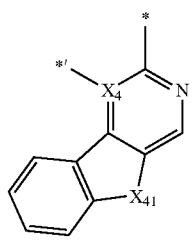
CY4(39) 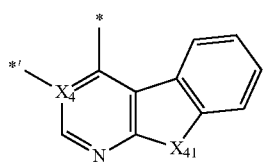
CY4(40) 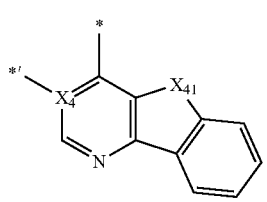
CY4(41) 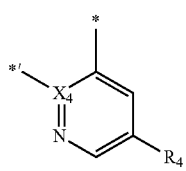
CY4(42) 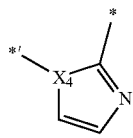

-continued

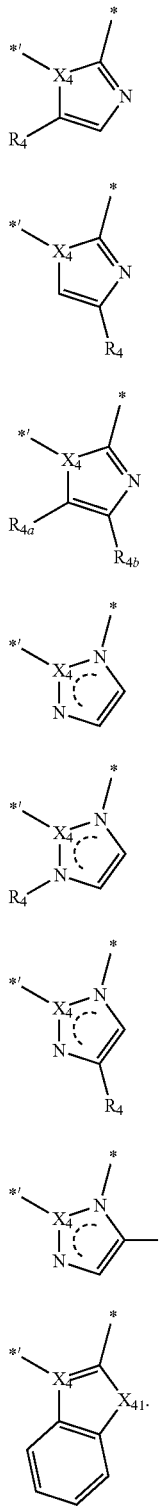

CY4(43)
CY4(44)
CY4(45)
CY4(46)
CY4(47)
CY4(48)
CY4(49)
CY4(50)

In Formulae CY1(1) to CY1(22), CY2(1) to CY2(30), CY3(1) to CY3(30), and CY4(1) to CY4(50), $X_1$ to $X_4$ and $R_1$ to $R_4$ are the same as described herein, $X_{21}$ may be $C(R_{21})(R_{22})$, $N(R_{21})$, O, S, or $Si(R_{21})(R_{22})$, $X_{31}$ may be $C(R_{31})(R_{32})$, $N(R_{31})$, O, S, or $Si(R_{31})(R_{32})$, $X_{41}$ may be $C(R_{41})(R_{42})$, $N(R_{41})$, O, S, or $Si(R_{41})(R_{42})$, $R_{1a}$ to $R_{1d}$ are the same as described in connection with $R_1$, $R_{2a}$ to $R_{2c}$, $R_{21}$, and $R_{22}$ are the same as described in connection with $R_2$, $R_{3a}$ to $R_{3c}$, $R_{31}$, and $R_{32}$ are the same as described in connection with $R_3$, $R_{4a}$ to $R_{4d}$, $R_{41}$, and $R_{42}$ are the same as described in connection with $R_4$, $R_1$ to $R_4$, $R_{1a}$ to $R_{1d}$, $R_{2a}$ to $R_{2c}$, $R_{3a}$ to $R_{3c}$, and $R_{4a}$ to $R_{4d}$ are not hydrogen, in Formulae CY1(1) to CY1(22), *' indicates a binding site to M in Formula 1, and * indicates a binding site to $T_1$ in Formula 1, in Formulae CY2(1) to CY2(30), * indicates a binding site to $T_1$ in Formula 1, *' indicates a binding site to M in Formula 1, and *'' indicates a binding site to $T_2$ in Formula 1, in Formulae CY3(1) to CY3(30), *'' indicates a binding site to $T_2$ in Formula 1, *' indicates a binding site to M in Formula 1, and * indicates a binding site to $T_3$ in Formula 1, and in Formulae CY4(1) to CY4(50), * indicates a binding site to $T_3$ in Formula 1, and *' indicates a binding site to M in Formula 1.

In one or more embodiments, the organometallic compound may be represented by Formula 1A:

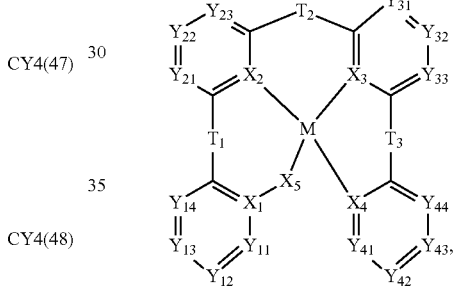

In Formula 1A,

M, $X_1$ to $X_5$, and $T_1$ to $T_3$ are the same as described herein, $Y_{11}$ may be $C(Z_{11})$ or N, $Y_{12}$ may be $C(Z_{12})$ or N, $Y_{13}$ may be $C(Z_{13})$ or N, $Y_{14}$ may be $C(Z_{14})$ or N, $Y_{21}$ may be $C(Z_{21})$ or N, $Y_{22}$ may be $C(Z_{22})$ or N, $Y_{23}$ may be $C(Z_{23})$ or N, $Y_{31}$ may be $C(Z_{31})$ or N, $Y_{32}$ may be $C(Z_{32})$ or N, $Y_{33}$ may be $C(Z_{33})$ or N, $Y_{41}$ may be $C(Z_{41})$ or N, $Y_{42}$ may be $C(Z_{42})$ or N, $Y_{43}$ may be $C(Z_{43})$ or N, and $Y_{44}$ may be $C(Z_{44})$ or N, $Z_{11}$ to $Z_{14}$ are the same as described in connection with $R_1$, at least two of $Z_1$ to $Z_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $Z_{21}$ to $Z_{23}$ are the same as described in connection with $R_2$, at least two of $Z_{21}$ to $Z_{23}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $Z_{31}$ to $Z_{32}$ are the same as described in connection with $R_3$, at least two of $Z_{31}$ to $Z_{34}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $Z_{41}$ to $Z_{44}$ are the same as described in connection with $R_4$, at least two of $Z_{41}$ to $Z_{44}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and $R_{10a}$ is the same as described in connection with $R_1$.

For example, in Formula 1A, $Y_{11}$ may be $C(Z_{11})$, $Y_{12}$ may be $C(Z_{12})$, $Y_{13}$ may be $C(Z_{13})$, $Y_{14}$ may be $C(Z_{14})$, $Y_{21}$ may be $C(Z_{21})$, $Y_{22}$ may be $C(Z_{22})$, $Y_{23}$ may be $C(Z_{23})$, $Y_{31}$ may be $C(Z_{31})$, $Y_{32}$ may be $C(Z_{32})$, $Y_{33}$ may be $C(Z_{33})$, $Y_{41}$ may be $C(Z_{41})$, $Y_{42}$ may be $C(Z_{42})$ or N, $Y_{43}$ may be $C(Z_{43})$, and $Y_{44}$ may be $C(Z_{44})$ or N, but embodiments of the present disclosure are not limited thereto.

In Formula 1, i) two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, ii) two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, iii) two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, iv) two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, v) at least two neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group, vi) two of $Z_{11}$ to $Z_{14}$ may optionally be linked to form a substituted or unsubstituted $C_5$-$C_{30}$ carbocyclic group or a substituted or unsubstituted $C_1$-$C_{30}$ heterocyclic group, vii) two of $Z_{21}$ to $Z_{23}$ may optionally be linked to form a substituted or unsubstituted $C_5$-$C_{30}$ carbocyclic group or a substituted or unsubstituted $C_1$-$C_{30}$ heterocyclic group, viii) two of $Z_{31}$ to $Z_{33}$ may optionally be linked to form a substituted or unsubstituted $C_5$-$C_{30}$ carbocyclic group or a substituted or unsubstituted $C_1$-$C_{30}$ heterocyclic group, and ix) two of $Z_{41}$ to $Z_{44}$ may optionally be linked to form a substituted or unsubstituted $C_5$-$C_{30}$ carbocyclic group or a substituted or unsubstituted $C_1$-$C_{30}$ heterocyclic group.

For example, i) the substituted or unsubstituted $C_5$-$C_{30}$ carbocyclic group or the substituted or unsubstituted $C_1$-$C_{30}$ heterocyclic group, formed by linking two of the plurality of neighboring groups $R_1$, ii) the substituted or unsubstituted $C_5$-$C_{30}$ carbocyclic group or the substituted or unsubstituted $C_1$-$C_{30}$ heterocyclic group, formed by linking two of the plurality of neighboring groups $R_2$, iii) the substituted or unsubstituted $C_5$-$C_{30}$ carbocyclic group or the substituted or unsubstituted $C_1$-$C_{30}$ heterocyclic group, formed by linking two of the plurality of neighboring groups $R_3$, iv) the substituted or unsubstituted $C_5$-$C_{30}$ carbocyclic group or the substituted or unsubstituted $C_1$-$C_{30}$ heterocyclic group, formed by linking two of the plurality of neighboring groups $R_4$, v) the substituted or unsubstituted $C_5$-$C_{30}$ carbocyclic group or the substituted or unsubstituted $C_1$-$C_{30}$ heterocyclic group, formed by linking at least two of $R_1$ to $R_4$, vi) the substituted or unsubstituted $C_5$-$C_{30}$ carbocyclic group or the substituted or unsubstituted $C_1$-$C_{30}$ heterocyclic group, formed by linking two of $Z_{11}$ to $Z_{14}$, vii) the substituted or unsubstituted $C_5$-$C_{30}$ carbocyclic group or the substituted or unsubstituted $C_1$-$C_{30}$ heterocyclic group, formed by linking two of $Z_{21}$ to $Z_{23}$, viii) the substituted or unsubstituted $C_5$-$C_{30}$ carbocyclic group or the substituted or unsubstituted $C_1$-$C_{30}$ heterocyclic group, formed by linking two of $Z_{31}$ to $Z_{33}$, and ix) the substituted or unsubstituted $C_5$-$C_{30}$ carbocyclic group or the substituted or unsubstituted $C_1$-$C_{30}$ heterocyclic group, formed by linking two of $Z_{41}$ to $Z_{44}$, may each independently be selected from:

a pentadiene group, a cyclohexane group, a cycloheptane group, an adamantane group, a bicyclo-heptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a pentadiene group, a cyclohexane group, a cycloheptane group, an adamantane group, a bicyclo-heptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10a}$, but embodiments of the present disclosure are not limited thereto.

$R_{10a}$ is the same as describe in connection with $R_1$.

The terms "an azaindole group, an azabenzoborol group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, and an azadibenzothiophene 5,5-dioxide group" each refer to a heteroring having the same backbone as "an indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, and a dibenzothiophene 5,5-dioxide group", wherein at least one of carbon atoms constituting the heteroring is substituted with nitrogen.

For example, the organometallic compound may be one of Compounds 1 to 29, but embodiments of the present disclosure are not limited thereto:

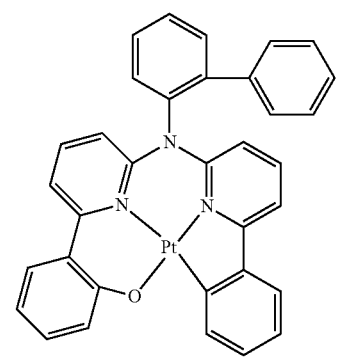

1

-continued
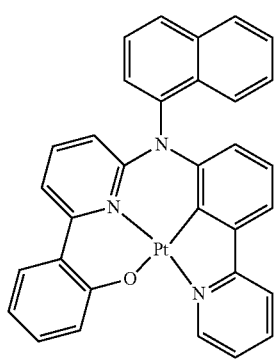
2
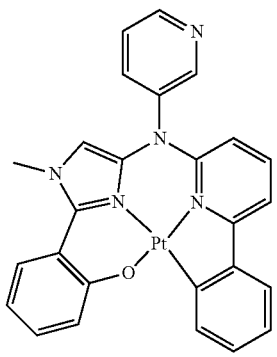
6
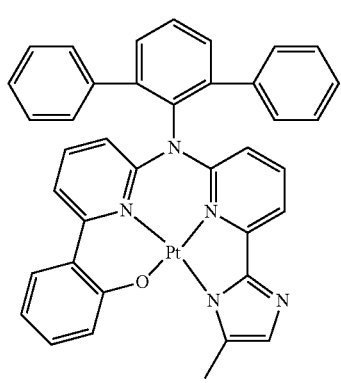
3
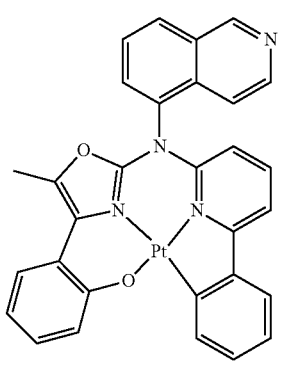
7
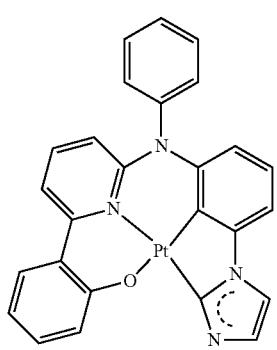
4
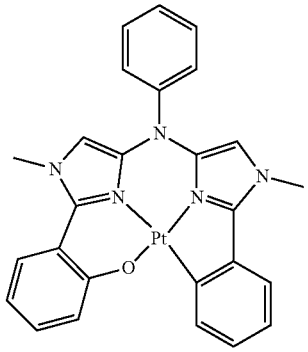
8
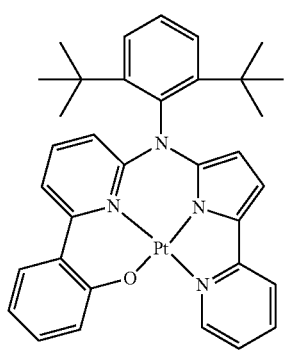
5
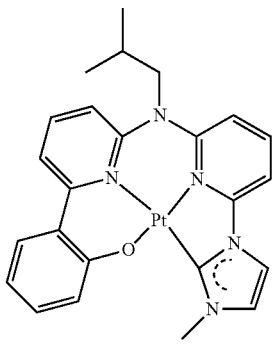
9

-continued
10
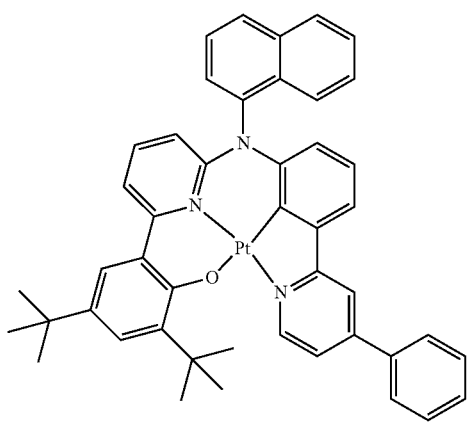
11
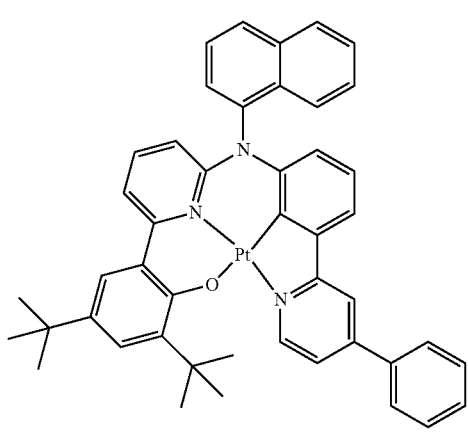
12
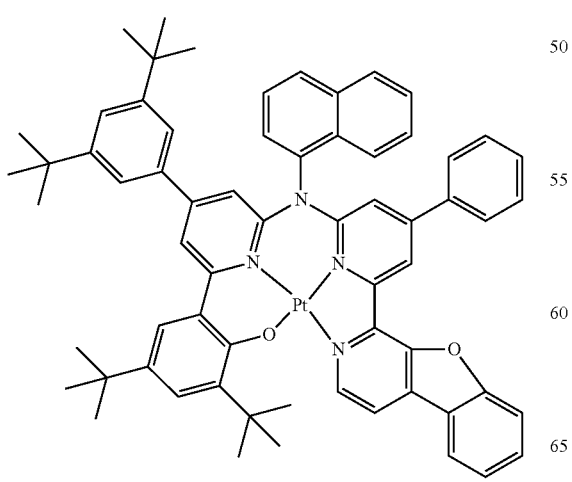
-continued
13
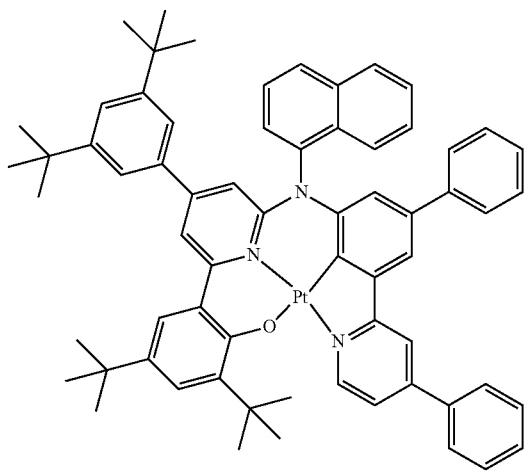
14
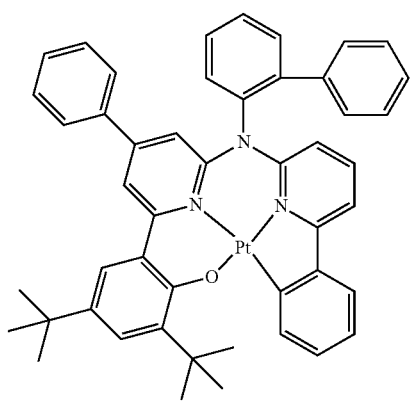
15
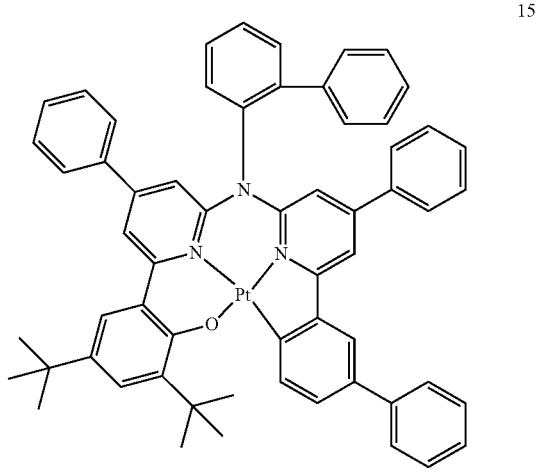

-continued
16
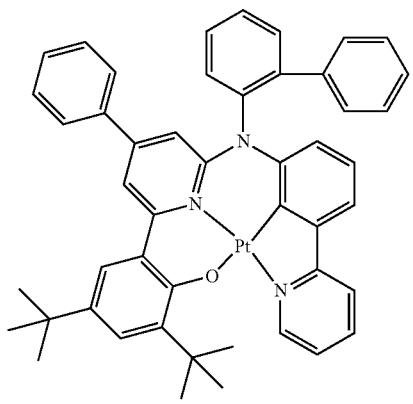
17
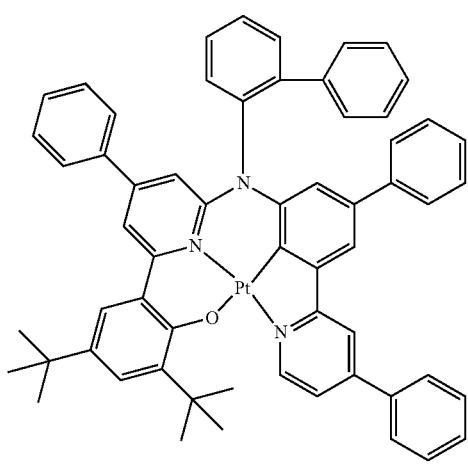
18
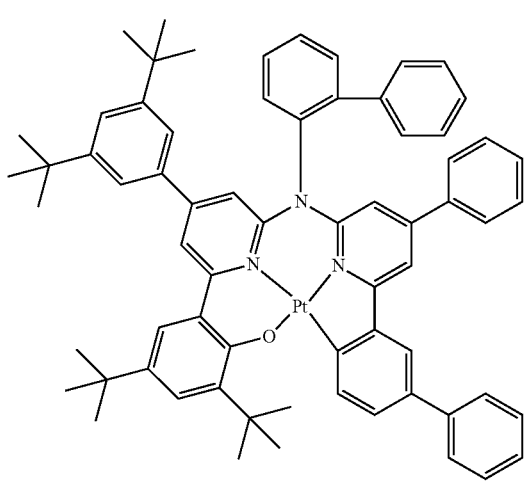
-continued
19
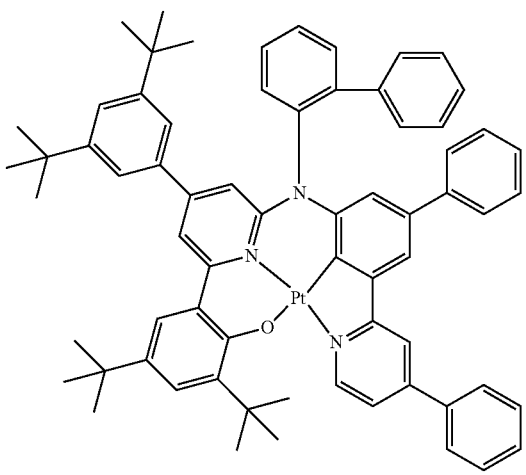
20
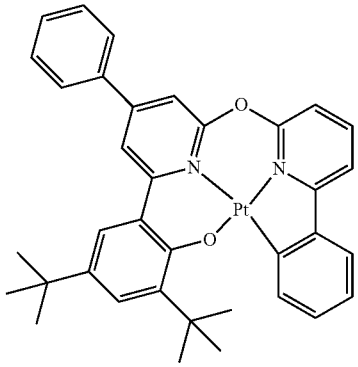
21
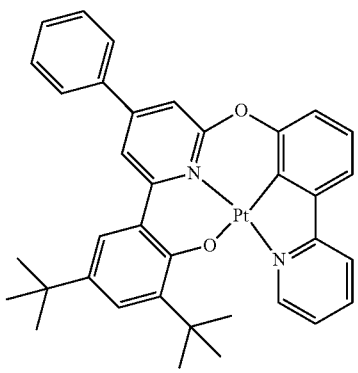

22
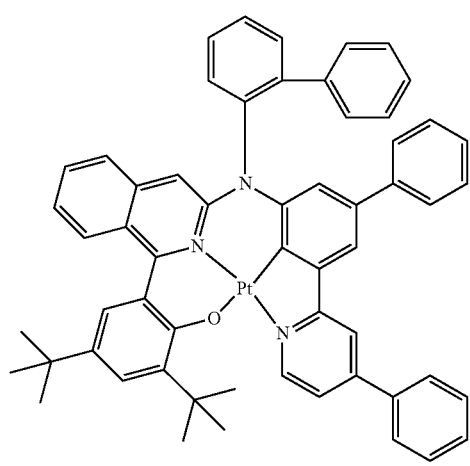
23
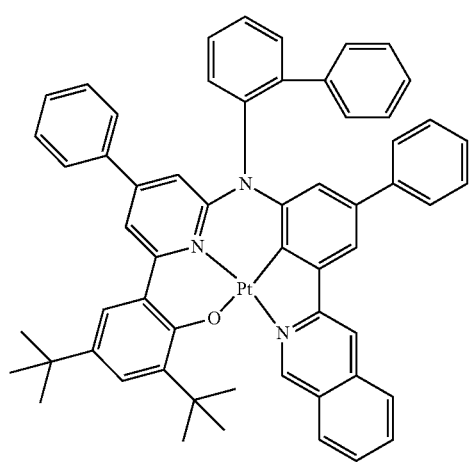
24
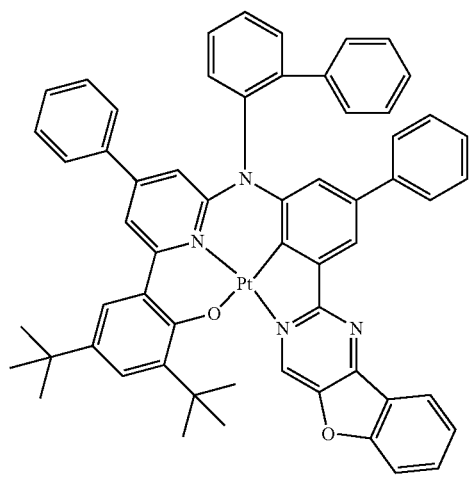
25
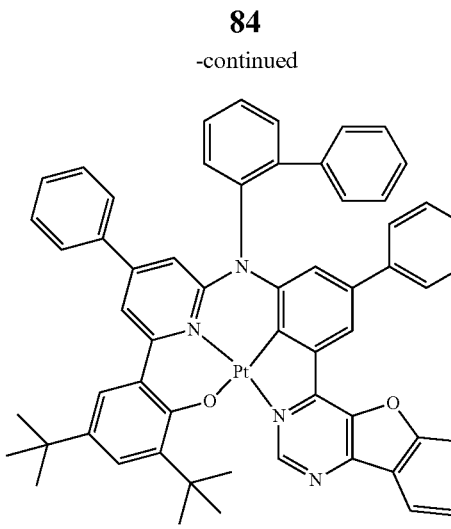
26
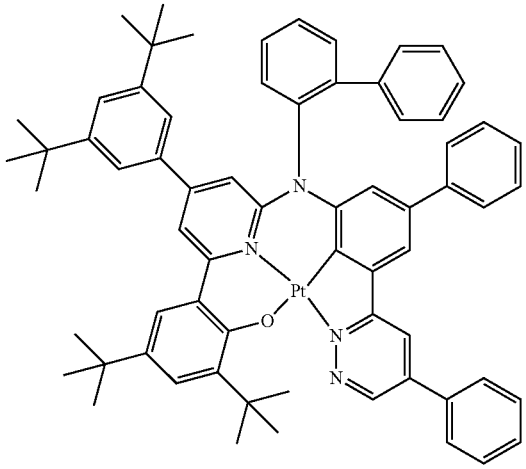
27
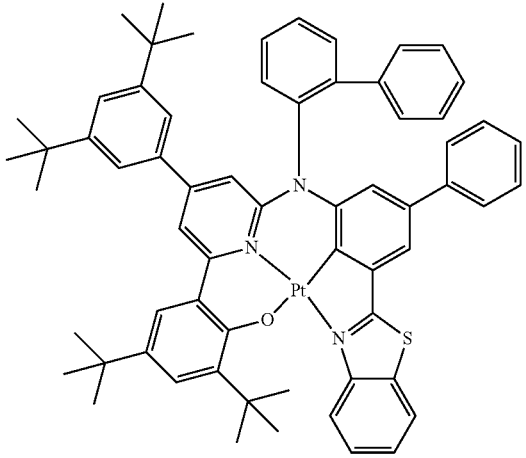

-continued

28

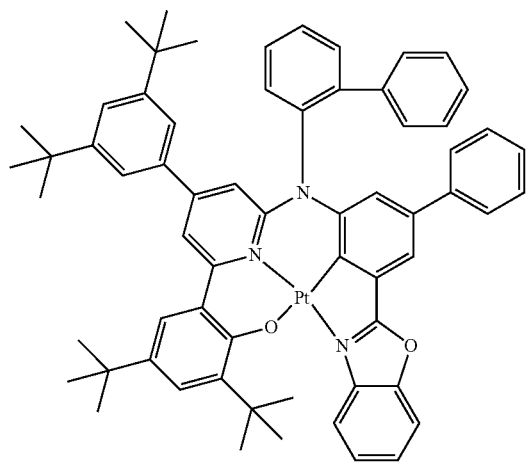

29

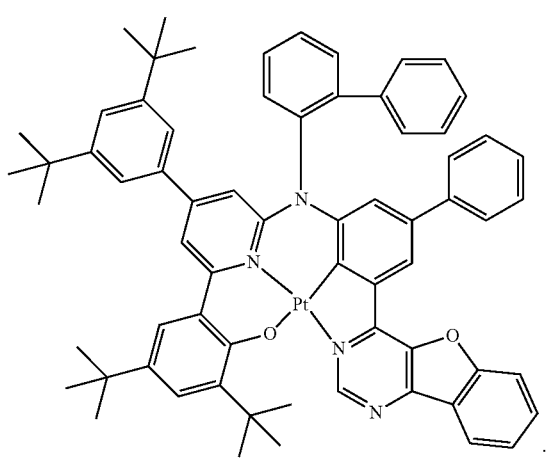

$T_2$ in Formula 1 may be selected from a double bond, *—N[(L$_{63}$)$_{a63}$-(R$_{63}$)]—*', *—B(R$_{63}$)—*', *—P(R$_{63}$)—*', *—Si(R$_{63}$)(R$_{64}$)—*', *—Ge(R$_{63}$)(R$_{64}$)—*', *—S—*', *—Se—*', *—O—*', *—C(=O)—*', *—S(=O)—*', *—S(=O)$_2$—*', *—C(R$_{63}$)=*', *=C(R$_{63}$)—*', *—C(R$_{63}$)=C(R$_{64}$)—*', *—C(=S)—*', and *—C≡C—*'. That is, $T_2$ is neither a single bond nor *—C(R$_{63}$)(R$_{64}$)—*'.

Hereinafter, the organometallic compound represented by Formula 1 will be described with reference to Tables 1 and 2. Data by item in Tables 1 and 2 were evaluated with respect to each Compound by using a DTF method of Gaussian program (structurally optimized at a level of B3LYP, 6-31G (d,p)).

TABLE 1

| | |
|---|---|
| Angle (°) between N-Pt-N in Compound A | 80.66 |
| Angle (°) between N-Pt-C in Compound 1 (Corresponding to angle between X$_2$-M-X$_3$ in Formula 1) | 94.03 |

TABLE 2

| Compound No. | HOMO (eV) | LUMO (eV) | T$_1$ (eV) | S$_1$ (eV) | S$_1$-T$_1$ (eV) | Oscillation strength |
|---|---|---|---|---|---|---|
| 1 | −4.56 | −1.63 | 2.17 | 2.38 | 0.20 | 0.036 |
| B | −4.82 | −1.67 | 2.39 | 2.59 | 0.21 | 0.0277 |

TABLE 2-continued

| Compound No. | HOMO (eV) | LUMO (eV) | T$_1$ (eV) | S$_1$ (eV) | S$_1$-T$_1$ (eV) | Oscillation strength |
|---|---|---|---|---|---|---|
| C | −4.74 | −1.65 | 2.28 | 2.52 | 0.23 | 0.0181 |
| D | −4.82 | −1.71 | 2.13 | 2.47 | 0.34 | 0.0229 |
| E | −4.91 | −1.64 | 2.33 | 2.56 | 0.23 | 0.025 |

The structures of Compounds shown in Tables 1 and 2 are as follows:

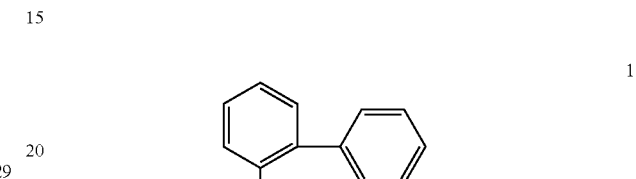

1

A

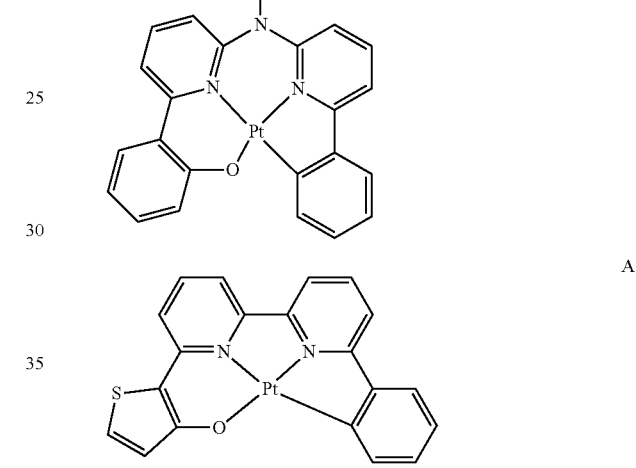

B

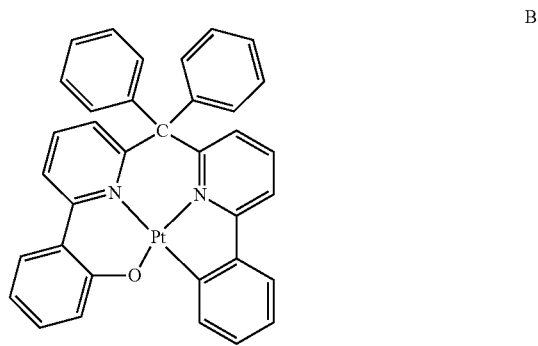

C

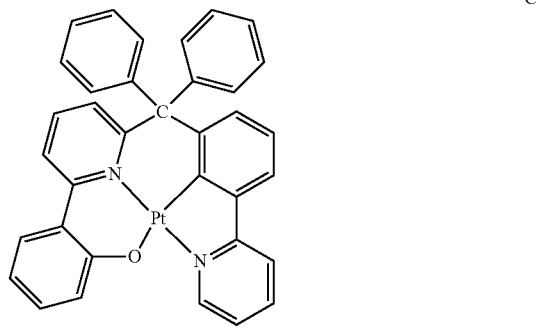

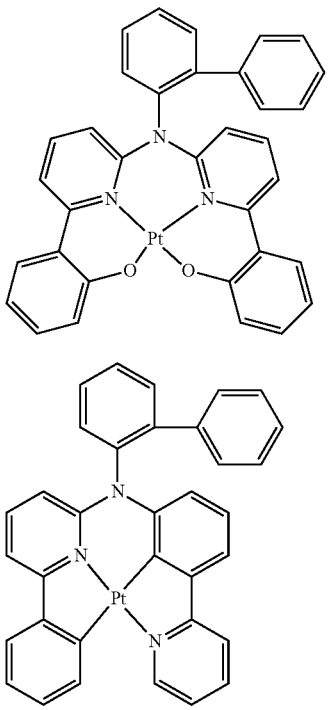

$T_2$ in Formula 1 may be selected from a double bond, *—N[(L$_{63}$)$_{a63}$-(R$_{63}$)]—*', *—B(R$_{63}$)—*', *—P(R$_{63}$)—*', *—Si(R$_{63}$)(R$_{64}$)—*', *—Ge(R$_{63}$)(R$_{64}$)—*', *—S—*', *—Se—*', *—O—*', *—C(=O)—*', *—S(=O)—*', *—S(=O)$_2$—*', *—C(R$_{63}$)=*', *=C(R$_{63}$)—*', *—C(R$_{63}$)=C(R$_{64}$)—*', *—C(=S)—*', and *—C≡C—*'. That is, $T_2$ is neither a single bond nor *—C(R$_{63}$)(R$_{64}$)—*'.

As described above, since $T_2$ in Formula 1 is not a single bond, an angle between $X_2$-M-$X_3$ in Formula 1 is maintained at an angle, for example, 90° or more, at which the organometallic compound has a planar four-coordinate structure at which the structural stability thereof is maintained. Thus, the organometallic compound represented by Formula 1 may have an excellent structural stability. Although not limited to a specific theory, an angle between N—Pt—N of Compound A corresponding to a compound in which $T_2$ in Formula 1 is a single bond is merely 80.66°, and thus, two pyridine rings in Compound A are twisted. Thus, Compound A may have a structural instability. However, since an angle between N—Pt—C of Compound 1 belonging to Formula 1 (that is, an angle between $X_2$-M-$X_3$ in Formula 1) is 94.03°, Compound 1 may have a four-coordinate structure in which the structural stability thereof is maintained (see Table 1). Therefore, an electronic device, for example, an organic light-emitting device, which includes the organometallic compound represented by Formula 1, may have a long lifespan.

Also, since i) $T_2$ in Formula 1 is not *—C(R$_{63}$)(R$_{64}$)—*', and ii) Formula 1 includes $X_5$ defined herein and has an asymmetric structure in which M and $X_4$ in Formula 1 are directly connected to each other, the organometallic compound may have a relatively high oscillation strength and a relatively small difference between $S_1$ and $T_1$. Although not limited to a specific theory, Compounds B and C corresponding to a compound in which $T_2$ in Formula 1 is *—C(R$_{63}$)(R$_{64}$)—*' may have a weak oscillation strength because of ineffective electron transition caused by a non-conjugated structure of $SP_3$ carbon, and Compounds D and E having a symmetrical structure unlike the asymmetric structure of Formula 1 may have a weak oscillation strength because of the symmetrical structure of Compounds D and E (see Table 2). Furthermore, Compound D having the symmetrical structure unlike the asymmetric structure of Formula 1 may have a relatively large difference between Si and $T_1$ because of the symmetrical structure of Compound D (see Table 2). Therefore, the organometallic compound represented by Formula 1 may have a relatively short decay time, and thus, an electronic device, for example, an organic light-emitting device, which has the organometallic compound, may have high luminescent efficiency, high external quantum efficiency, and the like.

For example, the highest occupied molecular orbital (HOMO), lowest unoccupied molecular orbital (LUMO), energy gap, Si energy level, and $T_1$ energy level of Compounds 14 to 29 were evaluated by using a DTF method of Gaussian program (structurally optimized at a level of B3LYP, 6-31G(d,p)), and results thereof are shown in Table 3.

TABLE 3

| Compound No. | HOMO (eV) | LUMO (eV) | Energy gap (eV) | $S_1$ (eV) | $T_1$ (eV) |
|---|---|---|---|---|---|
| 14 | −4.6121 | −1.6458 | 2.9663 | 2.3558 | 2.1754 |
| 15 | −4.6181 | −1.7693 | 2.8488 | 2.3061 | 2.1618 |
| 16 | −4.4502 | −1.6866 | 2.7636 | 2.2278 | 2.0217 |
| 17 | −4.4409 | −1.8319 | 2.609 | 2.1078 | 1.956 |
| 18 | −4.5868 | −1.7426 | 2.8442 | 2.3244 | 2.1901 |
| 19 | −4.4156 | −1.8071 | 2.6085 | 2.1073 | 1.9632 |
| 20 | −4.8194 | −1.76 | 3.0594 | 2.467 | 2.2055 |
| 21 | −4.651 | −1.8602 | 2.7908 | 2.2809 | 2.0599 |
| 22 | −4.526 | −1.871 | 2.655 | 2.131 | 1.826 |
| 23 | −4.449 | −1.818 | 2.631 | 2.113 | 2.02 |
| 24 | −4.503 | −2.105 | 2.397 | 1.896 | 1.843 |
| 25 | −4.51 | −2.257 | 2.253 | 1.788 | 1.657 |
| 26 | −4.299 | −2.184 | 2.115 | 1.622 | 1.52 |
| 27 | −4.519 | −1.927 | 2.593 | 2.072 | 1.905 |
| 28 | −4.507 | −1.788 | 2.718 | 2.194 | 1.981 |
| 29 | −4.483 | −2.233 | 2.25 | 1.786 | 1.653 |

From Table 1, it is confirmed that the organometallic compound represented by Formula 1 has such electric characteristics that are suitable for use in an electronic device, for example, for use as a dopant for an organic light-emitting device.

Synthesis methods of the organometallic compound represented by Formula 1 may be understood by those of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode, wherein the organic layer includes an emission layer and at least one of the organometallic compounds represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound represented by Formula 1 may be used between a pair of electrodes of the organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 may both be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, a buffer layer, or any combination thereof, and wherein the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode.

The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

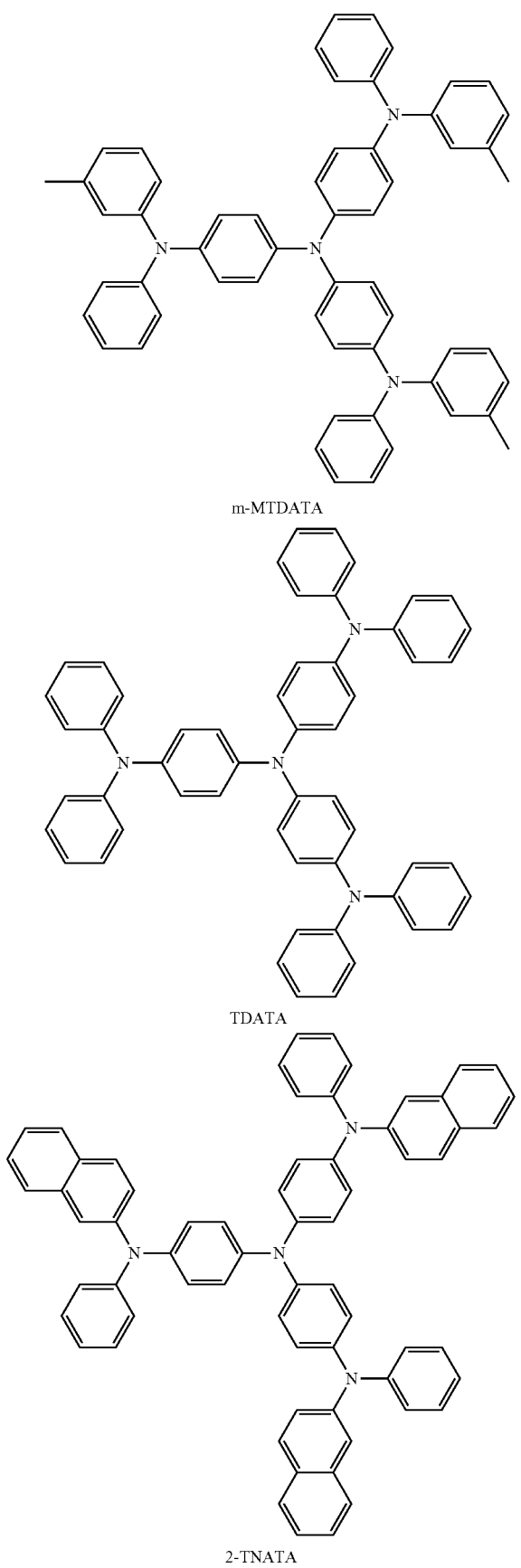
m-MTDATA
TDATA
2-TNATA
-continued
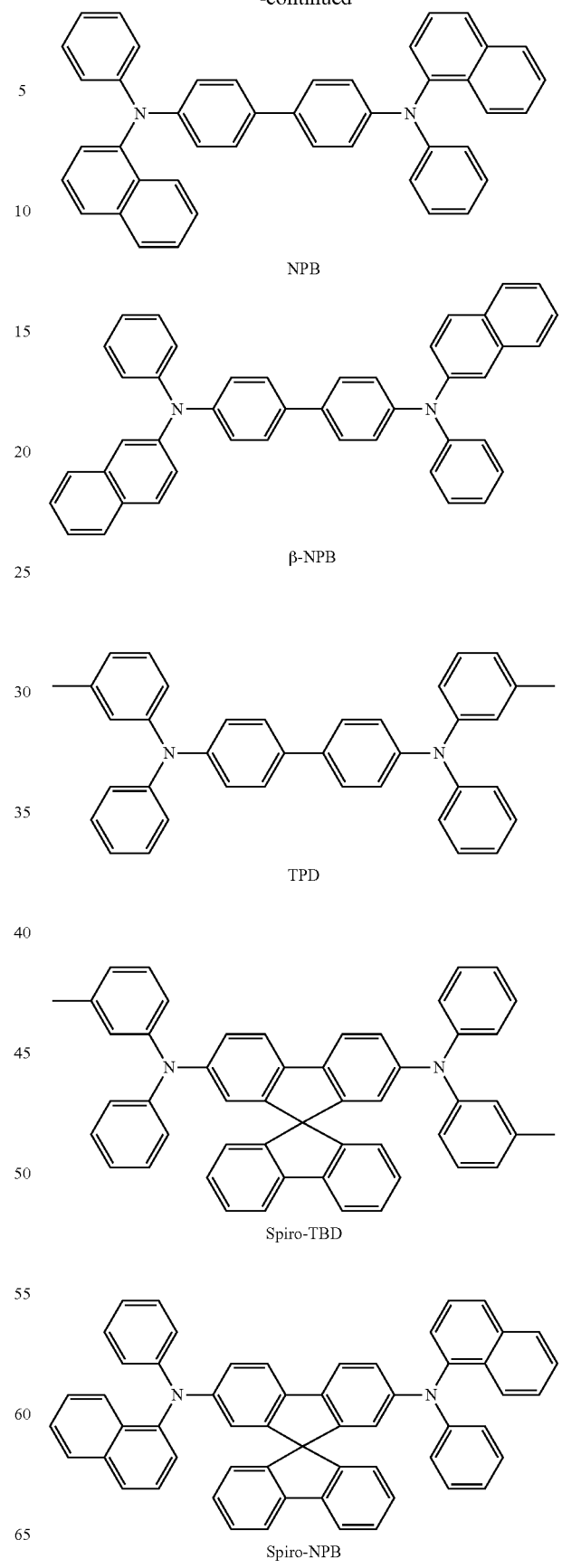
NPB
β-NPB
TPD
Spiro-TBD
Spiro-NPB -continued

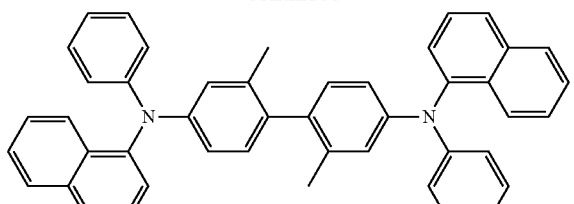

methylated NPB

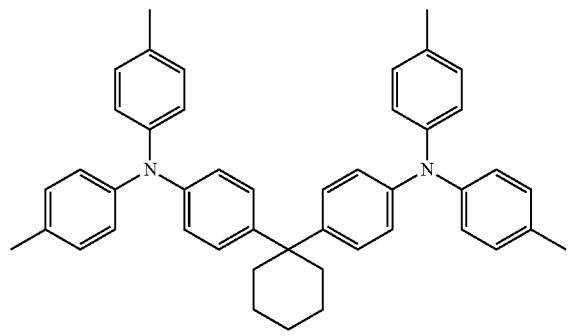

TAPC

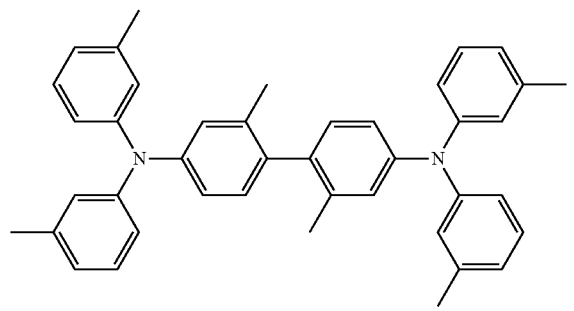

HMTPD

Formula 201

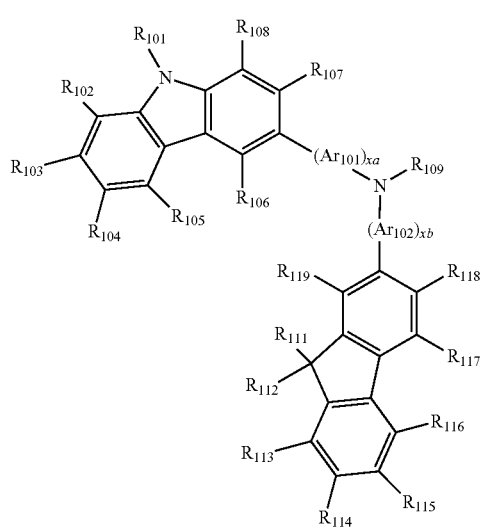

-continued

Formula 202

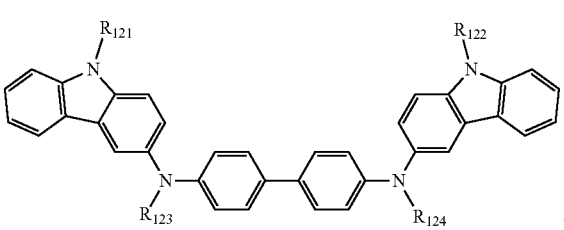

$Ar_{101}$ and $Ar_{102}$ in Formula 201 may each independently be selected from: a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_1$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

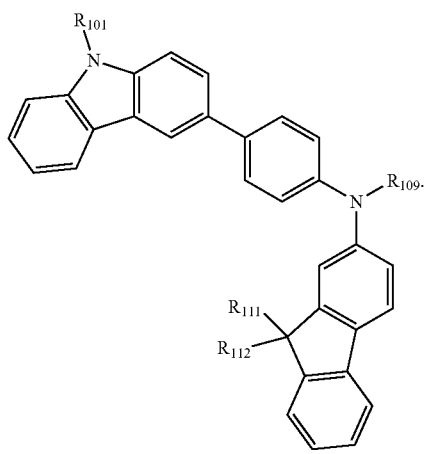

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

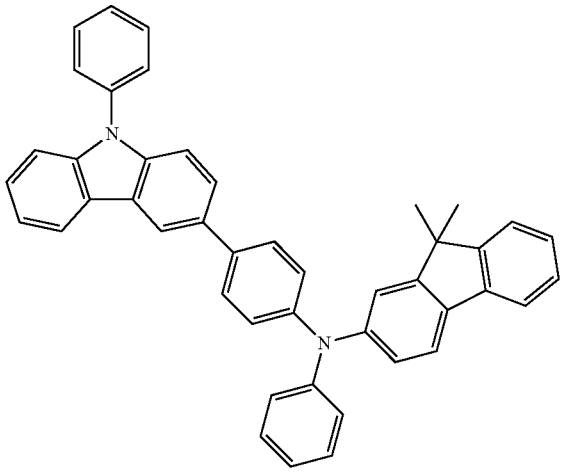

HT1

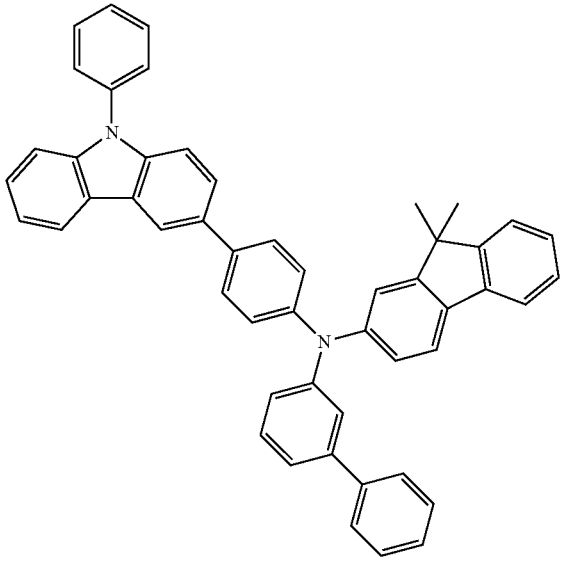

HT2

HT3
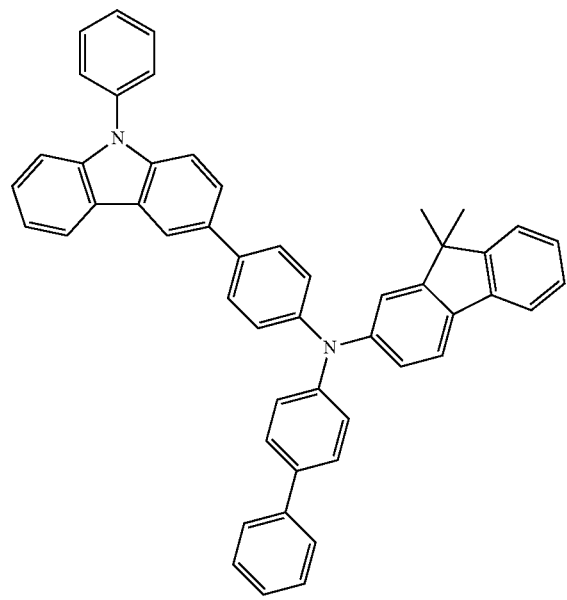
HT5
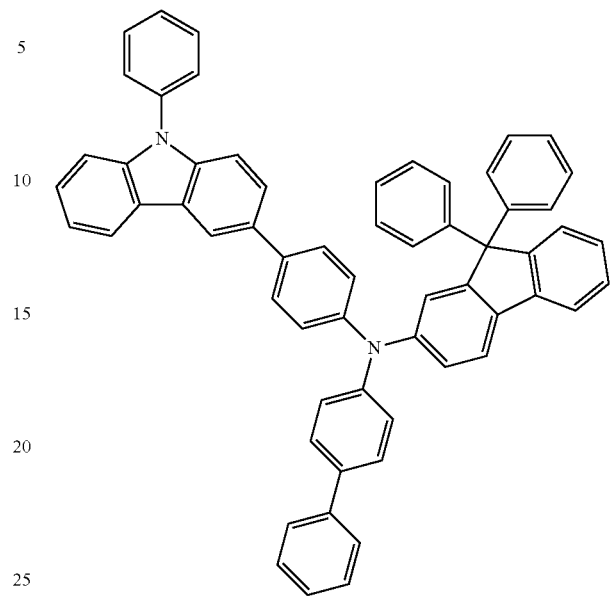
HT4
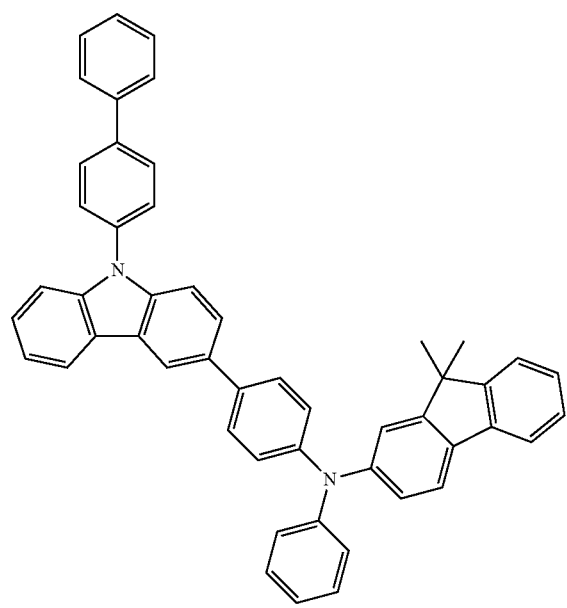
HT6
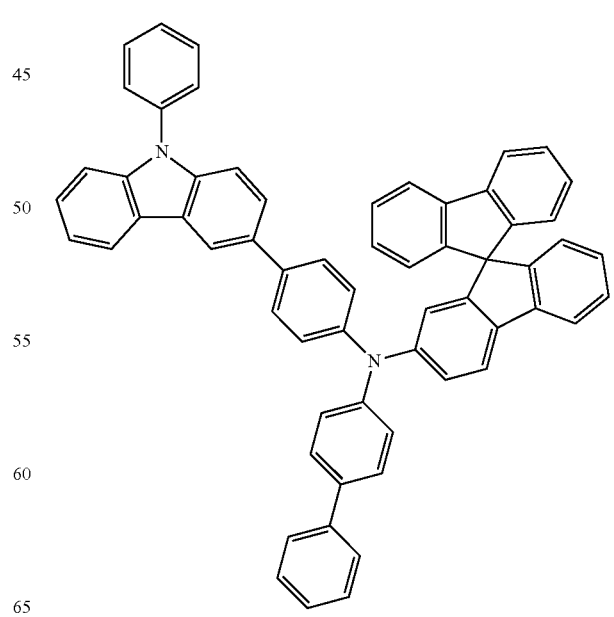

HT7
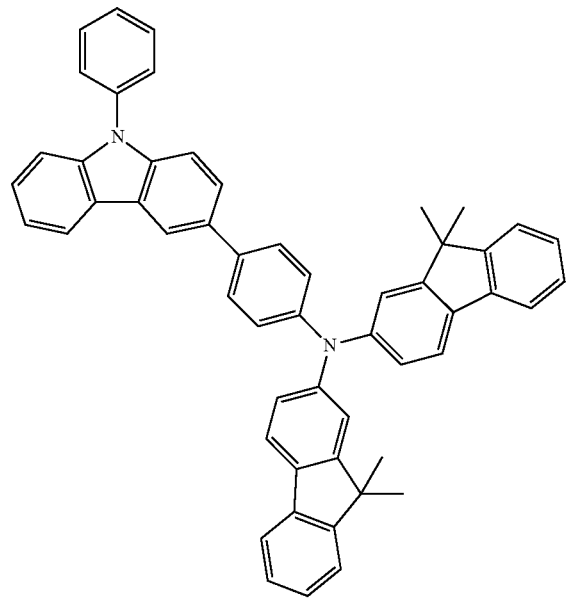
HT10
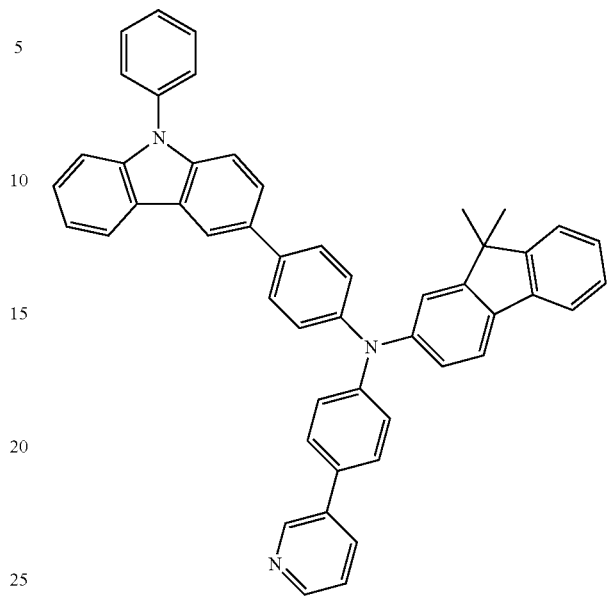
HT8
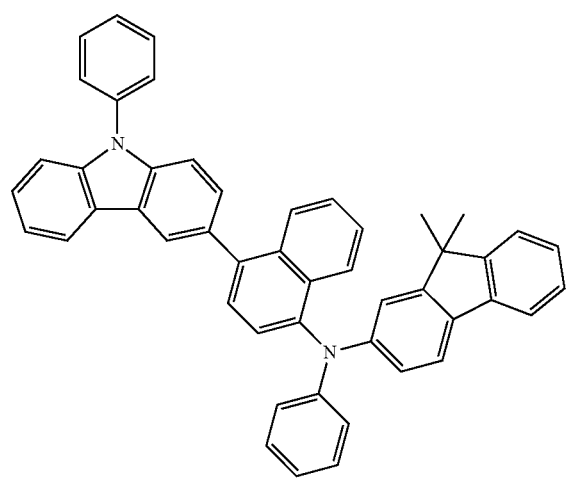
HT9
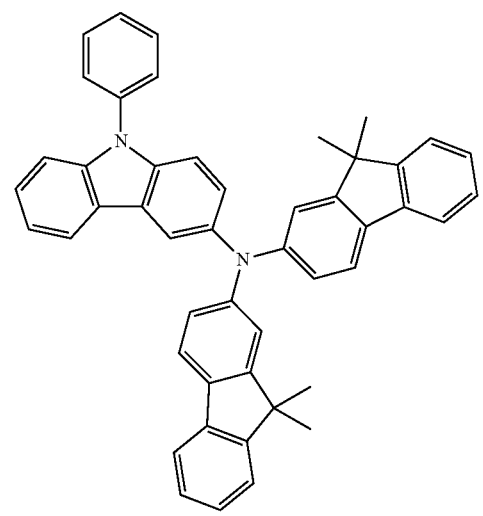
HT11
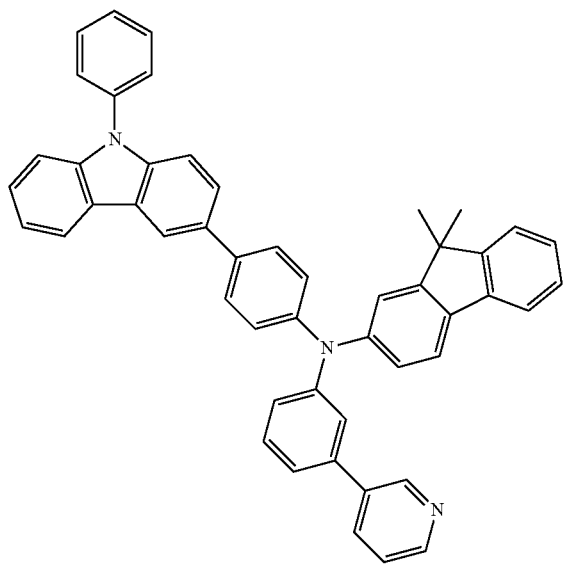

HT12
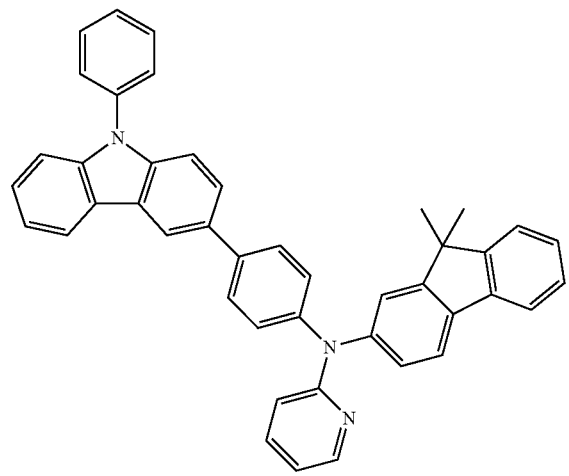
HT13
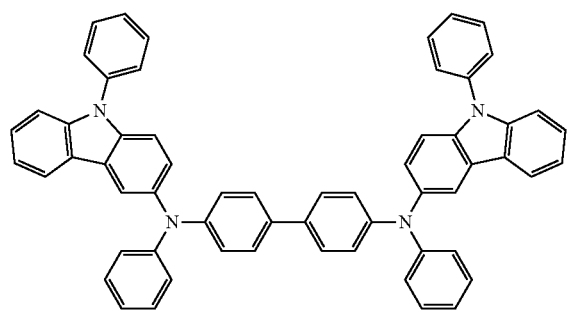
HT14
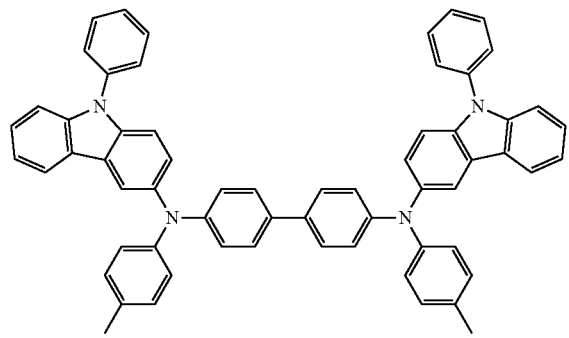
HT15
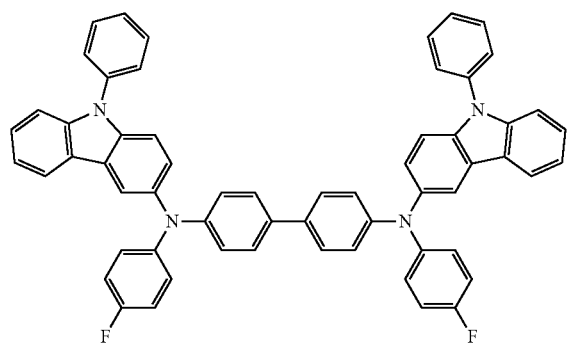
HT16
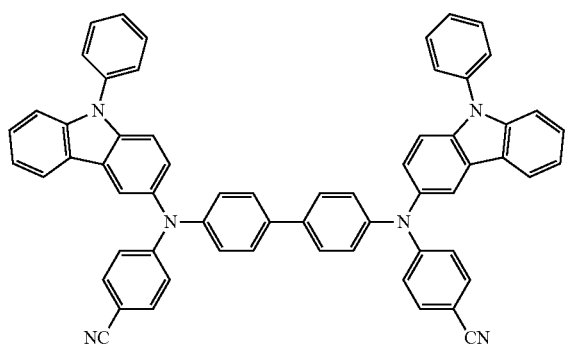
HT17
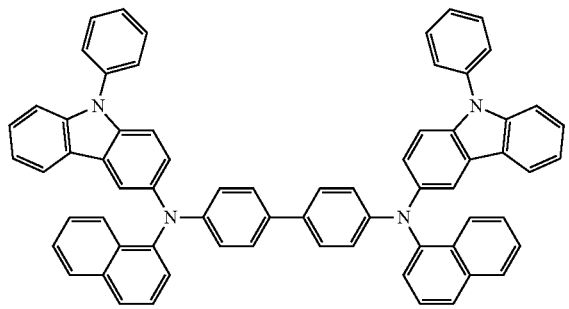
HT18
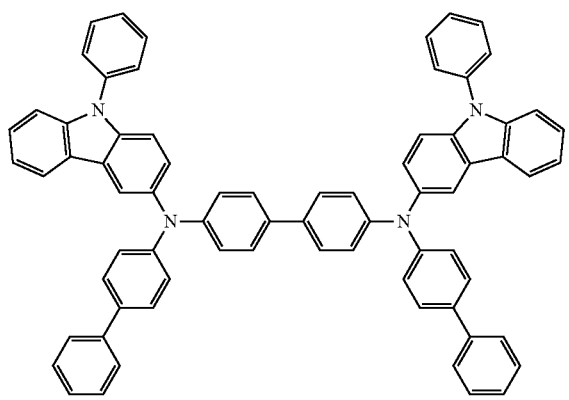
HT19
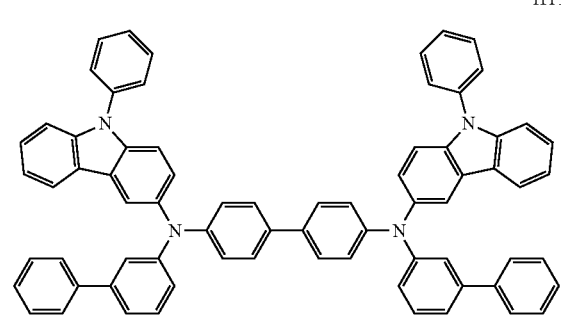

HT20

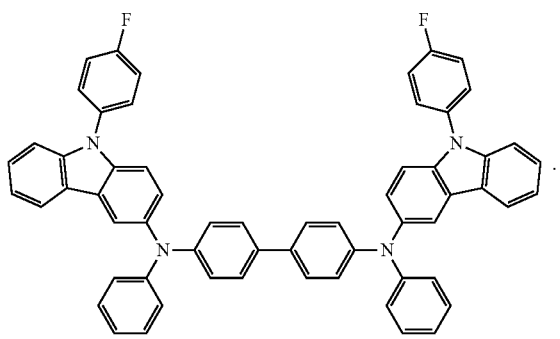

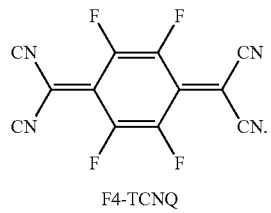

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later.

However, the material for the electron blocking layer is not limited thereto. For example, when the hole transport region includes an electron blocking layer, a material for the electron blocking layer may be mCP, which will be explained later.

The hole transport region may further include, in addition to these materials, a charge-generation material for the improvement of conductive properties. The charge-generation material may be homogeneously or non-homogeneously dispersed in the hole transport region.

The emission layer may include a host and a dopant, and the dopant may include the organometallic compound represented by Formula 1 or a composition including the organometallic compound represented by Formula 1.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto:

The host may include at least one selected from TPBi, TBADN, ADN (also referred to as "DNA"), CBP, CDBP, TCP, mCP, Compound H50, Compound H51, and Compound H52:

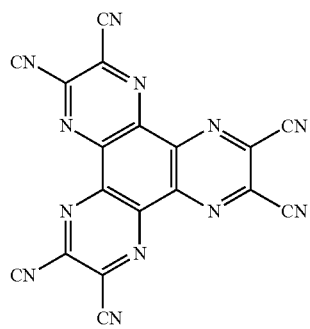

HT-D1

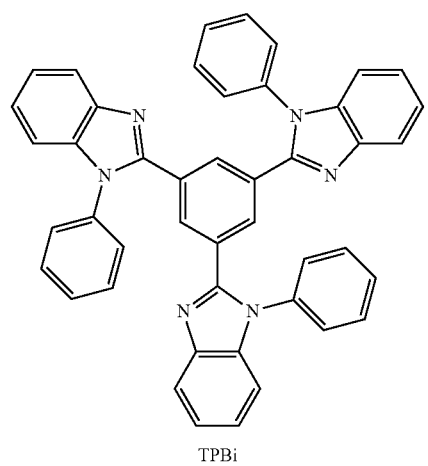

TPBi

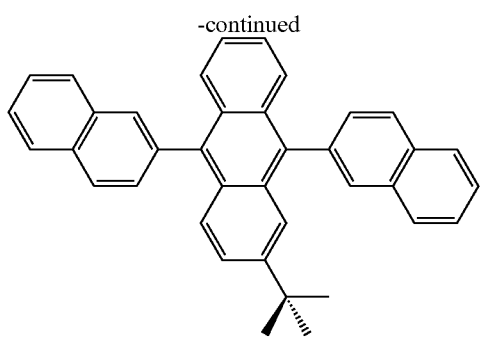

TBADN

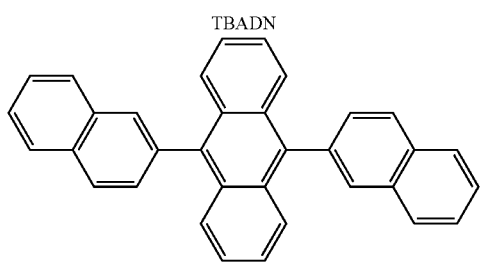

ADN

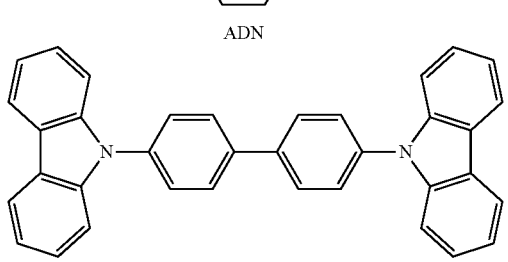

CBP

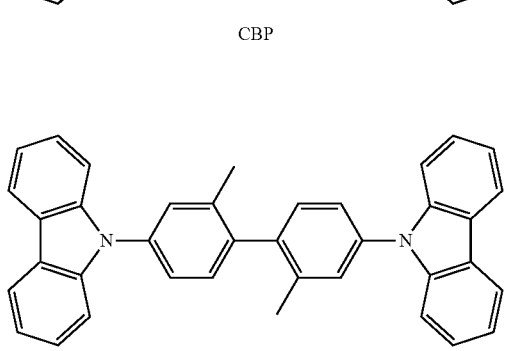

CDBP

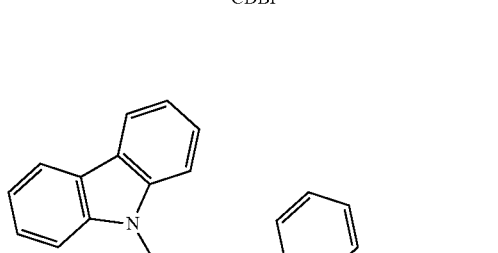

TCP

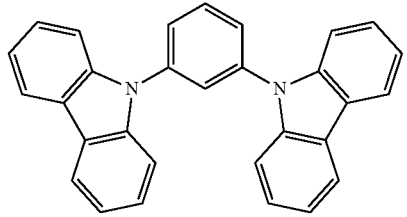

mCP

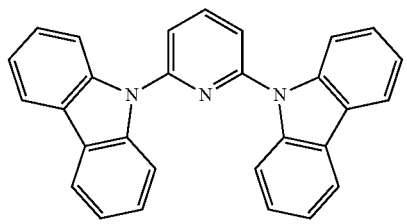

H50

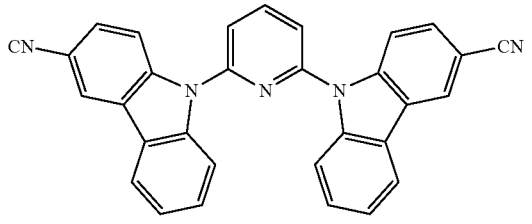

H51

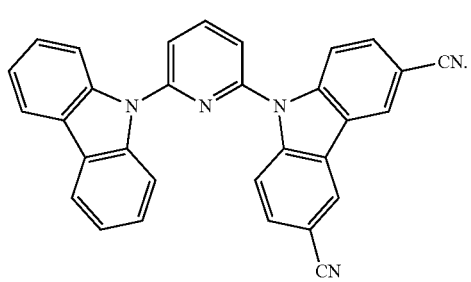

H52

In one or more embodiments, the host may further include a compound represented by Formula 301 below:

Formula 301

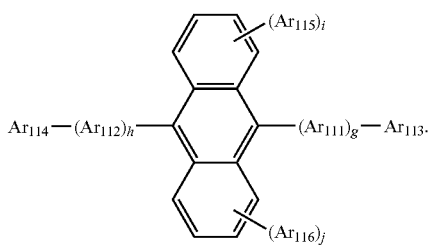

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ to $Ar_{116}$ in Formula 301 may each independently be selected from: a $C_1$-$C_{10}$ alkyl group, substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

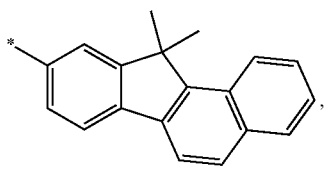 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

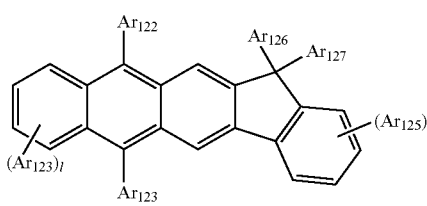

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

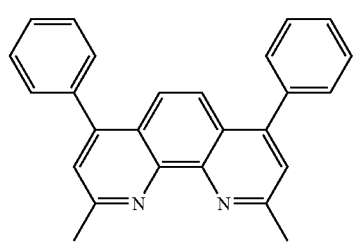

BCP

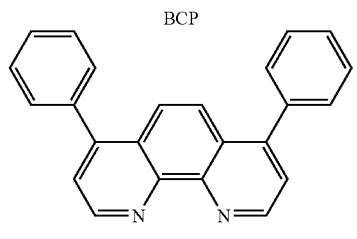

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may include at least one selected from BCP, Bphen, $Alq_3$, BAlq, TAZ, and NTAZ:

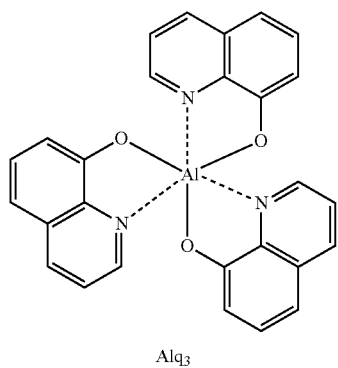
Alq₃
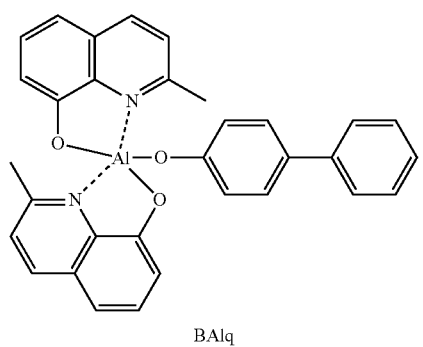
BAlq
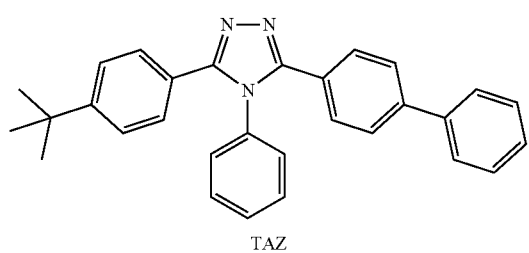
TAZ
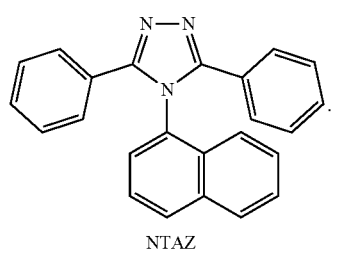
NTAZ
In one or more embodiments, the electron transport layer may include at least one of ET1 and ET25, but are not limited thereto:
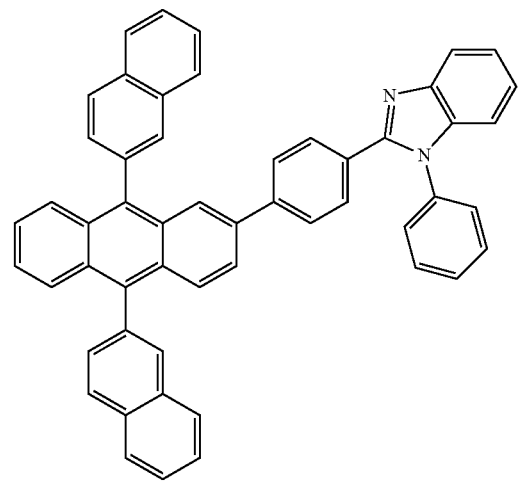
ET1
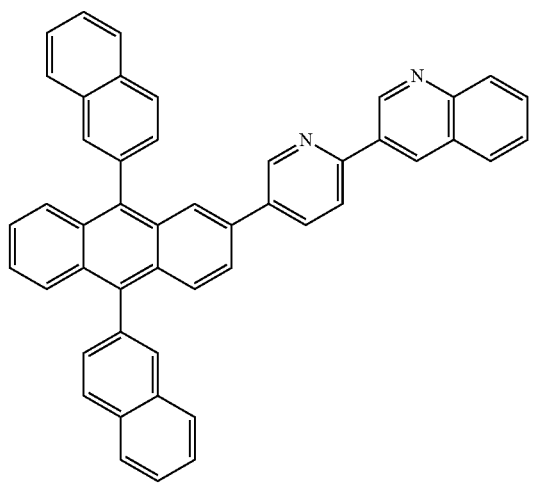
ET2
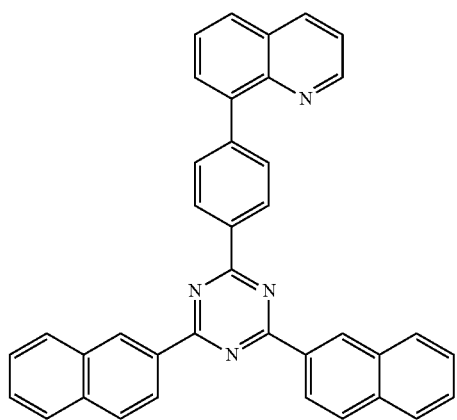
ET3

-continued
ET4
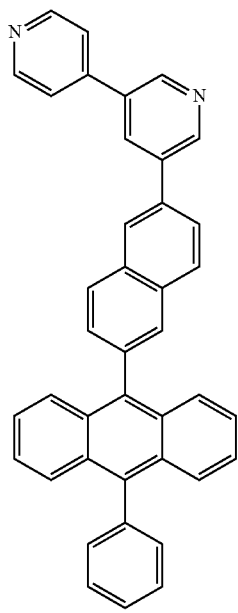
ET5
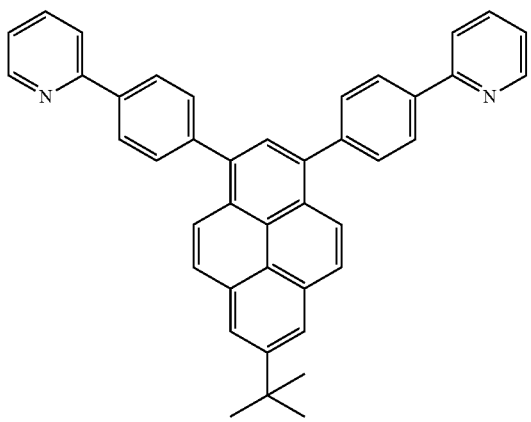
ET6
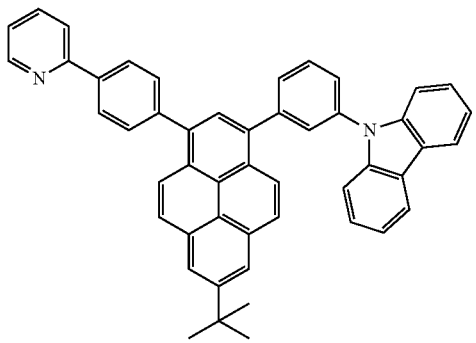
-continued
ET7
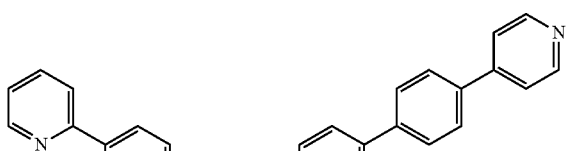
ET8
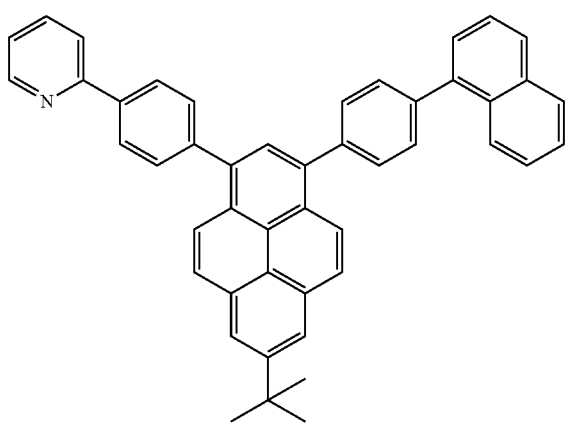
ET9
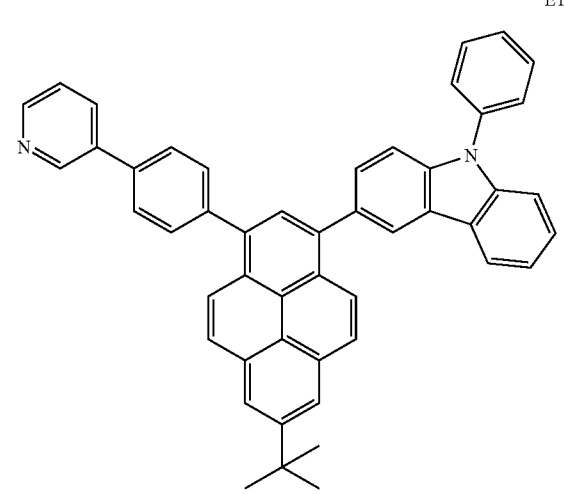

ET10
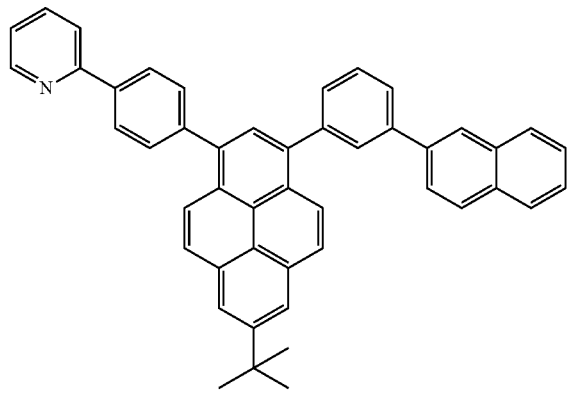
ET11
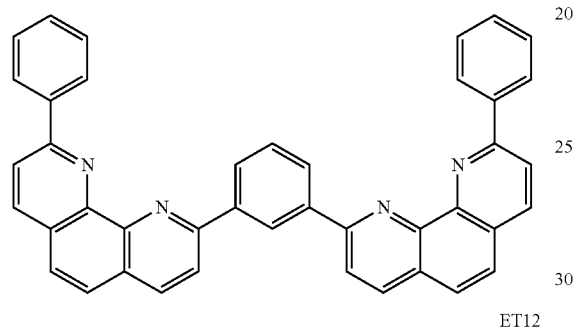
ET12
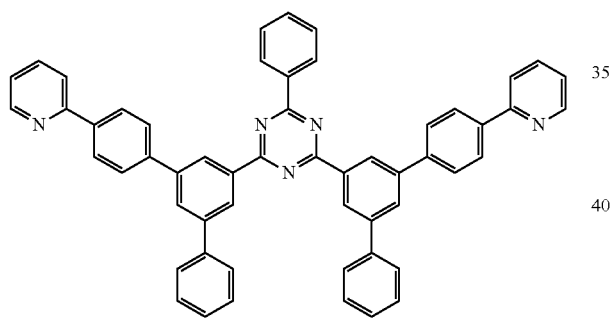
ET13
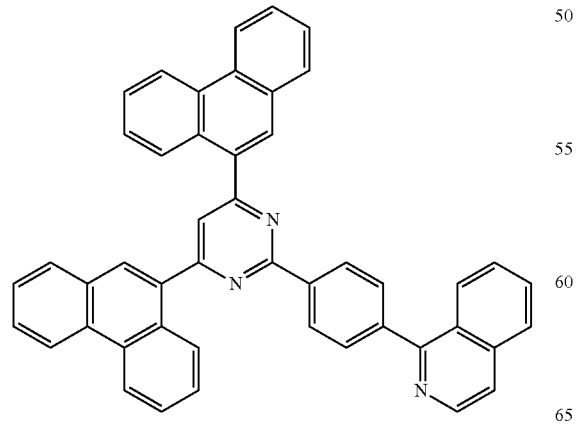
ET14
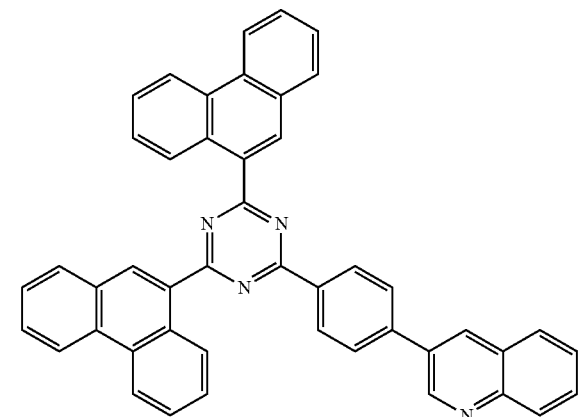
ET15
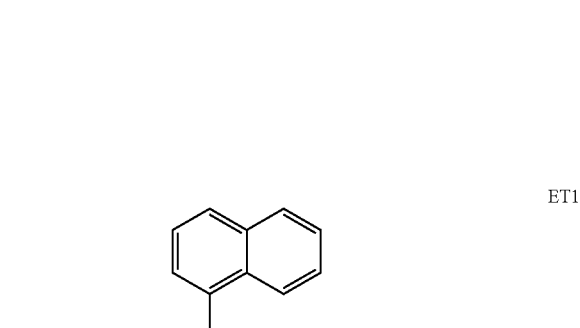
ET16
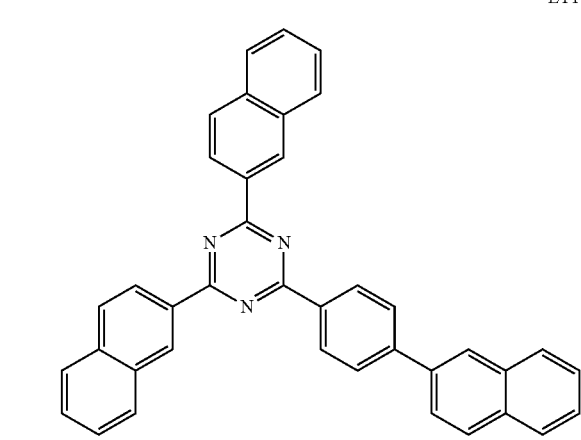

ET17
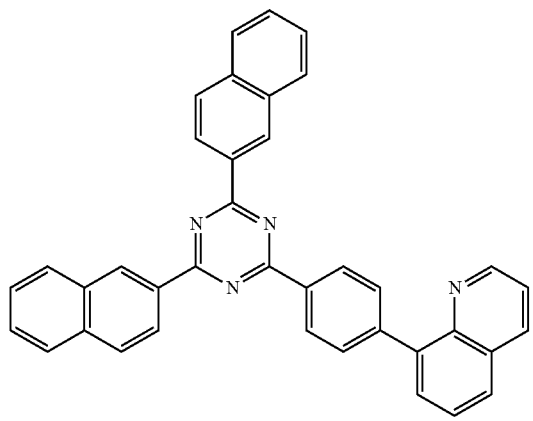
ET18
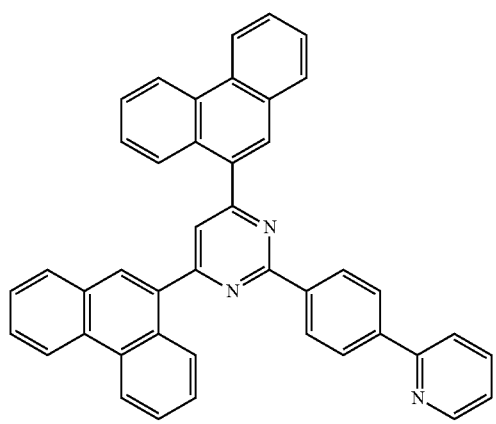
ET19
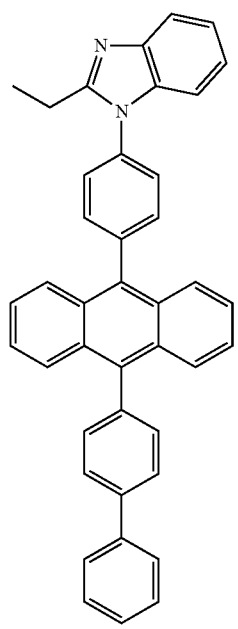
ET20
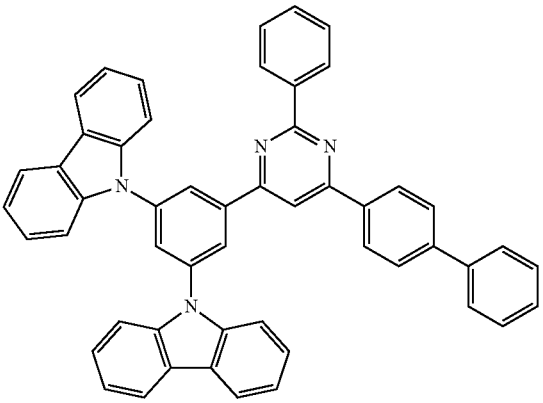
ET21
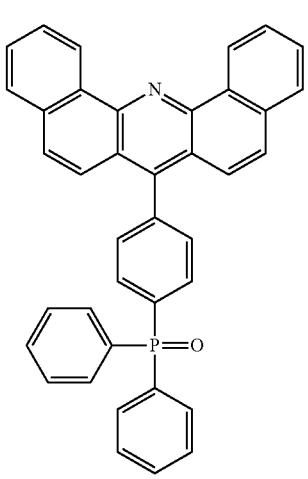
ET22
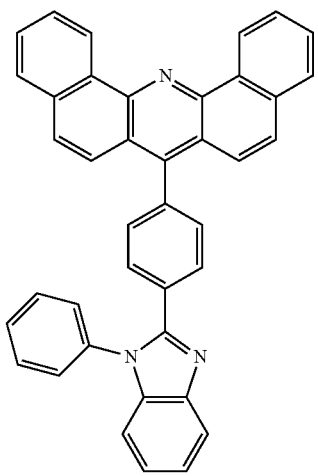

ET23

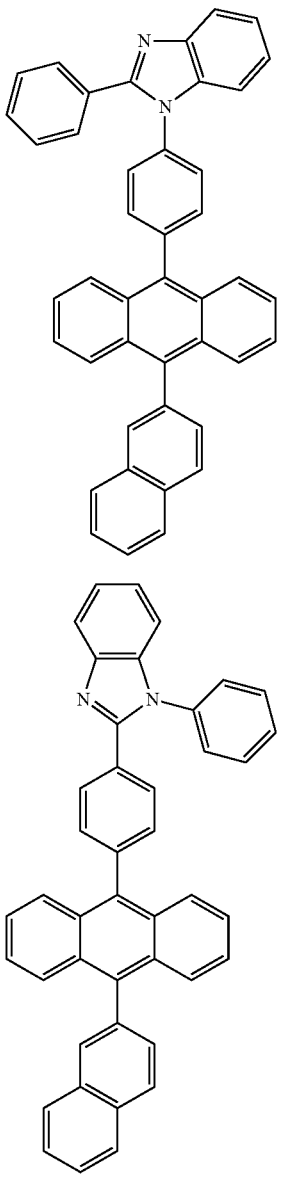

ET24

ET25

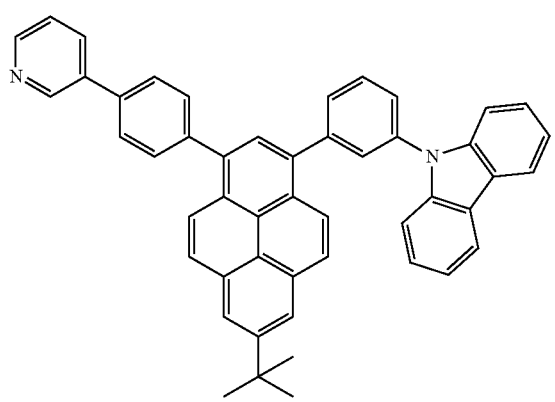

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2:

ET-D1

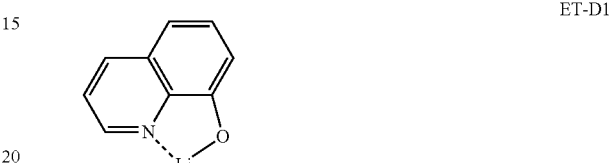

ET-D2

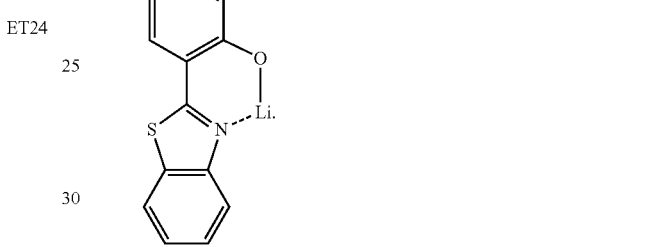

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms. Non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group). Non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group. Examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms. Non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si, and S as a ring-forming atom and 1 to 10 carbon atoms. Non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic hydrocarbon group that has 3 to 10 carbon atoms having at least one carbon-carbon double bond in the ring thereof, and having no aromaticity. Non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other. The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, Si, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other. The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), the term a "$C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{104}$ is the $C_6$-$C_{59}$ aryl group and $A_{105}$ is the $C_1$-$C_{53}$ alkyl group).

The term "$C_1$-$C_{60}$ heteroaryloxy group" as used herein refers to —$OA_{106}$ (wherein $A_{106}$ is the $C_1$-$C_{60}$ heteroaryl group), and the term "$C_1$-$C_{60}$ heteroarylthio group" as used herein indicates —$SA_{107}$ (wherein $A_{107}$ is the $C_1$-$C_{60}$ heteroaryl group).

The term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{58}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and having no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may be selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Examples and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 19

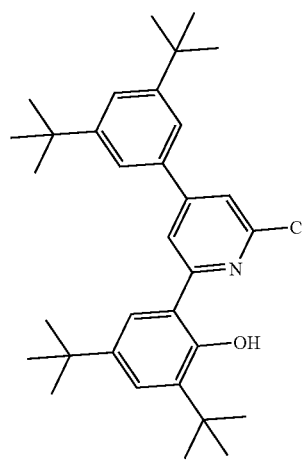

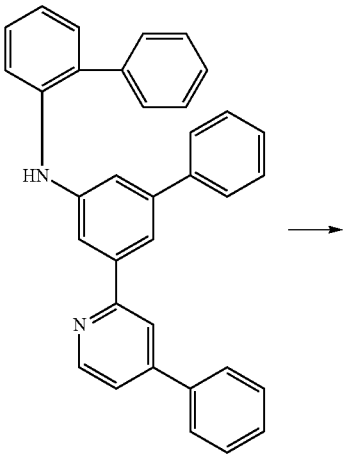

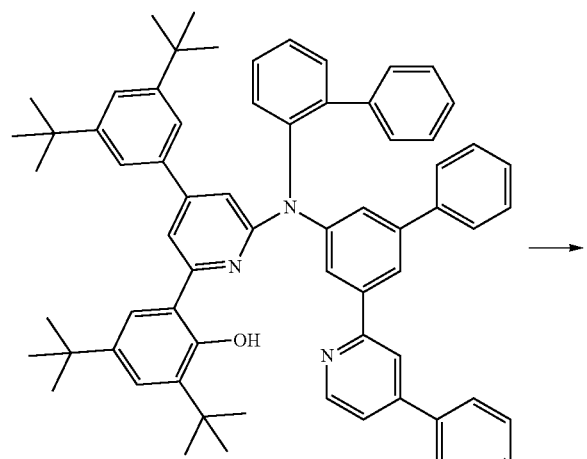

19-1

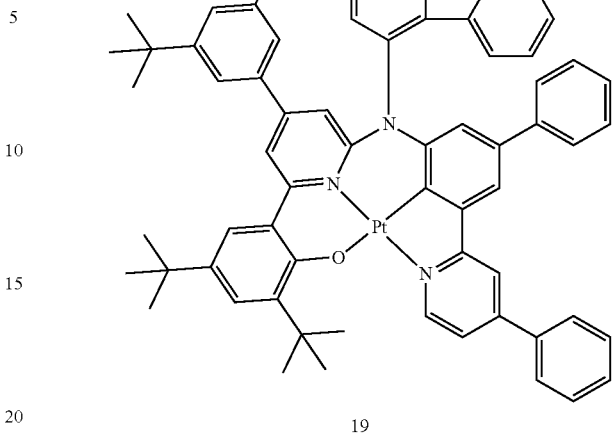

19

Synthesis of Intermediate 19-1

1.20 grams (g) (2.37 millimoles (mmol)) of 2,4-di-tert-butyl-6-(6-chloro-4-(3,5-di-tert-butylphenyl)pyridin-2-yl)phenol and 45 milliliters (ml) of toluene were mixed, and 1.12 g (2.37 mmol) of N-(5-(4-phenylpyridin-2-yl)-[1,1'-biphenyl]-3-yl)-[1,1'-biphenyl]-2-amine, 0.068 g (0.12 mmol) of Pd(dba)$_2$, 0.683 g (7.11 mmol) of NatOBu, and 0.097 g (0.24 mmol) of SPhos were added thereto. The mixture was heated under reflux at a temperature of 110° C. for 18 hours. After the reaction was completed, the reaction product was concentrated under reduced pressure, mixed with 50 ml of dichloromethane, and filtered through diatomaceous earth. The organic layer obtained therefrom was dried by using magnesium sulfate, distilled under reduced pressure, and purified by liquid chromatography to obtain 1.43 g (1.51 mmol, yield: 64%) of Intermediate 19-1.

LC-MS m/z=944.54 (M+H)$^+$.

Synthesis of Compound 19

1.05 g (1.11 mmol) of Intermediate 19-1 was mixed with 50 ml of benzonitrile at room temperature, and 0.58 g (1.22 mmol) of PtCl$_2$(NCPh)$_2$ was added thereto. The mixture was heated under reflux for 14 hours. After completion of the reaction had been confirmed by LCMS, the reaction product was concentrated under reduced pressure and purified by liquid chromatography to obtain 0.92 g (0.81 mmol, yield: 73%) of Compound 19. The obtained compound was identified by LCMS and $^1$H-NMR.

LC-MS m/z=1136.49 (M+H)$^+$.

$^1$H NMR (300 MHz, CD$_2$Cl$_2$) δ 9.52 (d, 1H), 8.04 (d, 1H), 7.85 (d, 1H), 7.82 (d, 1H), 7.77-7.71 (m, 3H), 7.63-7.48 (m, 9H), 7.42-7.32 (m, 4H), 7.25-7.10 (m, 8H), 6.94 (d, 1H), 6.39 (d, 1H), 6.34 (d, 1H), 1.64 (s, 9H), 1.33 (s, 27H).

Evaluation Example 1: Evaluation of Photoluminescence (PL) Spectrum and Photoluminescence Quantum Yield (PLQY)

CBP and Compound 19 were co-deposited on a quartz substrate at a weight ratio of 98:2 at a vacuum degree of 10$^{-7}$ torr to manufacture a film having a thickness of 40 nanometers (nm).

A photoluminescence (PL) spectrum of the film was measured while scanning an excitation wavelength at an interval of 10 nm from 320 nm to 380 nm by using a Quantaurus-QY Absolute PL quantum yield spectrometer (manufactured by Hamamatsu), including a xenon light source, a monochromator, a photonic multichannel analyzer, and an integrating sphere, PLQY measurement software (Hamamatsu Photonics, Ltd., Shizuoka, Japan). It was confirmed from a PL spectrum measured at an excitation wavelength of 340 nm that Compound 19 had a maximum emission wavelength of 585 nm, a full width at half maximum (FWHM) of 76.6 nm, and luminescence quantum efficiency of 0.960.

Evaluation Example 2: Measurement of Decay Time

The PL spectrum of the film manufactured according to Evaluation Example 1 was evaluated at room temperature by using a time-resolved photoluminescence (TRPL) measurement system FluoTime 300 (manufactured by PicoQuant) and a pumping source PLS340 (manufactured by Pico-Quant) (excitation wavelength=340 nm, spectral width=20 nm), a wavelength of a main peak of the PL spectrum was determined, and the number of photons emitted from the film at the main peak by a photon pulse (pulse width=500 picoseconds (ps)) applied to each film by PLS340 was measured over time based on Time-Correlated Single Photon Counting (TCSPC). By repeating the above processes, a sufficiently fittable TRPL curve was obtained. Then, a decay time $T_{decay}(Ex)$ of the film was obtained by fitting one or more exponential decay functions to a result obtained from the TPRL curve. It was confirmed that the decay time of Compound 19 was 2.333 micrometers (μm). A function represented by Equation 10 was used for the fitting, and a greatest value among $T_{decay}$ values obtained from the exponential decay functions used for the fitting was taken as $T_{decay}(Ex)$. At this time, the same measurement was performed once more for the same measurement time as that for calculating the TRPL curve in a dark state (a state in which the pumping signal input to the film was blocked) to obtain a baseline or background signal curve. The baseline or background curve was used as a baseline for fitting.

$$f(t) = \sum_{i=1}^{n} A_i \exp(-t/T_{decay,i})$$ Equation 10

Example 1

As an anode, a glass substrate, on which ITO/Ag/ITO were respectively deposited to thicknesses of 70 Å/1,000 Å/70 Å, was cut to a size of 50 mm×50 mm×0.5 mm (mm=millimeters), sonicated with iso-propyl alcohol and pure water, 5 minutes in each solvent, and then cleaned by exposure to ultraviolet rays and ozone for 30 minutes. Then, the glass substrate was provided to a vacuum deposition apparatus.

2-TNATA was deposited on the anode to form a hole injection layer having a thickness of 600 Å, and 4,4'-bis[N-(1-naphthyl)-N-phenylamino]biphenyl (NPB) was deposited on the hole injection layer to form a hole transport layer having a thickness of 1,350 Å.

CBP (host) and Compound 19 (dopant) were co-deposited on the hole transport layer at a weight ratio of 98:2 to form an emission layer having a thickness of 400 Å, and BCP was deposited on the emission layer to form a hole blocking layer having a thickness of 50 Å. Then, $Alq_3$ was deposited on the hole blocking layer to form an electron transport layer having a thickness of 350 Å, LiF was deposited on the electron transport layer to form an electron injection layer having a thickness of 10 Å, and MgAg was deposited on the electron injection layer at a weight ratio of 90:10 to form a cathode having a thickness of 120 Å, thereby completing the manufacture of an organic light-emitting device having a structure of ITO/Ag/ITO/2-TNATA (600 Å)/NPB (1,350 Å) /CBP+Compound 19 (2 wt %) (400 Å)/BCP (50 Å)/$Alq_3$ (350 Å)/LiF(10 Å)/MgAg (120 Å).

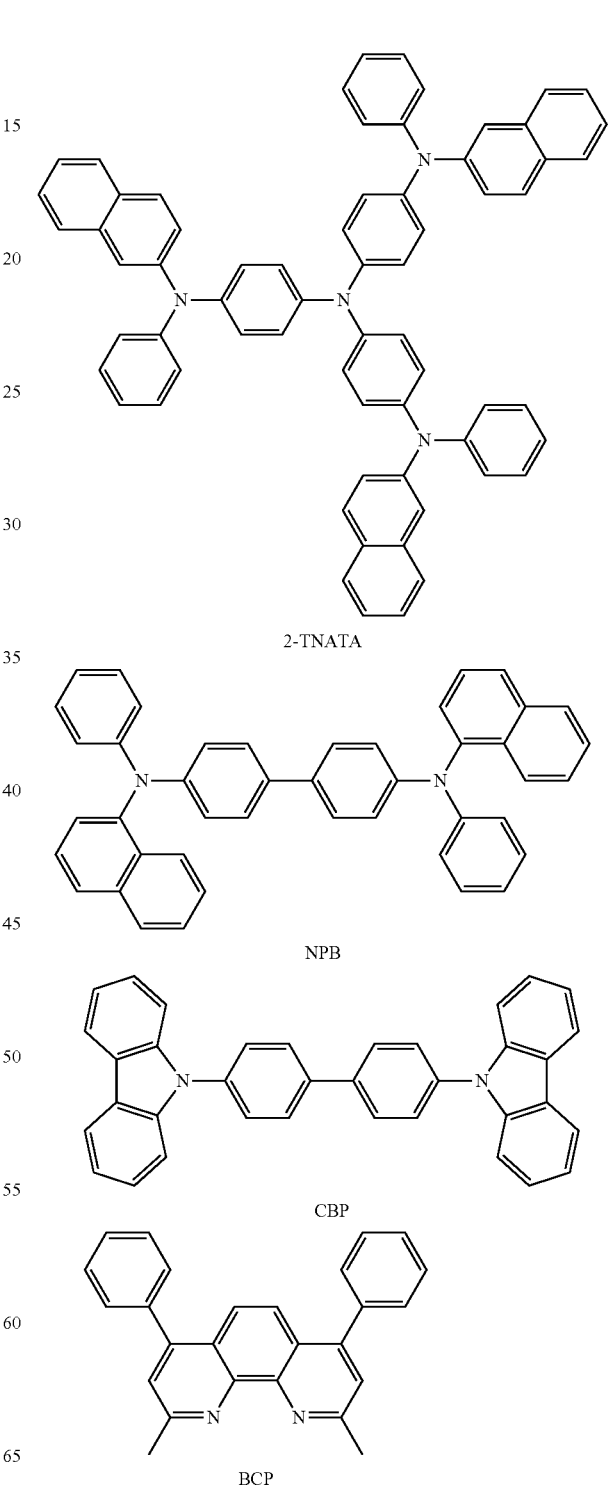

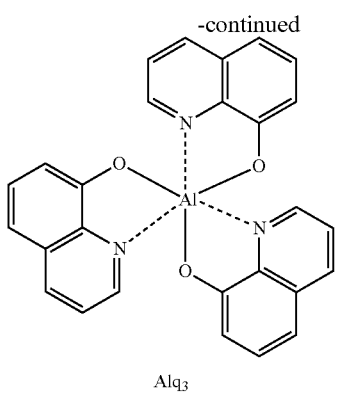

Alq₃

Comparative Example 1

An organic light-emitting device was manufactured in the same manner as in Example 1, except that Compound shown in Table 4 was used instead of Compound 19 as a dopant in forming an emission layer

Figure 2:
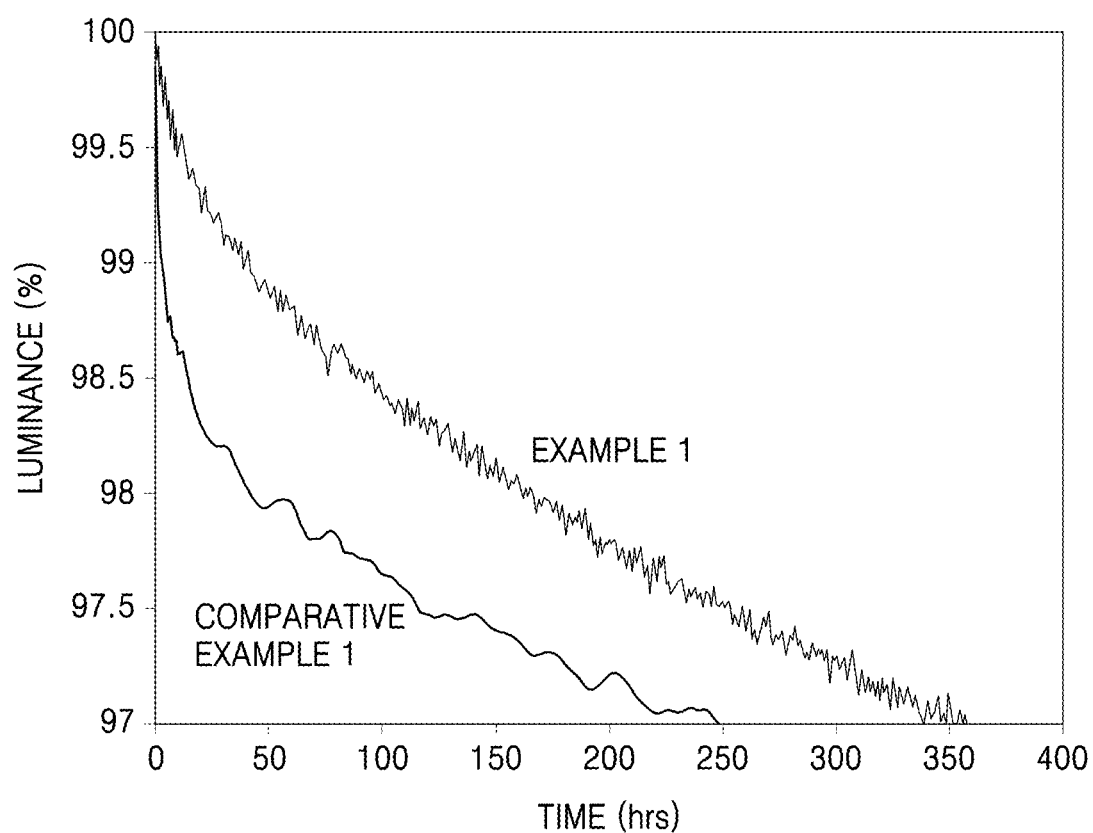
FIG. 2 is a graph showing time-luminance relationships of organic light-emitting devices manufactured according to Example 1 and Comparative Example 1.

Evaluation Example 3: Evaluation of Characteristics of Organic Light-Emitting Devices The driving voltage, luminescent efficiency, external quantum efficiency (EQE), roll-off ratio, maximum emission wavelength, and lifespan ($T_{97}$) of the organic light-emitting devices manufactured according to Example 1 and Comparative Example 1 were evaluated, and results thereof are shown in Table 4. Time-luminance graphs of the organic light-emitting devices of Example 1 and Comparative Example 1 are shown in FIG. 2. This evaluation was performed by using a current-voltage meter (Keithley 2400) and a luminance meter (Minolta Cs-1000 Å). The lifespan ($T_{97}$) (at 3,500 nit) indicates an amount of time that lapsed when luminance was 97% of initial luminance (100%) (at 3,500 nit). The roll-off ratio was calculated by using Equation 20.

Roll off={1−(efficiency (at 9,000 nit)/maximum luminescent efficiency)}×100%    Equation 20

TABLE 4

| | Dopant | Driving Voltage (V) (at 1500 nit) | Maximum luminescent efficiency (cd/A) | Luminescent Efficiency (cd/A) (at 1500 nit) | Maximum External Quantum Efficiency (%) | External quantum efficiency (%) (at 1500 nit) | Roll-off ratio (%) | Maximum emission wavelength (nm) | Lifespan ($T_{97}$) (hr) |
|---|---|---|---|---|---|---|---|---|---|
| Example 1 | Compound 19 | 3.59 | 61.4 | 58.7 | 24.4 | 23.07 | 4 | 587 | 360 |
| Comparative Example 1 | Compound F | 4.71 | 24.0 | 20.1 | 19.6 | 16.10 | 16 | 615 | 250 |

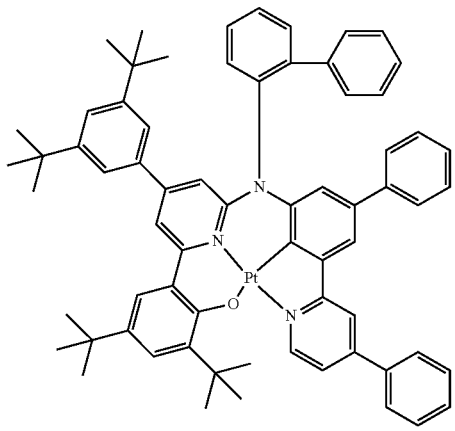

19

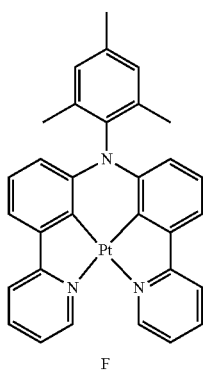

F

Referring to Table 4, it is confirmed that the organic light-emitting device of Example 1 has low driving voltage, high luminescent efficiency, high external quantum efficiency, low roll-off ratio, and long lifespan characteristics, as compared with the organic light-emitting device of Comparative Example 1.

Since the organometallic compounds have a short decay time, organic light-emitting devices including such organometallic compounds may have improved luminescent efficiency, external quantum efficiency, roll-off ratio, and lifespan characteristics. Also, due to excellent phosphorescent luminescent characteristics, such organometallic compounds may provide a diagnostic composition having high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organometallic compound represented by Formula 1:

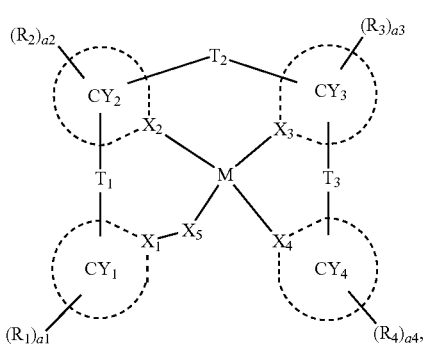

Formula 1 wherein, in Formula 1,

M is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$, $X_2$, and $X_4$ are each independently C or N, $X_3$ is C, $X_5$ is O, two bonds selected from a bond between $X_2$ and M, a bond between $X_3$ and M, and a bond between $X_4$ and M are each a coordinate bond, and the other thereof is a covalent bond, a bond between $X_5$ and M is a covalent bond, a moiety represented by

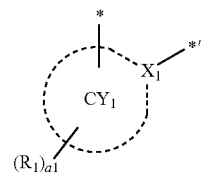

is selected from a group represented by Formulae CY1(1) to CY1(16), a moiety represented by

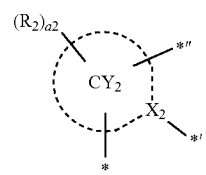

is selected from a group represented by Formulae CY2(2) to CY2(8), a moiety represented by

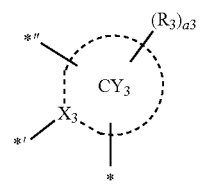

is selected from a group represented by Formulae CY3(2) to CY3(8), a moiety represented by

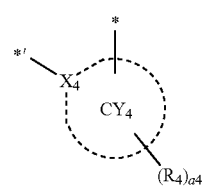

is selected from a group represented by Formulae CY4(235) to CY4(8),

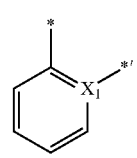

CY1(1)

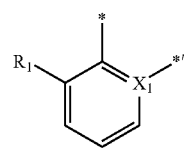

CY1(2)

-continued
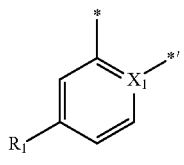
CY1(3)
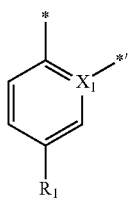
CY1(4)
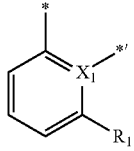
CY1(5)
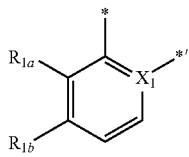
CY1(6)
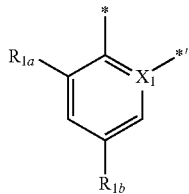
CY1(7)
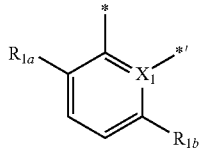
CY1(8)
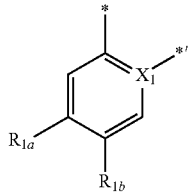
CY1(9)
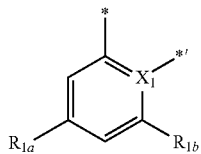
CY1(10)
-continued
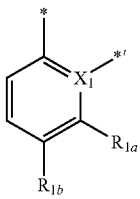
CY1(11)
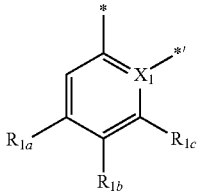
CY1(12)
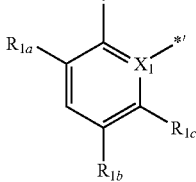
CY1(13)
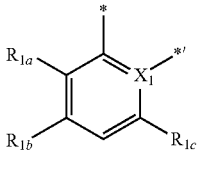
CY1(14)
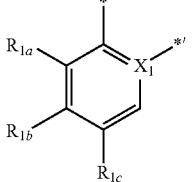
CY1(15)
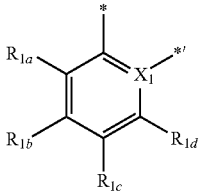
CY1(16)
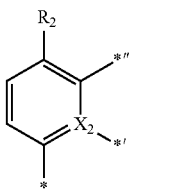
CY2(2)
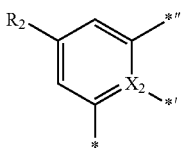
CY2(3)

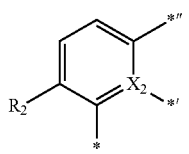 CY2(4)
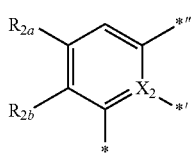 CY2(5)
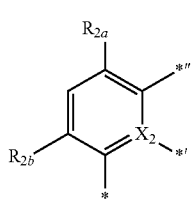 CY2(6)
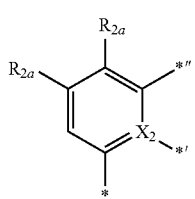 CY2(7)
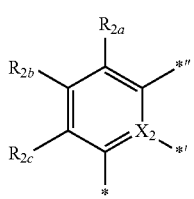 CY2(8)
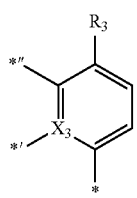 CY3(2)
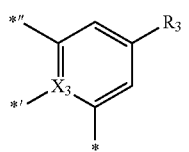 CY3(3)
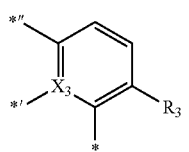 CY3(4)
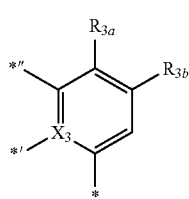 CY3(5)
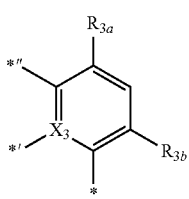 CY3(6)
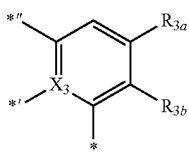 CY3(7)
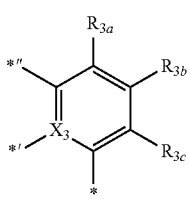 CY3(8)
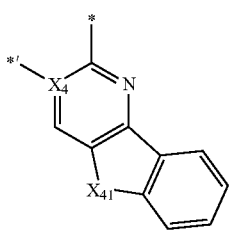 CY4(35)
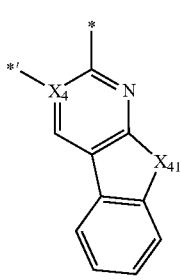 CY4(36)
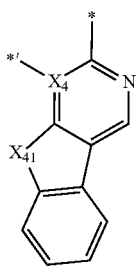 CY4(37)

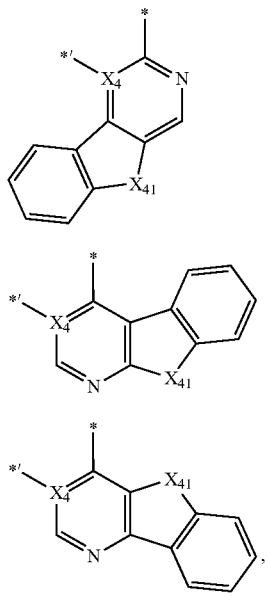

CY4(38)

CY4(39)

CY4(40)

$T_1$ is a single bond, $T_2$ is selected from a double bond, *—N[(L$_{63}$)$_{a63}$-(R$_{63}$)]—*', *—B(R$_{63}$)—*', *—P(R$_{63}$)—*', *—Si(R$_{63}$)(R$_{64}$)—*', *—Ge(R$_{63}$)(R$_{64}$)—*', *—S—*', *—Se—*', *—O—*', *—C(=O)—*', *—S(=O)—*', *—S(=O)$_2$—*', *—C(R$_{63}$)=*', *=C(R$_{63}$)—*', *—C(R$_{63}$)=C(R$_{64}$)—*', *—C(=S)—, and *—C≡C—*', and * and *' each indicate a binding site to a neighboring atom, $T_3$ is a single bond, $L_{63}$ is selected from a single bond, a substituted or unsubstituted $C_5$-$C_{30}$ carbocyclic group, and a substituted or unsubstituted $C_1$-$C_{30}$ heterocyclic group, a63 is an integer from 1 to 3, wherein, when a63 is two or more, two or more groups $L_{63}$ are identical to or different from each other, $X_{41}$ is C($R_{41}$)($R_{42}$), N($R_{41}$), O, S, or Si($R_{41}$)($R_{42}$), $R_{1a}$ to $R_{1d}$ are the same as described in connection with $R_1$, $R_{2a}$ to $R_{2c}$ are the same as described in connection with $R_2$, $R_{3a}$ to $R_{3c}$ are the same as described in connection with $R_3$, $R_{41}$, and $R_{42}$ are the same as described in connection with $R_4$, $R_1$ to $R_4$, $R_{41}$, $R_{42}$, $R_{63}$ and $R_{64}$, are each independently selected from hydrogen, deuterium,-F,-Cl,-Br,-I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof,-SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium,-F,-Cl,-Br,-I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium,-F,-Cl,-Br,-I,-CD$_3$,-CD$_2$H,-CDH$_2$, -CF$_3$,-CF$_2$H,-CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and
—N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ are independently selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CH_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one deuterium, provided that $R_1$ to $R_4$, $R_{1a}$ to $R_{1d}$, $R_{2a}$ to $R_{2c}$, and $R_{3a}$ to $R_{3c}$ are not hydrogen, in Formulae CY1(1) to CY1(16), * indicates a binding site to M in Formula 1, and * indicates a binding site to $T_1$ in Formula 1, in Formulae CY2(2) to CY2(8), * indicates a binding site to $T_1$ in Formula 1, *' indicates a binding site to M in Formula 1, and *'' indicates a binding site to T2 in Formula 1, in Formulae CY3(2) to CY3(8), *'' indicates a binding site to $T_2$ in Formula 1, *' indicates a binding site to M in Formula 1, and * indicates a binding site to $T_3$ in Formula 1, in Formulae CY4(5) to CY4(40), * indicates a binding site to $T_3$ in Formula 1, and *' indicates a binding site to M in Formula 1, and a1 to a4 are each independently an integer from 0 to 20, two of a plurality of neighboring groups $R_1$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_2$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_3$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_4$ are optionally linked to form a substituted or unsubstituted $C_5$-$C_{30}$ carbocyclic group or a substituted or unsubstituted $C_1$-$C_{30}$ heterocyclic group, and at least two neighboring groups selected from $R_1$ to $R_4$ are not optionally linked to form a substituted or unsubstituted $C_5$-$C_{30}$ carbocyclic group or a substituted or unsubstituted $C_1$-$C_{30}$ heterocyclic group.

2. The organometallic compound of claim 1, wherein M is Pt, Pd, or Au.

3. The organometallic compound of claim 1, wherein
i) $X_2$ and $X_3$ are each N, and $X_4$ is C; or
ii) $X_2$ and $X_4$ are each N, and $X_3$ is C.

4. The organometallic compound of claim 1, wherein $T_2$ is *—N[($L_{63}$)$_{a63}$-($R_{63}$)]—*', *—B($R_{63}$)—*', *—P($R_{63}$)—*', *—Si($R_{63}$)($R_{64}$)—*', *—Ge($R_{63}$)($R_{64}$)—*', *—S—*', *—Se—*', *—O—*'.

5. The organometallic compound of claim 1, wherein $R_1$ to $R_4$, $R_{1a}$ to $R_{1d}$, $R_{2a}$ to $R_{2c}$, $R_{3a}$ to $R_{3c}$, $R_{41}$, $R_{42}$, $R_{63}$ and $R_{64}$ are each independently selected from hydrogen, deuterium,-F, a cyano group, a nitro group,-$SF_5$,-$CH_3$,-$CD_3$,-$CD_2H$,-$CDH_2$,-$CF_3$,-$CF_2H$,-$CFH_2$, groups represented by Formulae 9-1 to 9-19, and groups represented by Formulae 10-1 to 10-194, provided that $R_1$ to $R_4$, $R_{1a}$ to $R_{1d}$, $R_{2a}$ to $R_{2c}$, and $R_{3a}$ to $R_{3c}$ are not hydrogen:

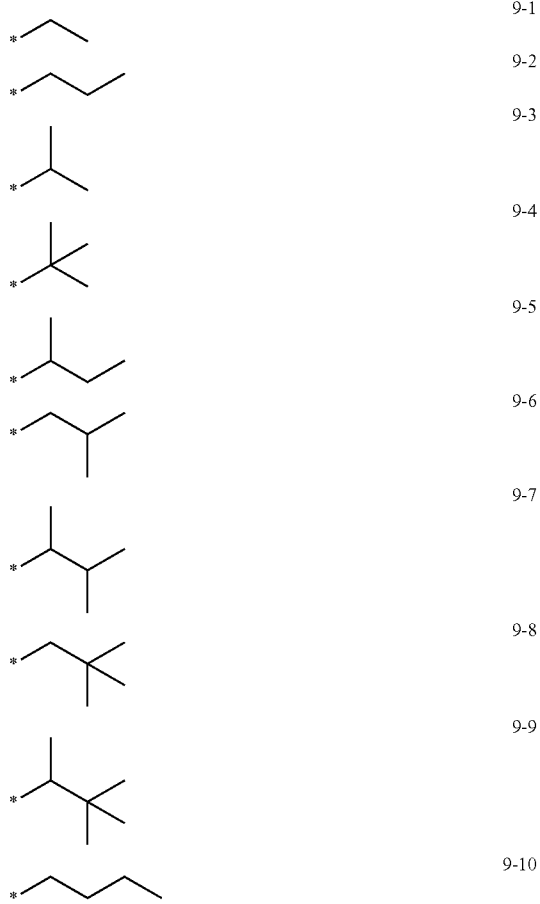

139
-continued
| | |
|---|---|
| 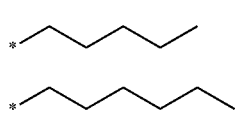 | 9-11 |
| 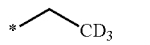 | 9-12 |
| 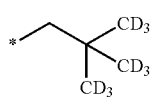 | 9-13 |
| 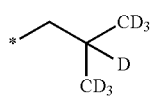 | 9-14 |
| 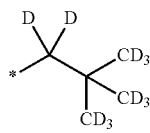 | 9-15 |
| 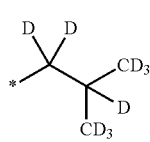 | 9-16 |
| 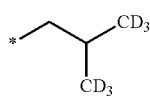 | 9-17 |
| 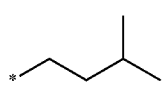 | 9-18 |
| 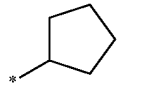 | 9-19 |
| 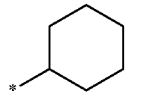 | 10-1 |
| 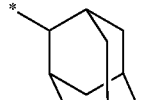 | 10-2 |
|  | 10-3 |
| 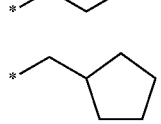 | 10-4 |
| 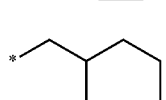 | 10-5 |
| | 10-6 |
140
-continued
| | |
|---|---|
| 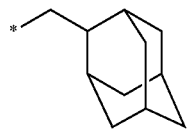 | 10-7 |
| 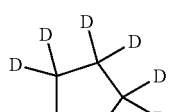 | 10-8 |
| 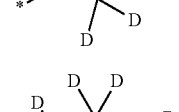 | 10-9 |
| 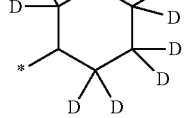 | 10-10 |
| 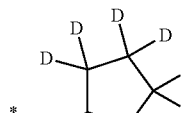 | 10-11 |
| 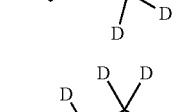 | 10-12 |
| 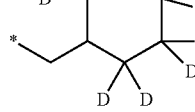 | 10-13 |
| 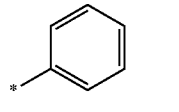 | 10-14 |
| 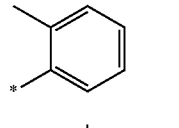 | 10-15 |
| 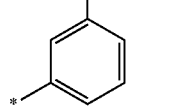 | 10-16 |
| 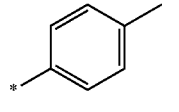 | 10-17 |
| 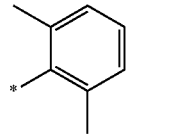 | |

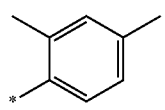
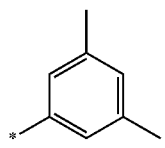
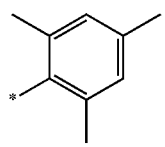
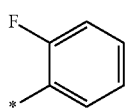
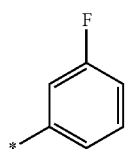
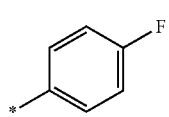
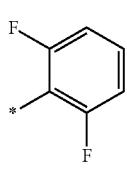
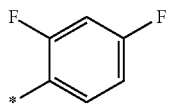
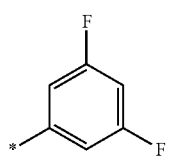
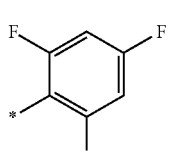
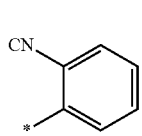
10-18
10-19
10-20
10-21
10-22
10-23
10-24
10-25
10-26
10-27
10-28
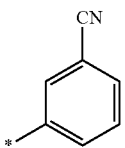
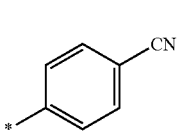
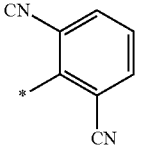
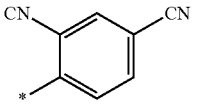
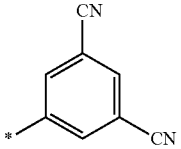
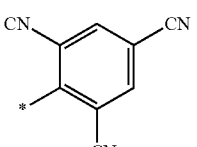
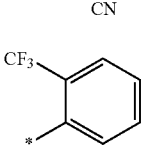
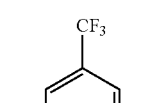
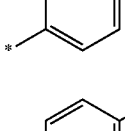
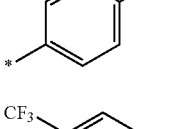
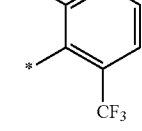
10-29
10-30
10-31
10-32
10-33
10-34
10-35
10-36
10-37
10-38
10-39

| | | | |
|---|---|---|---|
| 10-40 | 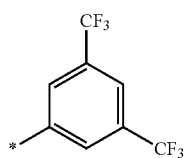 | 10-50 | 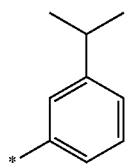 |
| 10-41 | 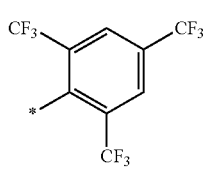 | 10-51 | 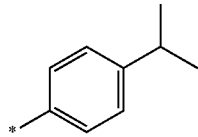 |
| 10-42 | 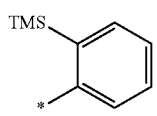 | 10-52 | 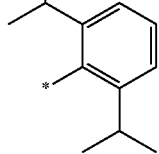 |
| 10-43 | 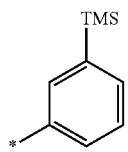 | 10-53 | 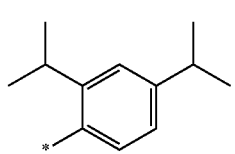 |
| 10-44 | 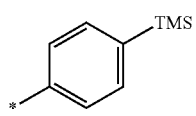 | 10-54 | 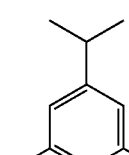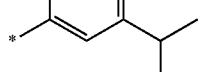 |
| 10-45 | 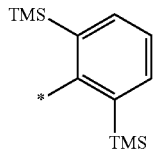 | 10-55 | 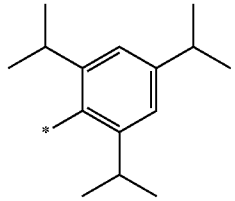 |
| 10-46 | 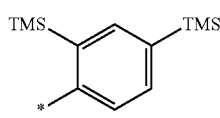 | 10-56 | 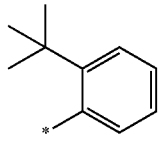 |
| 10-47 | 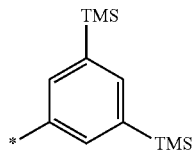 | 10-57 | 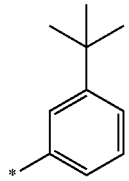 |
| 10-48 | 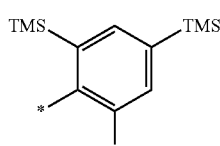 | 10-58 | 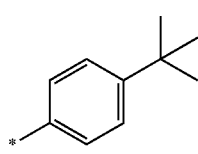 |
| 10-49 | 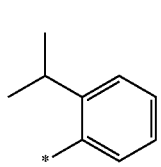 | | |

-continued
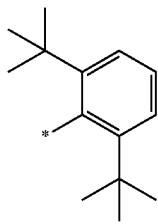
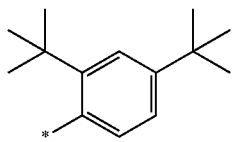  10-60
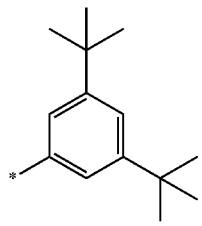  10-61
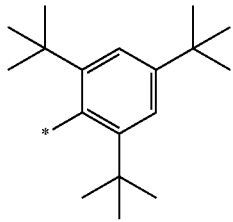  10-62
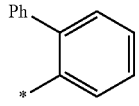  10-63
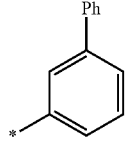  10-64
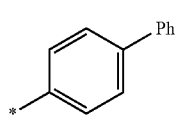  10-65
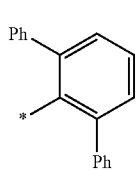  10-66
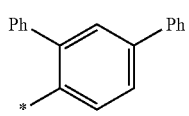  10-67
-continued
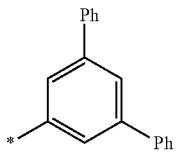  10-68
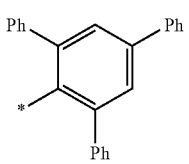  10-69
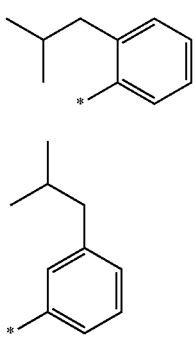  10-70
10-71
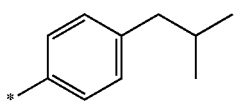  10-72
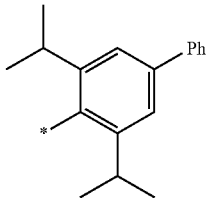  10-73
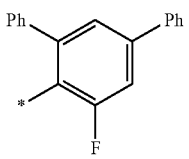  10-74
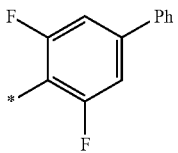  10-75
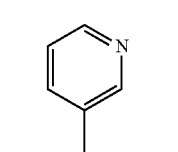  10-76
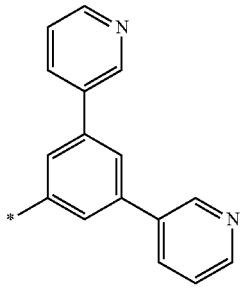

-continued

| | |
|---|---|
| 10-77 | 10-83 |
| 10-78 | 10-84 |
| 10-79 | 10-85 |
| | 10-86 |
| | 10-87 |
| 10-80 | 10-88 |
| | 10-89 |
| | 10-90 |
| | 10-91 |
| 10-81 | 10-92 |
| 10-82 | 10-93 |
| | 10-94 |
| | 10-95 |

| | |
|---|---|
| 10-96 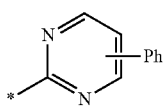 | 10-108 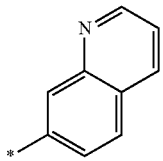 |
| 10-97 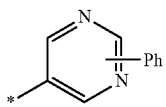 | 10-109 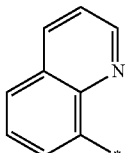 |
| 10-98 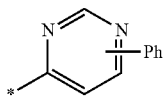 | 10-110 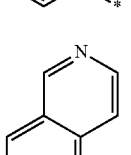 |
| 10-99 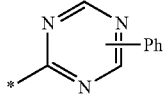 | 10-111 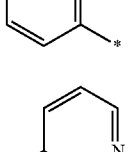 |
| 10-100 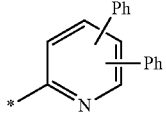 | 10-112 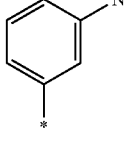 |
| 10-101 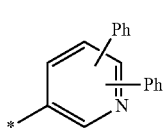 | 10-113 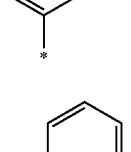 |
| 10-102 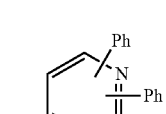 | |
| 10-103 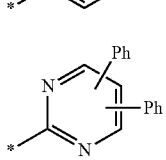 | 10-114 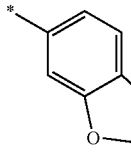 |
| 10-104 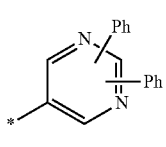 | |
| 10-105 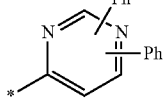 | 10-115 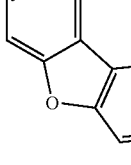 |
| 10-106 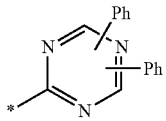 | |
| 10-107 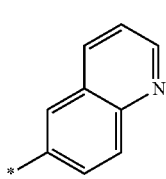 | |

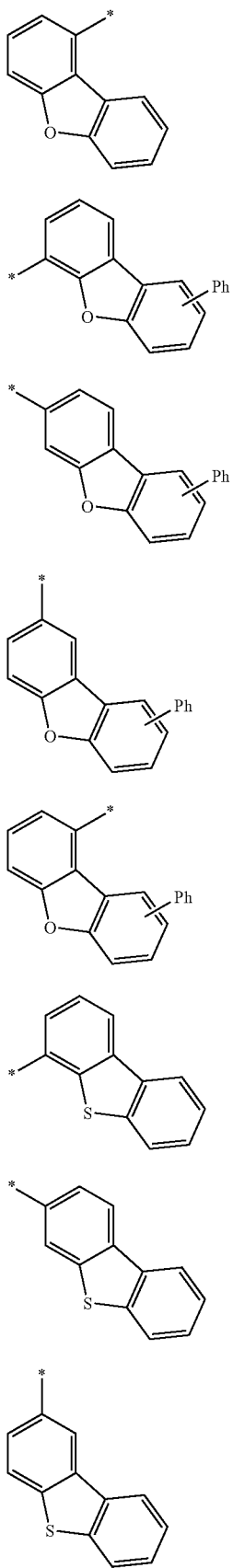
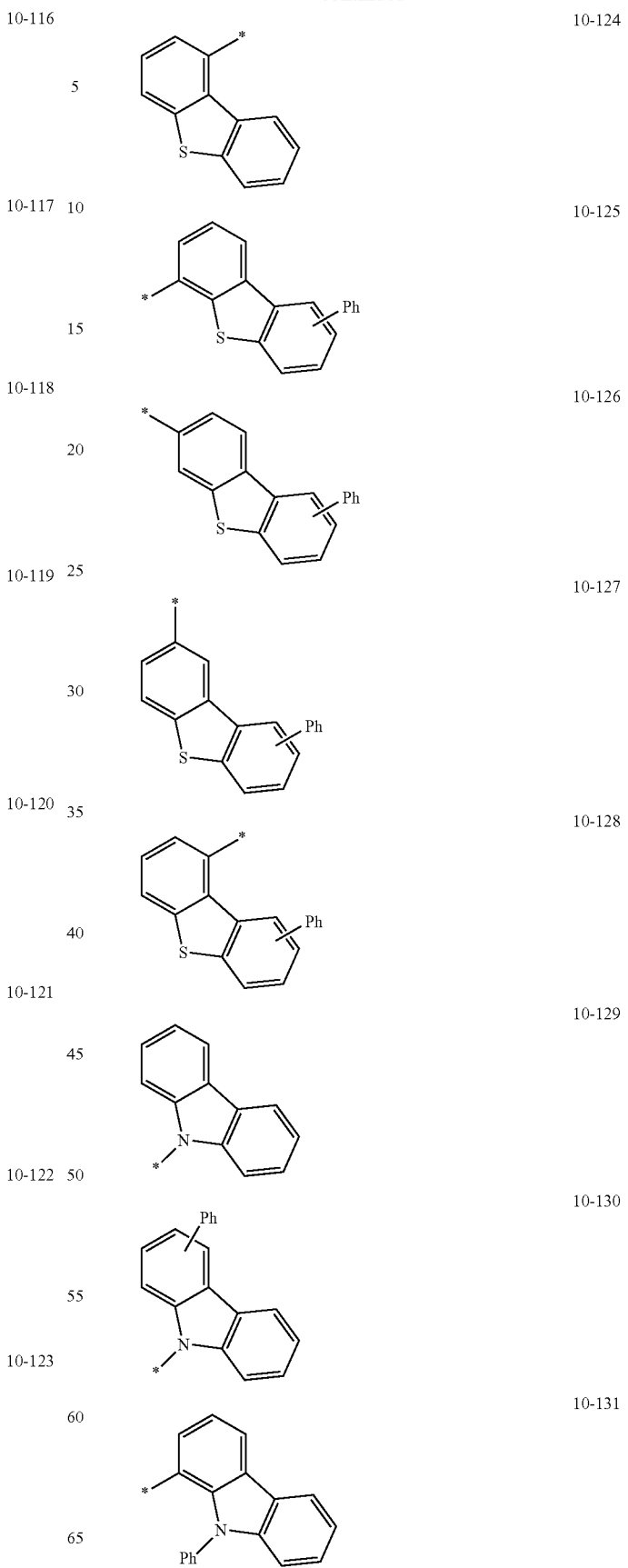

10-132 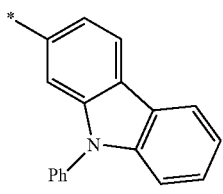
10-133 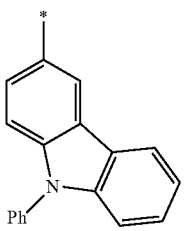
10-134 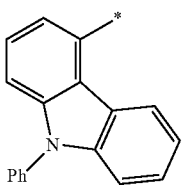
10-135 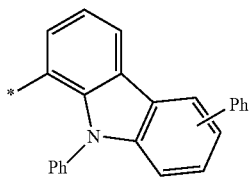
10-136 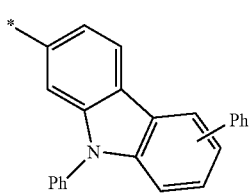
10-137 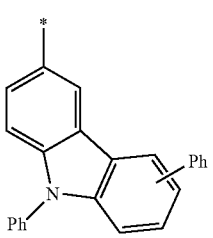
10-138 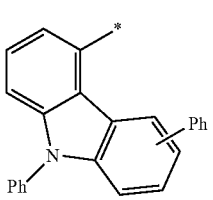
10-139 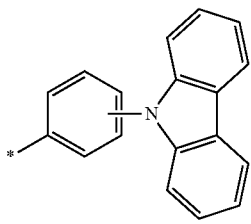
10-140 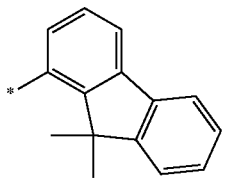
10-141 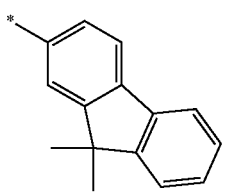
10-142 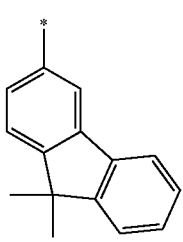
10-143 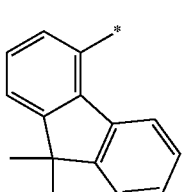
10-144 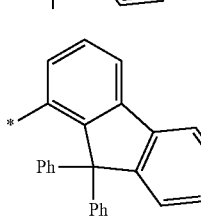
10-145 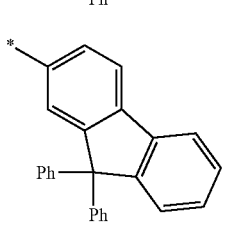

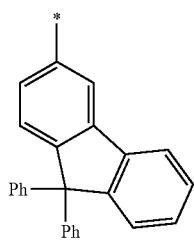
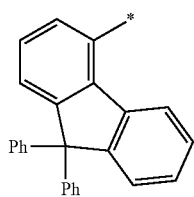
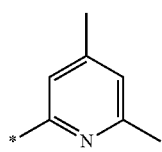
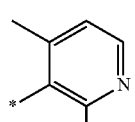
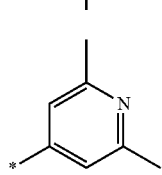
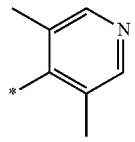
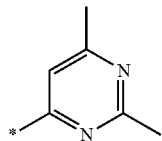
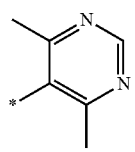
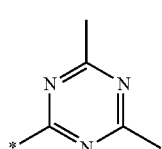
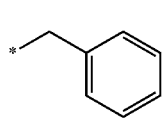
10-146
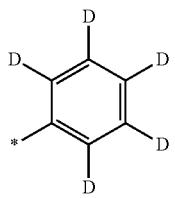
10-147
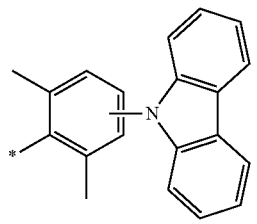
10-148
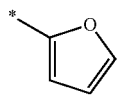
10-149
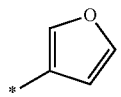
10-150
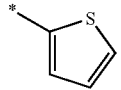
10-151
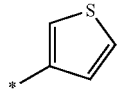
10-152
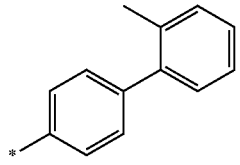
10-153
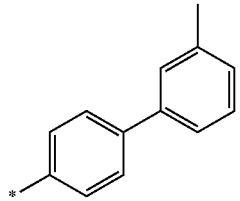
10-154
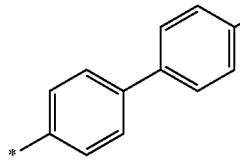
10-155
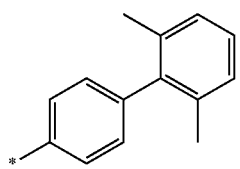
10-156
10-157
10-158
10-159
10-160
10-161
10-162
10-163
10-164
10-165

10-166 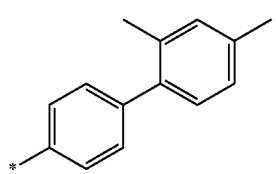
10-167 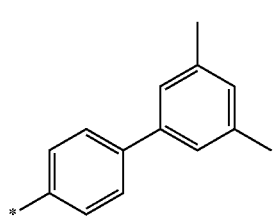
10-168 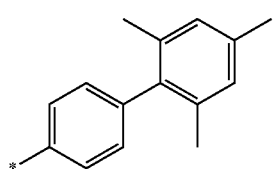
10-169 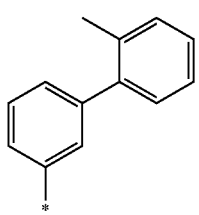
10-170 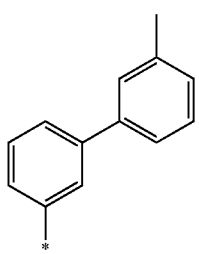
10-171 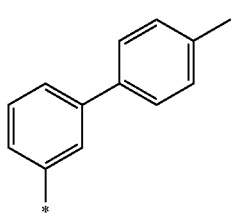
10-172 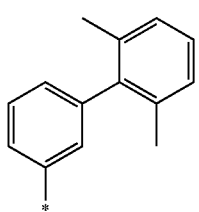
10-173 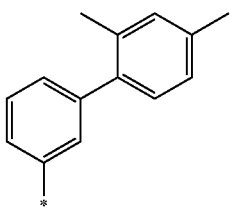
10-174 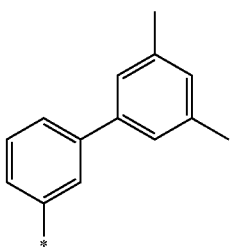
10-175 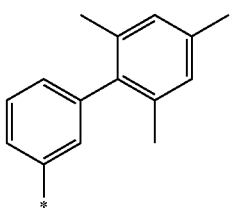
10-176 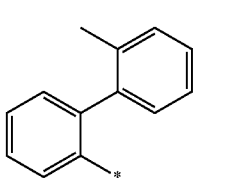
10-177 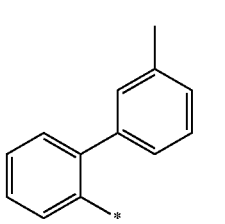
10-178 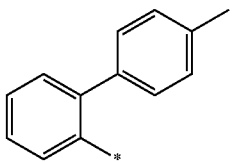
10-179 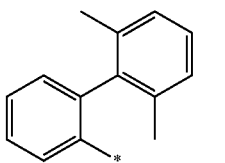
10-180

-continued
10-181 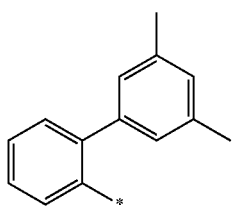
10-182 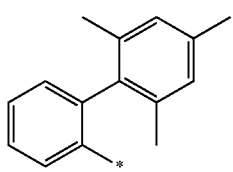
10-183 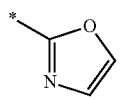
10-184 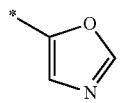
10-185 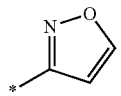
10-186 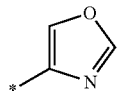
10-187 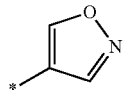
10-188 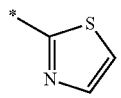
10-189 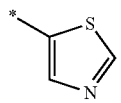
10-190 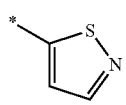
10-191 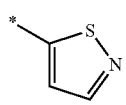
-continued
10-192 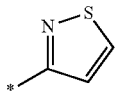
10-193 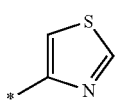
10-194 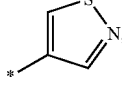
wherein, in Formulae 9-1 to 9-19 and 10-1 to 10-194, "*" indicates a binding site to a neighboring atom, "Ph" indicates a phenyl group, and "TMS" indicates a trimethylsilyl group.
6. An organometallic compound being one of Compounds 12, 24-25, and 29:
12
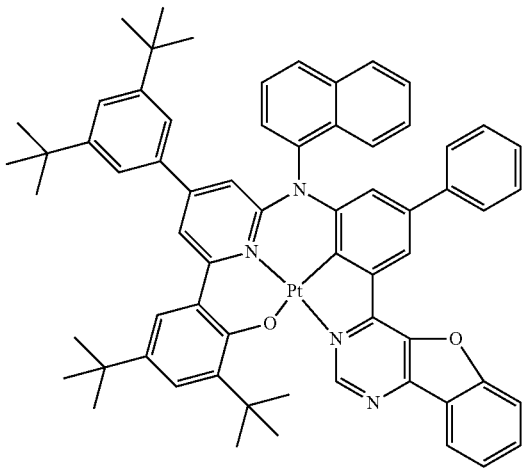
24
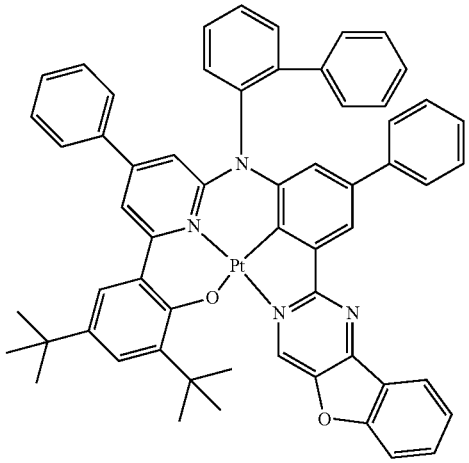

-continued

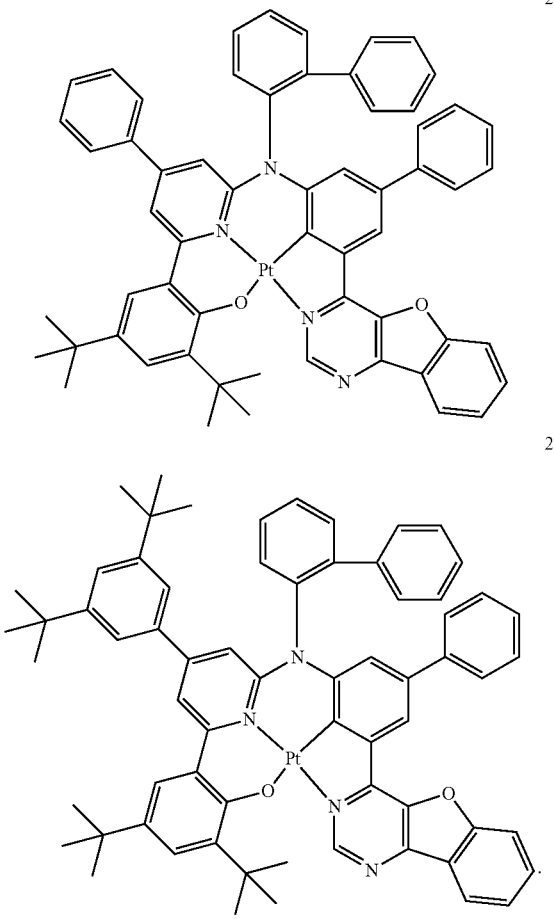

7. An organic light-emitting device comprising:
a first electrode;
a second electrode; and
an organic layer between the first electrode and the second electrode and comprising an emission layer and at least one of the organometallic compound of claim 1.

8. The organic light-emitting device of claim 7, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, or any combination thereof, and
the electron transport region comprises a hole blocking layer, an electron transport layer, an electron injection layer, or any combination thereof.

9. The organic light-emitting device of claim 7, wherein the emission layer comprises the at least one organometallic compound.

10. The organic light-emitting device of claim 9, wherein the emission layer further comprises a host, and an amount of the host is larger than an amount of the organometallic compound.

11. A diagnostic composition comprising at least one of the organometallic compound of claim 1.

* * * * *